(12) United States Patent
Hidaka

(10) Patent No.: US 6,781,874 B2
(45) Date of Patent: Aug. 24, 2004

(54) THIN FILM MAGNETIC MEMORY DEVICE INCLUDING MEMORY CELLS HAVING A MAGNETIC TUNNEL JUNCTION

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/175,846

(22) Filed: Jun. 21, 2002

(65) Prior Publication Data

US 2003/0026125 A1 Feb. 6, 2003

(30) Foreign Application Priority Data

Aug. 2, 2001 (JP) ........................................ 2001-234602
Sep. 27, 2001 (JP) ........................................ 2001-296375

(51) Int. Cl.[7] ............................................... G11C 11/14
(52) U.S. Cl. ........................ 365/171; 365/158; 365/171
(58) Field of Search ................................ 365/158, 171, 365/173, 210, 230.06

(56) References Cited

U.S. PATENT DOCUMENTS

| 6,272,041 | B1 | * | 8/2001 | Naji .............................. 365/171 |
| 6,335,890 | B1 | * | 1/2002 | Reohr et al. ............... 365/225.5 |
| 6,445,612 | B1 | * | 9/2002 | Naji .............................. 365/158 |
| 6,532,163 | B2 | * | 3/2003 | Okazawa ..................... 365/158 |

* cited by examiner

*Primary Examiner*—Son Mai
(74) *Attorney, Agent, or Firm*—McDermott Will & Emery LLP

(57) ABSTRACT

In a tunneling magneto-resistance element, first and second free magnetic layers have a magnetization direction according to storage data. The first and second magnetic layers are arranged with an intermediate layer interposed therebetween. The intermediate layer is formed from a non-magnetic conductor. In data write operation, a data write current having a direction according to a write data level is supplied to the intermediate layer. A magnetic field generated by the current flowing through the intermediate layer magnetizes the first and second free magnetic layers with a looped manner.

8 Claims, 46 Drawing Sheets

THIN FILM MAGNETIC MEMORY DEVICE INCLUDING MEMORY CELLS HAVING A MAGNETIC TUNNEL JUNCTION

BACKGROUND OF THE INVENTION

1. Field of the Invention

The present invention generally relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 48 is a conceptual diagram illustrating the structure of a memory cell having a magnetic tunnel junction (hereinafter, sometimes simply referred to as "MTJ memory cell") and the data read operation.

Referring to FIG. 48, the MTJ memory cell includes a tunneling magneto-resistance element TMR having an electric resistance varying according to the storage data level, and an access transistor ATR for forming a path of a sense current flowing through tunneling magneto-resistance element TMR in the data read operation. For example, access transistor ATR is a field effect transistor, and is coupled between tunneling magneto-resistance element TMR and a ground voltage VSS.

Tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction corresponding to an external magnetic field (hereinafter, sometimes simply referred to as "free magnetic layer"). A tunneling barrier TB of an insulator film is interposed between fixed magnetic layer FL and free magnetic layer VL. Free magnetic layer VL is magnetized either in the same (parallel) direction as, or in the opposite (antiparallel) direction to, that of fixed magnetic layer FL according to the storage data level.

For the MTJ memory cell are provided a write word line WWL for data write operation, a read word line RWL for data read operation, and a bit line BL serving as a data line for transmitting an electric signal corresponding to the storage data level in data read and write operations.

In data read operation, access transistor ATR is turned ON in response to activation of read word line RWL. This allows a sense current Is to flow through a current path formed by bit line BL, tunneling magneto-resistance element TMR, access transistor ATR and ground voltage VSS.

The electric resistance value of tunneling magneto-resistance element TMR varies according to the relation between the respective magnetization directions of fixed magnetic layer FL and free magnetic layer VL. More specifically, when fixed magnetic layer FL and free magnetic layer VL have the same (parallel) magnetization direction, tunneling magneto-resistance element TMR has a smaller electric resistance value than when they have opposite (antiparallel) magnetization directions. Hereinafter, the electric resistance values of the tunneling magneto-resistance element corresponding to the storage data levels "1", "0" are respectively denoted with R1 and R0, where R1>R0.

The electric resistance value of the tunneling magneto-resistance element TMR varies according to the magnetization direction. Accordingly, two magnetization directions of free magnetic layer VL in tunneling magneto-resistance element TMR can be stored as two storage data levels ("1", "0"), respectively. In other words, free magnetic layer VL corresponds to a storage node of the MTJ memory cell.

A voltage change that occurs at tunneling magneto-resistance element TMR in response to sense current Is varies depending on the magnetization direction of free magnetic layer VL, that is, the storage data level. Therefore, sense current Is is supplied to tunneling magneto-resistance element TMR after precharging bit line BL to a prescribed voltage, and the storage data in the MTJ memory cell can be read by sensing a voltage change on bit line BL.

FIG. 49 is a conceptual diagram illustrating data write operation to the MTJ memory cell.

Referring to FIG. 49, in data write operation, read word line RWL is inactivated and access transistor ATR is turned OFF. In this state, a data write current is supplied to write word line WWL and bit line BL in order to magnetize free magnetic layer VL in the direction corresponding to the write data. The magnetization direction of free magnetic layer VL is determined by combination of the respective directions of the data write current flowing through write word line WWL and bit line BL.

FIG. 50 is a conceptual diagram illustrating the relation between the direction of the data write current and the magnetization direction in data write operation.

Referring to FIG. 50, the abscissa Hx indicates the direction of a data write magnetic field H(BL) generated by the data write current flowing through bit line BL. The ordinate Hy indicates the direction of a data write magnetic field H(WWL) generated by the data write current flowing through write word line WWL.

The magnetization direction of free magnetic layer VL can be rewritten only when the sum of the data write magnetic fields H(BL) and H(WWL) reaches the region outside the asteroid characteristic line shown in the figure. In other words, the magnetization direction of free magnetic layer VL will not change if an applied data write magnetic field corresponds to the region inside the asteroid characteristic line.

In order to rewrite the data stored in tunneling magneto-resistance element TMR by data write operation, a current of at least a prescribed level must be applied to both write word line WWL and bit line BL. Once the magnetization direction, that is, the storage data, is written to tunneling magneto-resistance element TMR, it is held in a non-volatile manner until another data write operation is conducted.

In data read operation as well, sense current Is flows through bit line BL. However, sense current Is is generally about one to two orders smaller than the data write current. Therefore, it is less likely that the storage data in the MTJ memory cell is erroneously rewritten by sense current Is in the data read operation.

With reduction in memory cell size, the MRAM device using such a tunneling magneto-resistance element TMR has the following problems:

The MTJ memory cell stores the data according to the magnetization direction of free magnetic layer VL. Provided that the magnetic layer has a thickness T and a length L in its magnetization direction, the magnetic field strength that must be applied to rewrite the magnetization direction of the free magnetic layer (hereinafter, sometimes referred to as "switching magnetic field strength") is proportional to T/L. Accordingly, with reduction in memory cell size, the switching magnetic field strength is increased according to the scaling of the size in the in-plane direction.

Moreover, with reduction in memory cell size, magnetic field interference between the fixed magnetic layer and the free magnetic layer is increased inside and outside the MTJ memory cell. As a result, the threshold value of a data write magnetic field required for data write operation (which corresponds to the asteroid characteristic line in FIG. 50) varies depending on the write data pattern or becomes asymmetric depending on the direction of the data write magnetic field.

Such a phenomenon hinders scaling of the MTJ memory cell. Therefore, current consumption is increased with reduction in memory cell size.

In order to solve the above problems, U.S. Pat. No. 6,166,948 discloses the technology of forming a free magnetic layer of an MTJ memory cell from two ferromagnetic material layers having different magnetic moments. Hereinafter, the structure of the free magnetic layer formed from two magnetic layers is sometimes referred to as "two-layer storage node structure". The structure of the free magnetic layer formed from a single magnetic layer as shown in FIGS. 48, 49 is sometimes referred to as "single-layer storage node structure".

FIG. 51 is a cross-sectional view of a conventional tunneling magneto-resistance element having a two-layer storage node structure.

Referring to FIG. 51, the conventional tunneling magneto-resistance element includes an antiferromagnetic material layer AFL, a fixed magnetic layer FL, free magnetic layers VL1, VL2, a tunneling barrier TB formed between fixed magnetic layer FL and free magnetic layer VL1, and an intermediate layer IML formed between free magnetic layers VL1, VL2. Intermediate layer IML is formed from a non-magnetic material. The MTJ memory cell having the tunneling magneto-resistance element of FIG. 51 stores the data according to the relation between the respective magnetization directions of fixed magnetic layer FL and free magnetic layer VL1.

Free magnetic layers VL1, VL2 are arranged with intermediate layer IML interposed therebetween. The magnetic moment of free magnetic layer VL1 is greater than that of free magnetic layer VL2. Accordingly, the magnetization threshold value for changing the magnetization direction of free magnetic layer VL1 is larger than that of free magnetic layer VL2.

As described above, free magnetic layers VL1, VL2 have different magnetic moments. Therefore, when the magnetization direction of free magnetic layer VL1 changes, the magnetization direction of free magnetic layer VL2 also changes so that free magnetic layer VL2 forms a magnetization loop together with free magnetic layer VL1.

FIG. 52 is a hysteresis diagram illustrating magnetization in the tunneling magneto-resistance element in FIG. 51.

FIG. 52 shows the magnetization behavior in the easy-axis direction of free magnetic layers VL1, VL2 in response to a data write magnetic field H.

Hereinafter, how the magnetization direction changes as the data write magnetic field is increased in the negative direction will be described with reference to FIG. 52.

In the region of $H>H_{01}$ (state 1A), both free magnetic layers VL1, VL2 are magnetized in the positive direction (to the right). For $H<H_{01}$ (state 2A), only the magnetization direction of free magnetic layer VL2 having a smaller magnetic moment is inverted.

When the magnetic field is further changed in the negative direction into the region exceeding a threshold value $-H_{02}$ (state 3A), the magnetization direction of free magnetic layer VL1 having a larger magnetic moment changes from the positive direction to the negative direction (from right to left). Accordingly, the magnetization direction of free magnetic layer VL2 is also inverted from the state 2A.

When the data write magnetic field H is further increased in the negative direction into the region of $H<-H_{03}$ (state 4A), the magnetization directions of both free magnetic layers VL1, VL2 change to the negative direction (to the left).

Hereinafter, how the magnetization direction changes as the data write magnetic field H is increased in the positive direction will be described.

In the region of $H<-H_{01}$ (state 4B), both free magnetic layers VL1, VL2 are magnetized in the negative direction (to the left). For $H>-H_{01}$ (state 3B), only the magnetization direction of free magnetic layer VL2 having a smaller magnetic moment is inverted.

When the magnetic field is further changed in the positive direction into the region exceeding a threshold value $H_{02}$ (state 2B), the magnetization direction of free magnetic layer VL1 having a larger magnetic moment changes from the negative direction to the positive direction (from left to right). Accordingly, the magnetization direction of free magnetic layer VL2 is also inverted from the state 3B.

When the data write magnetic field H is further increased in the positive direction into the region of $H>H_{03}$ (state 1B), the magnetization directions of both free magnetic layers VL1, VL2 change to the positive direction (to the right).

The free magnetic layers are formed from antiferromagnetic material layers having different magnetization threshold values (magnetic moments), and a non-magnetic intermediate layer is interposed therebetween. The state where the magnetic fields in the upper and lower free magnetic layers are inverted with respect to each other is used as a data storage state. This enables reduction in switching magnetic field strength of the free magnetic layers. Moreover, in the data storage state, the two free magnetic layers are magnetized in a looped manner. This prevents a magnetic flux from being extended outside the MTJ memory cell, thereby suppressing adverse effects of the magnetic field interference.

In the MTJ memory cell having a two-layer storage node structure of FIG. 51, however, free magnetic layers VL1, VL2 must have different magnetization threshold values (magnetic moments). Accordingly, two magnetic layers of different materials must be deposited with different thicknesses, thereby complicating the manufacturing apparatus and manufacturing process.

In particular, as shown in FIG. 52, the difference between the magnetic moments of free magnetic layers VL1, VL2 significantly affects the data storage state. Therefore, manufacturing variation of the magnetic moments may possibly cause significant variation in data storage characteristics of the MTJ memory cells.

As shown in FIGS. 48, 49 and 52, in the MTJ memory cell, free magnetic layers VL, VL1, VL2 that are magnetized in the direction according to the storage data are formed near fixed magnetic layer FL and antiferromagnetic material layer AFL having a fixed magnetization direction. Therefore, magnetization characteristics in the free magnetic layers may become non-uniform according to the storage data level.

FIG. 53 is a conceptual diagram illustrating non-uniformity of magnetization characteristics in the MTJ memory cell having a single-layer storage node structure.

Referring to FIG. 53, fixed magnetic layer FL and antiferromagnetic material layer AFL have the same fixed magnetization direction. Antiferromagnetic material layer AFL is provided in order to more strongly fix the magnetization direction of fixed magnetic layer FL.

Free magnetic layer VL serving as a storage node is magnetized either in the positive (+) or negative (−) direction according to the storage data level. In FIG. 53, the magnetization direction parallel to that of fixed magnetic layer FL is defined as positive direction, and the magnetization direction antiparallel to that of fixed magnetic layer FL is defined as negative direction.

Since the plurality of magnetic layers are formed close to each other, a uniform magnetic field ΔHp is applied to free magnetic layer VL in the easy-axis direction due to magnetostatic coupling of the magnetic fields from antiferromagnetic material layer AFL and fixed magnetic layer FL. Uniform magnetic field ΔHp acts in the direction antiparallel to the magnetization direction of fixed magnetic layer FL, that is, in the negative direction. Such a uniform magnetic field ΔHp makes the magnetization characteristics in free magnetic layer VL asymmetric depending on the direction of the magnetic field.

FIG. 54 is a hysteresis diagram illustrating magnetization characteristics in free magnetic layer VL of FIG. 53. FIG. 54 shows magnetization behavior of free magnetic layer VL in response to a data write magnetic field Hex of the easy-axis direction.

Referring to FIG. 54, in order to magnetize negatively magnetized free magnetic layer VL in the positive direction, a magnetic field Hex of the positive direction beyond +Hsp must be applied thereto. On the other hand, in order to magnetize positively magnetized free magnetic layer VL in the negative direction, a magnetic field Hex of the negative direction beyond −Hsn must be applied thereto.

Due to the uniform magnetic field ΔHp resulting from magnetostatic coupling with fixed magnetic layer FL, the magnetization threshold value Hsp of the positive direction is larger than the magnetization threshold value Hsn of the negative direction by ΔHp. Since free magnetic layer VL has asymmetric magnetization characteristics according to the direction of an applied magnetic field, the strength of the magnetic field required to be applied to free magnetic layer VL varies depending on the write data level. In order to use such a tunneling magneto-resistance element as a memory cell, a magnetic field exceeding the larger magnetization threshold value must be applied regardless of the write data level. In other words, a data write current for generating a magnetic field exceeding the magnetization threshold value Hsp must be applied even when free magnetic layer VL is to be magnetized in the negative direction. In this case, an unnecessarily large data write current is required. This may possibly cause increased power consumption and increased current density in the wirings, resulting in degraded wiring reliability.

Such a phenomenon also occurs in a tunneling magneto-resistance element having a two-layer storage node structure.

FIG. 55 is a conceptual diagram illustrating non-uniformity of magnetization characteristics in the MTJ memory cell having a two-layer storage node structure.

Referring to FIG. 55, in a tunneling magneto-resistance element having a two-layer storage node structure as well, a uniform magnetic field ΔHp is applied to free magnetic layer VL1 in the easy-axis direction due to magnetostatic coupling between antiferromagnetic material layer AFL and fixed magnetic layer FL, as in the case of the single-layer storage node structure. Such a uniform magnetic field ΔHp makes the magnetization behavior in free magnetic layers VL1, VL2 in the easy-axis direction asymmetric.

FIG. 56 is a hysteresis diagram illustrating magnetization characteristics in free magnetic layer VL in FIG. 55.

Referring to FIG. 56, the magnetization behavior of free magnetic layers VL1, VL2 in response to a data write magnetic field Hex of the easy-axis direction is shifted by ΔHp with respect to the theoretical characteristics shown in FIG. 52 due to the uniform magnetic field ΔHp produced by magnetostatic coupling with fixed magnetic layer FL. In other words, threshold values $-H_{01}'$, $-H_{02}'$, $-H_{03}'$ for a magnetic field of the negative direction are respectively shifted by ΔHp toward threshold values $+H_{01}$, $+H_{02}$, $+H_{03}$ for a magnetic field of the positive direction shown in FIG. 52. As a result, magnetization characteristics are asymmetric between the magnetic fields of the positive direction and negative directions. In other words, $H_{01}-|H_{01}'|=H_{02}-|-H_{02}'|=H_{03}-|-H_{03}'|=\Delta Hp$.

As described above, in both tunneling magneto-resistance elements having a single-layer storage node structure and a two-layer storage node structure, an unnecessarily high data write current level must be applied due to the asymmetric magnetization characteristics.

SUMMARY OF THE INVENTION

It is an object of the present invention to provide a thin film magnetic memory device having MTJ memory cells that does not complicate a manufacturing process, has simple magnetization characteristics and is capable of assuring a sufficient operation margin.

It is another object of the present invention to provide a thin film magnetic memory device having MTJ memory cells that have symmetric magnetization characteristics independently of a write data level.

In summary, according to one aspect of the present invention, a thin film magnetic memory device includes a plurality of memory cells for storing data. Each memory cell includes a magnetic storage portion having an electric resistance value varying according to storage data, and a read access element allows a data read current to be selectively supplied to the magnetic storage portion corresponding to a memory cell selected for a data read operation. The magnetic storage portion includes a first magnetic layer having a fixed magnetization direction, second and third magnetic layers that are magnetized in opposite directions according to an applied data write magnetic field, a non-magnetic, conductive intermediate layer formed between the second and third magnetic layers, and an insulating layer formed between one of the second and third magnetic layers and the first magnetic layer. In data write operation, at least part of the data write magnetic field is generated by a first data write current flowing through the intermediate layer.

The above thin film magnetic memory device is capable of efficiently magnetizing two free magnetic layers by using a data write current flowing through the intermediate layer interposed between the second and third magnetic layers corresponding to the free magnetic layers. Magnetic fluxes resulting from magnetization of the two free magnetic layers interact with each other. In other words, a magnetic flux resulting from magnetization of one free magnetic layer serves as a magnetic flux for magnetizing the other free magnetic layer. As a result, a data write current required to rewrite the magnetization direction of the free magnetic layers can be reduced, thereby enabling both reduction in memory cell size and reduction in power consumption and magnetic noise.

According to another aspect of the present invention, a thin film magnetic memory device includes a plurality of memory cells for storing data. Each memory cell includes a magnetic storage portion having an electric resistance value varying according to storage data, and an access transistor allows a data read current to be selectively supplied to the magnetic storage portion corresponding to a memory cell selected for a data read operation. The magnetic storage portion includes a first magnetic layer having a fixed magnetization direction, second and third magnetic layers that are magnetized in opposite (antiparallel) directions according to an applied data write magnetic field and have different magnetic moments, a non-magnetic intermediate layer formed between the second and third magnetic layers, and an insulating layer formed between one of the second and third magnetic layers and the first magnetic layer. The thin film magnetic memory device further includes a data write line for passing therethrough a data write current for generating the data write magnetic field in data write operation. The intermediate layer is formed as a planar layer so as to be shared by at least two of the plurality of memory cells.

In the above thin film magnetic memory device, magnetic fluxes resulting from magnetization of the second and third magnetic layers corresponding to free magnetic layers interact with each other. In other words, a magnetic flux resulting from magnetization of one free magnetic layer serves as a magnetic flux for magnetizing the other free magnetic layer. As a result, a data write current required to rewrite the magnetization direction of the free magnetic layers can be reduced, thereby enabling both reduction in memory cell size and reduction in power consumption and magnetic noise. Moreover, since electric interference between memory cells need no longer be considered, the shape of the intermediate layer can be designed with improved flexibility. This simplifies the manufacturing process and improves the yield.

According to still another aspect of the present invention, a thin film magnetic memory device includes a plurality of memory cells for storing data, and a global data line and a local data line that are arranged in a hierarchical manner. Each memory cell includes a magnetic storage portion having an electric resistance value varying according to a magnetization direction that is rewritten in response to an applied magnetic field, and an access element allows a data read current to be selectively supplied to the magnetic storage portion corresponding to a memory cell selected for a data read operation. The global data line and the local data line pass therethrough a data write current for magnetizing the magnetic storage portion in a direction according to write data in data write operation.

The above thin film magnetic memory device enables reduction in resistance of a data write current path by using the global/local data lines arranged in a hierarchical manner.

Preferably, magnetic fields respectively generated by the data write currents flowing through the global data line and the local data line in the data write operation interact with each other in a constructive manner in the magnetic storage portion.

As a result, the data write current required to rewrite the magnetization direction of the magnetic storage portion can be reduced, enabling reduction in power consumption and magnetic noise.

According to yet another aspect of the present invention, a thin film magnetic memory device includes a plurality of memory cells for storing data and a first data write current line. Each memory cell includes a magnetic storage portion having an electric resistance value varying according to storage data. The magnetic storage portion includes a first magnetic layer having a fixed magnetization direction, a second magnetic layer that is magnetized in a direction according to a storage data level, and an insulating layer formed between the first and second magnetic layers. The first data write current line generates a first data write magnetic field for magnetizing the second magnetic layer of at least one memory cell selected for data write operation. Regardless of the storage data level, the first data write magnetic field includes in the second magnetic layer a component of a direction that cancels a coupling magnetic field applied from the first magnetic layer to the second magnetic layer.

The above thin film magnetic memory device enables the second magnetic layer (free magnetic layer) in the magnetic storage portion (tunneling magneto-resistance element) to have symmetric magnetization characteristics along the easy-axis direction independently of the write data level. As a result, a data write current required to write the storage data can be suppressed. This enables reduction in power consumption of the MRAM device and current density on the data write current line, thereby improving operation reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
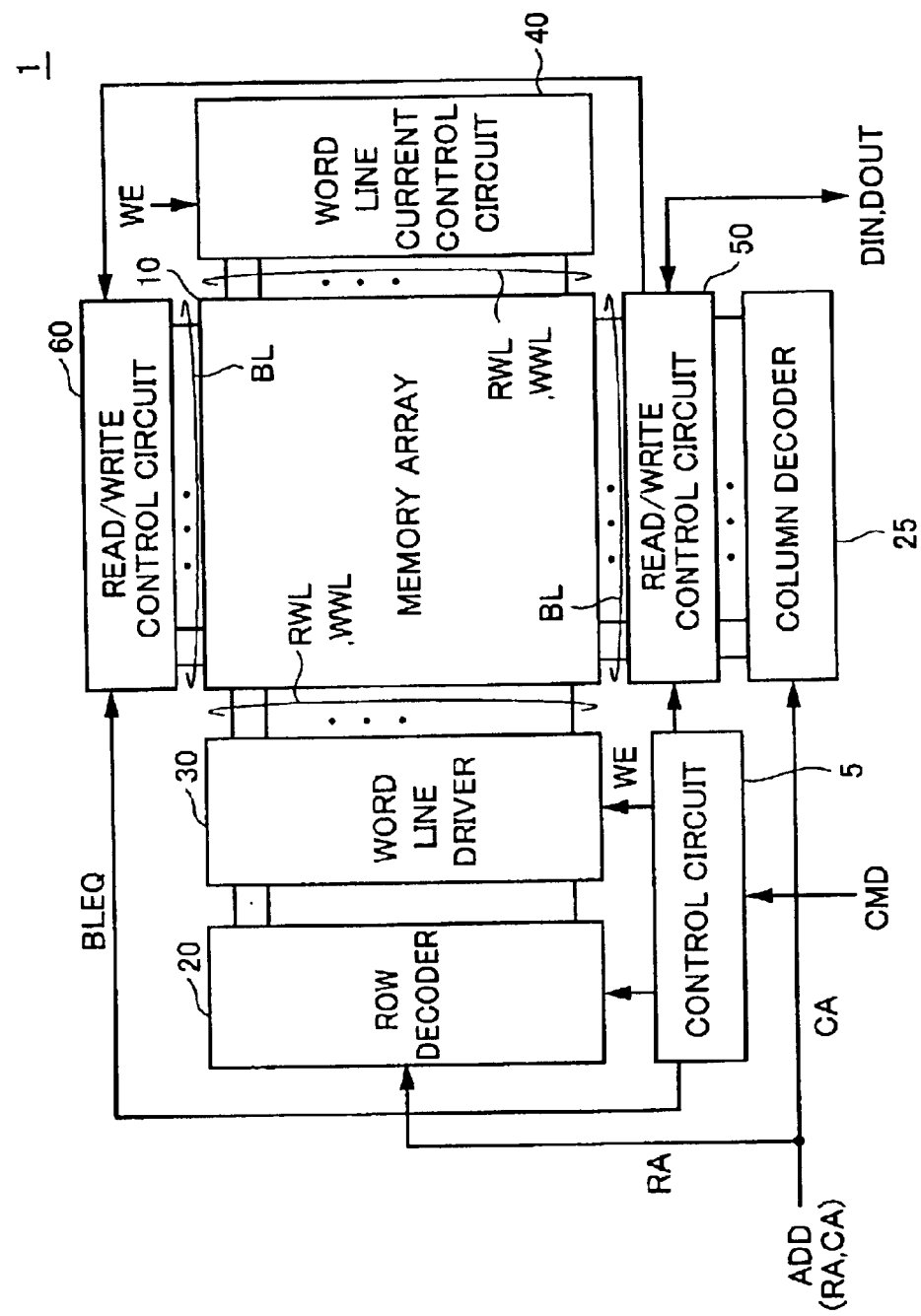
FIG. 1 is a schematic block diagram showing the overall structure of an MRAM device according to a first embodiment of the present invention.

Hereinafter, embodiments of the present invention will be described in detail with reference to the accompanying drawings. Note that the same reference numerals and characters denote the same or corresponding portions throughout the figures.

First Embodiment

Referring to FIG. 1, an MRAM device 1 according to the first embodiment of the present invention conducts random access in response to an external control signal CMD and an external address signal ADD in order to receive write data DIN and output read data DOUT.

MRAM device 1 includes a control circuit 5 for controlling the overall operation of MRAM device 1 in response to control signal CMD, and a memory array 10 having a plurality of MTJ memory cells arranged in a matrix. In memory array 10, a plurality of write word lines WWW and a plurality of read word lines RWL are arranged respectively corresponding to the MTJ memory cell rows (hereinafter, sometimes simply referred to as "memory cell rows"). Bit lines BL and source lines SL are arranged respectively corresponding to the MTJ memory cell columns (hereinafter, sometimes simply referred to as "memory cell columns"). The structure of memory array 10 will be specifically described later.

MRAM device 1 further includes a row decoder 20, a column decoder 25, a word line driver 30, a word line current control circuit 40 and read/write control circuits 50, 60.

Row decoder 20 conducts row selection in memory array 10 according to a row address RA of address signal ADD. Column decoder 25 conducts column selection in memory array 10 according to a column address CA of address signal ADD. Word line driver 30 selectively activates a read word line RWL or a write word line WWL based on the row selection result of row decoder 20. Row address RA and column address CA together indicate a memory cell selected for data read or write operation (hereinafter, sometimes referred to as "selected memory cell").

Word line current control circuit 40 applies a data write current to write word line WWL in data write operation. Read/write control circuit 50, 60 correctively refers to a circuit group that is arranged in a region adjacent to memory array 10 in order to apply a data write current and a sense current (data read current) to bit line BL in data read and write operations, respectively.

Figure 2:
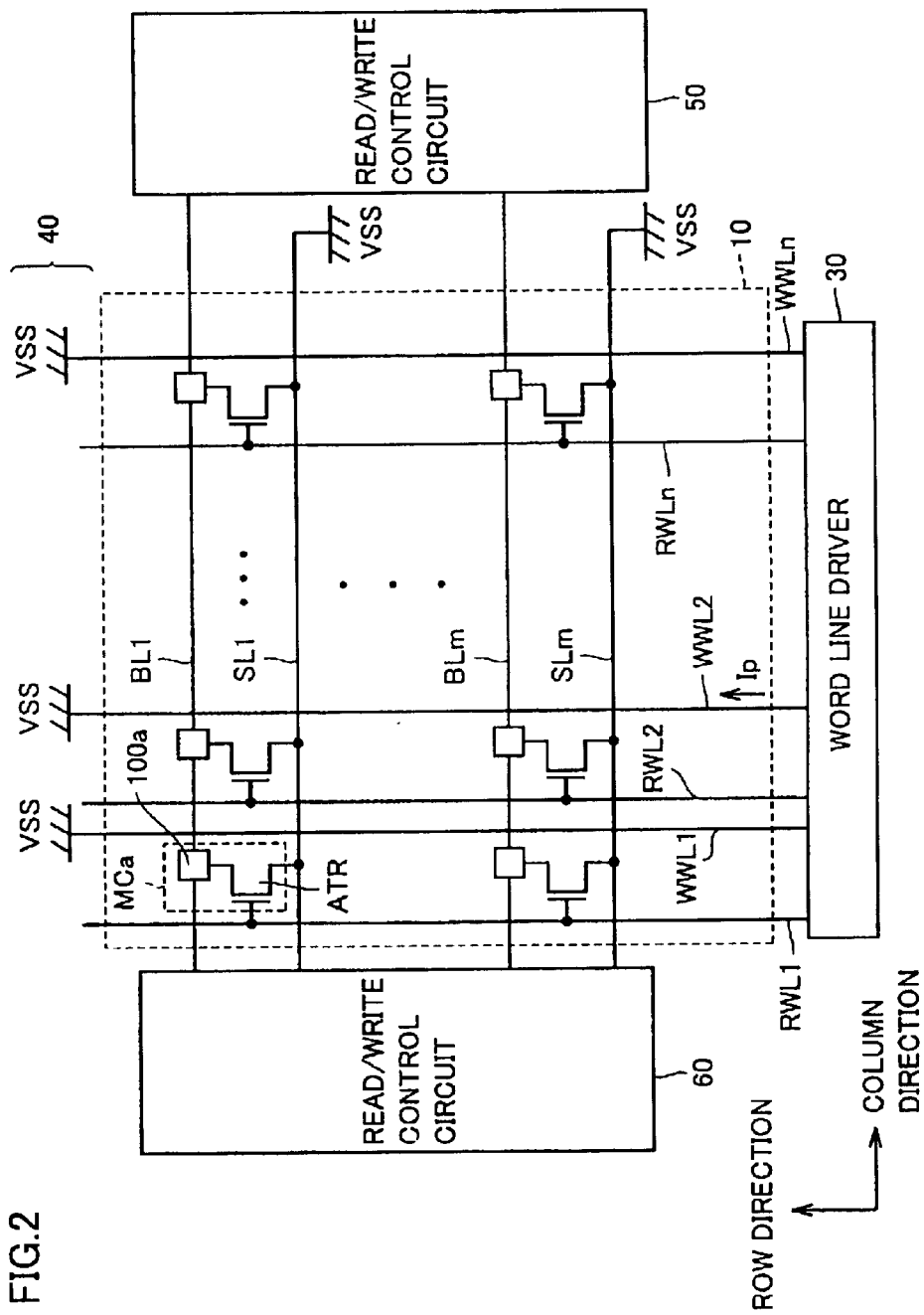
FIG. 2 is a conceptual diagram showing an example of a memory array in FIG. 1.

Referring to FIG. 2, memory array 10 includes MTJ memory cells MCa of a two-layer storage node structure arranged in n rows by m columns (where n, m is a natural number). Each memory cell MCa includes an access transistor ATR and a tunneling magneto-resistance element 100a.

Read word lines RWL1 to RWLn and write word lines WWL1 to WWLn are arranged respectively corresponding to the memory cell rows. Bit lines BL1 to BLm and source lines SL1 to SLm are arranged respectively corresponding to the memory cell columns. Each source line SL1 to SLm is coupled to the sources of access transistors ATR in a corresponding memory cell row, and supplies a ground voltage VSS.

Word line current control circuit 40 couples each write word line WWL to ground voltage VSS in the region facing word line driver 30 with memory array 10 interposed therebetween. This allows a data write current Ip of a fixed direction to be supplied to a write word line selectively coupled to a power supply voltage VDD by word line driver 30.

FIG. 2 exemplarily shows read word lines RWL1, RWL2, RWLn, write word lines WWL1, WWL2, WWLn, bit lines BL1, BLm, and source lines SL1, SLm corresponding to the first, second and $n^{th}$ rows and the first and $m^{th}$ columns, and some of the corresponding memory cells.

Figure 3:
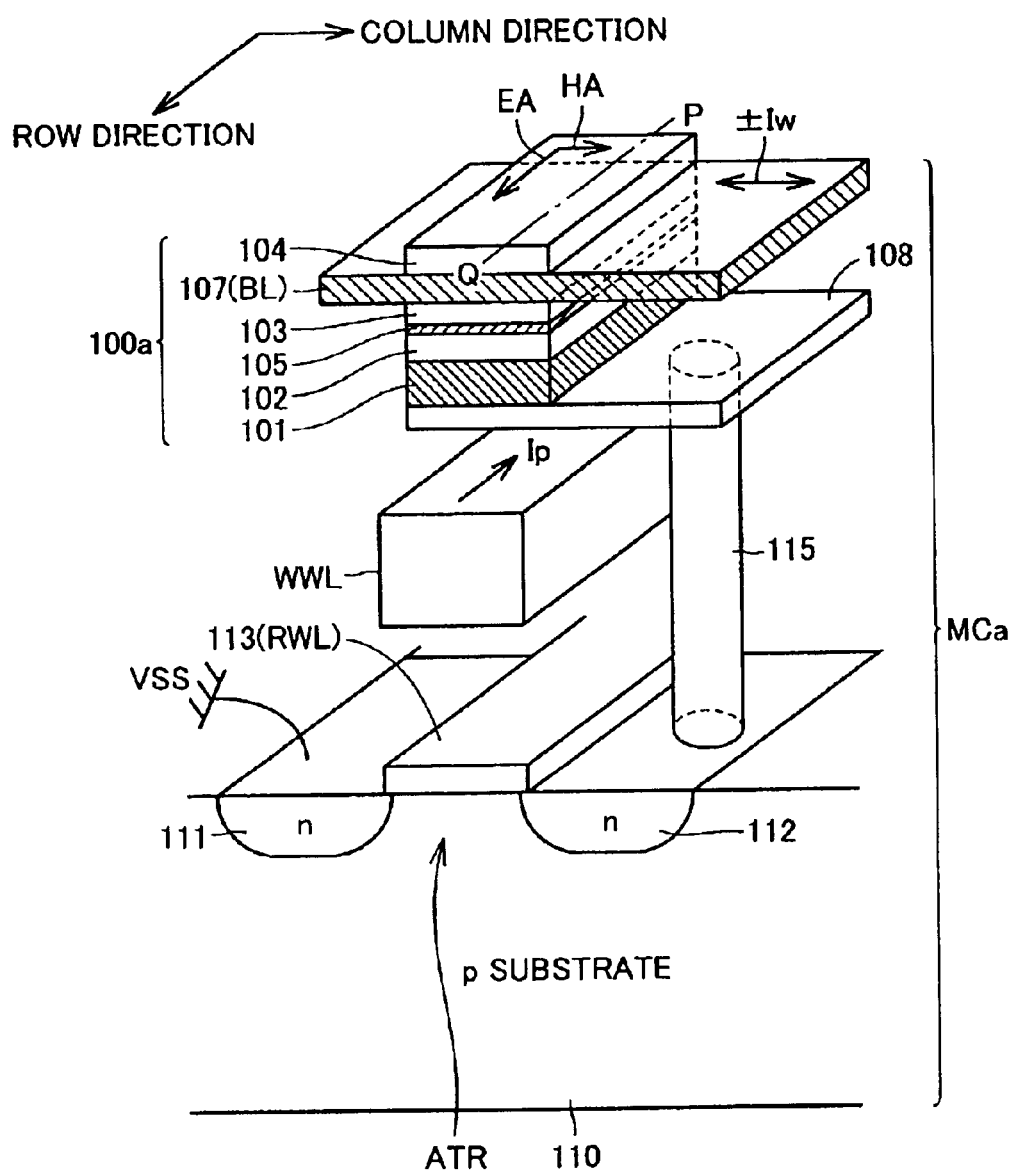
FIG. 3 is a conceptual diagram showing an example of an MTJ memory cell having a two-layer storage node structure shown in FIG. 2.

Referring to FIG. 3, MTJ memory cell MCa in FIG. 2 includes a tunneling magneto-resistance element 100a. Tunneling magneto-resistance element 100a includes an antiferromagnetic material layer 101, a fixed magnetic layer 102, free magnetic layers 103, 104, a tunneling barrier 105, and an intermediate layer 107.

Fixed magnetic layer 102 having a fixed magnetization direction is formed on antiferromagnetic material layer 101. Antiferromagnetic material layer 101 is provided in order to fix the magnetization direction of fixed magnetic layer 102 more strongly. Tunneling barrier 105 is formed between fixed magnetic layer 102 and free magnetic layer 103. Free magnetic layers 103, 104 are formed with intermediate layer 107 interposed therebetween. Intermediate layer 107 has magnetically neutral characteristics, and is formed from a non-magnetic conductor.

The shape and electric characteristics of intermediate layer 107 can be arbitrarily determined. According to the first embodiment, bit line BL is formed using intermediate layer 107. More specifically, intermediate layer 107 is formed as a stripe-shaped metal wiring that extends in the column direction so that intermediate layers 107 in the MTJ memory cells of the same memory cell column are electrically coupled to each other. This metal wiring serves as bit line BL.

In data write operation, a data write current ±Iw is supplied to intermediate layer 107 (bit line BL). The direction of data write current ±Iw is determined according to the write data level. Moreover, data write current Ip is supplied to write word line WWL extending in the row direction. Data write current Ip has a fixed direction regardless of the write data level.

A data write magnetic field is generated by data write current ±Iw flowing through intermediate layer 107 (bit line BL), and a magnetic field of the easy-axis (EA) direction is applied to free magnetic layers 103, 104 by this data write magnetic field. On the other hand, a data write magnetic field is generated by data write current Ip flowing through write word line WWL, and a magnetic field of the hard-axis (HA) direction is applied to free magnetic layers 103, 104 by this data write magnetic field.

Figure 4B:
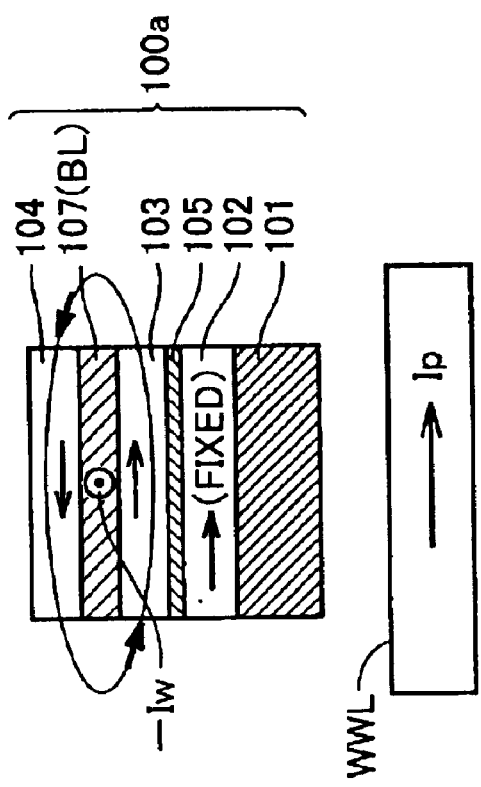
FIGS. 4A and 4B are conceptual diagrams illustrating the magnetization direction of free magnetic layers in data write operation.
Figure 4A:
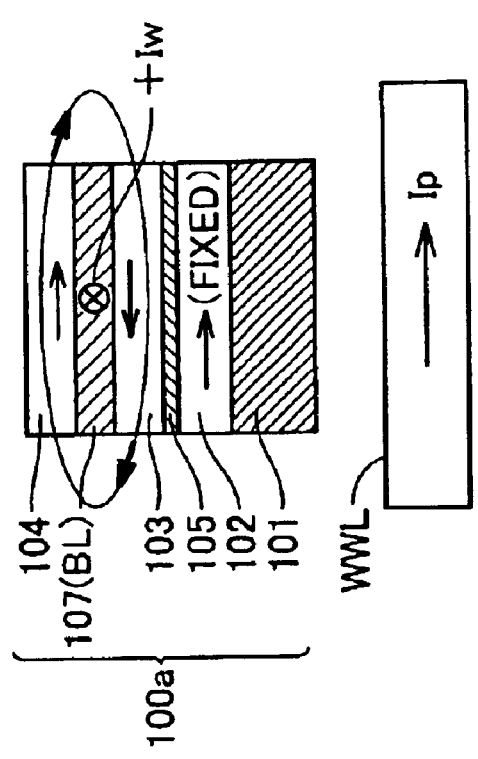

Hereinafter, the magnetization direction of the free magnetic layers in data write operation will be described with reference to FIGS. 4A and 4B. FIGS. 4A and 4B correspond to a cross-sectional view taken along line P–Q in FIG. 3.

Referring to FIGS. 4A and 4B, the direction of data write current +Iw flowing through intermediate layer 107 (bit line BL) varies depending on the write data level.

FIG. 4A shows the case where a data write current +Iw of the positive direction is supplied to intermediate layer 107 (bit line BL). When data write current Ip is supplied to a corresponding write word line WWL, the magnetization directions of free magnetic layers 103, 104 are rewritten in response to a data write magnetic field generated by data write current +Iw.

In the present embodiment, free magnetic layers 103, 104 are laminated each other with non-magnetic intermediate layer 107 interposed therebetween. This enables both free magnetic layers 103, 104 to be efficiently magnetized in opposite direction with each other in a looped manner by a magnetic field generated by the data write current flowing through intermediate layer 107. Magnetic fluxes respectively generated by magnetization of the two free magnetic layers interact with each other. In other words, a magnetic flux generated by magnetization of one free magnetic layer serves as a magnetic flux for magnetizing the other.

This enables reduction in data write current required to generate the switching magnetic field strength of free magnetic layers 103, 104. Moreover, since the magnetic flux does not extend outside the memory cell, adverse effects on the other memory cells can be suppressed.

Fixed magnetic layer 102 has a fixed magnetization direction. Accordingly, when data write operation is conducted using a data write current +Iw, fixed magnetic layer 102 and free magnetic layer 103 have opposite (antiparallel) magnetization directions. As a result, tunneling magneto-resistance element 100a has an increased electric resistance value.

FIG. 4B shows the case where a data write current −Iw of the negative direction is supplied to intermediate layer 107 (bit line BL). In this case, free magnetic layers 103, 104 are magnetized in the opposite directions to those in FIG. 4A. Note that, as described before, data write current Ip flowing through write word line WWL has a fixed direction regardless of the write data level.

Accordingly, when data write operation is conducted using data write current −Iw, fixed magnetic layer 102 and free magnetic layer 103 have the same (parallel) magnetization direction. As a result, tunneling magneto-resistance element 100a has a reduced electric resistance value.

The material and thickness of free magnetic layers 103, 104 are determined so that the magnetization directions of free magnetic layers 103, 104 can be changed only in the MTJ memory cell having a data write current supplied to both a corresponding write word line WWL and intermediate layer 107 (bit line BL). In other words, the material and thickness of free magnetic layers 103, 104 are determined so that the data can be rewritten only to that MTJ memory cell.

Figure 51:
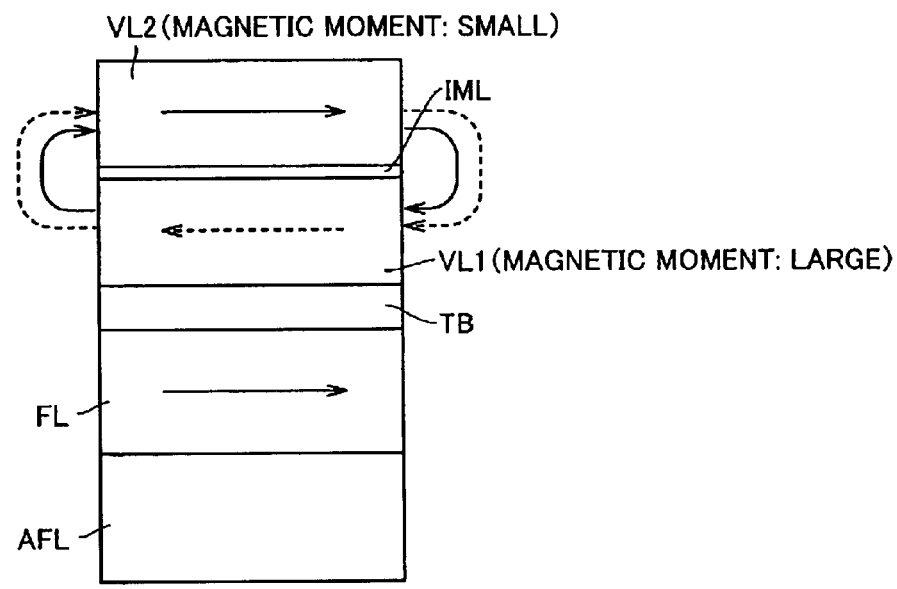
FIG. 51 is a cross-sectional view showing the structure of a conventional tunneling magneto-resistance element having two free magnetic layers.

As opposed to the conventional tunneling magneto-resistance element in FIG. 51, in the tunneling magneto-resistance element in the MTJ memory cell according to the first embodiment, free magnetic layers 103, 104 need not have different magnetic moments. Accordingly, free magnetic layers 103, 104 can be formed from the same material and with the same thickness. This prevents the manufacturing process from being complicated.

Referring back to FIG. 3, access transistor ART includes source/drain regions (n-type regions) 111, 112 formed at a P-type substrate 110, and a gate electrode 113. Source/drain region 111 is electrically coupled to ground voltage VSS.

Read word line RWL is formed using gate electrode 113. More specifically, each gate electrode 113 extends in the row direction so that gate electrodes 113 in the MTJ memory cells of the same memory cell row are electrically coupled to each other. Access transistor ATR is thus turned ON in response to activation (H level) of a corresponding read word line RWL.

Tunneling magneto-resistance element 100a is electrically coupled to source/drain region 112 of access transistor ATR through a barrier metal 108 and a via hole 115. Barrier metal 108 is a buffer material for obtaining electric contact with antiferromagnetic material layer 101.

In data read operation, read word line RWL is activated (H level), whereby bit line BL can be pulled down to ground voltage VSS through the electric resistance of tunneling magneto-resistance element 100a. As described before, the electric resistance value of tunneling magneto-resistance element 100a varies according to the relation between the respective magnetization directions of free magnetic layer 103 and fixed magnetic layer 102. Therefore, the voltage change behavior of bit line BL varies depending on the storage data of the MTJ memory cell.

In response to a sense current, the voltage on bit line BL changes according to the storage data level of MTJ memory cell MCa. Therefore, the storage data of MTJ memory cell MCa can be read by sensing the voltage change on bit line BL.

Free magnetic layer 104 is provided so as to be magnetized in a looped manner together with free magnetic layer 103 in data write operation, and does not have any electrical function in data write and read operations. Accordingly, free magnetic layer 104 may either be formed as an independent element for every MTJ memory cell as shown in FIG. 3, or may be formed with a stripe shape like bit line BL.

With the above structure, in data write operation, a data write current is supplied to both write word line WWL and bit line BL corresponding to the selected memory cell of the memory array in FIG. 2. In data read operation, read word line RWL corresponding to the selected memory cell is activated and a voltage on a corresponding bit line BL is sensed. Data write and read operations can be conducted in this way.

Figure 5:
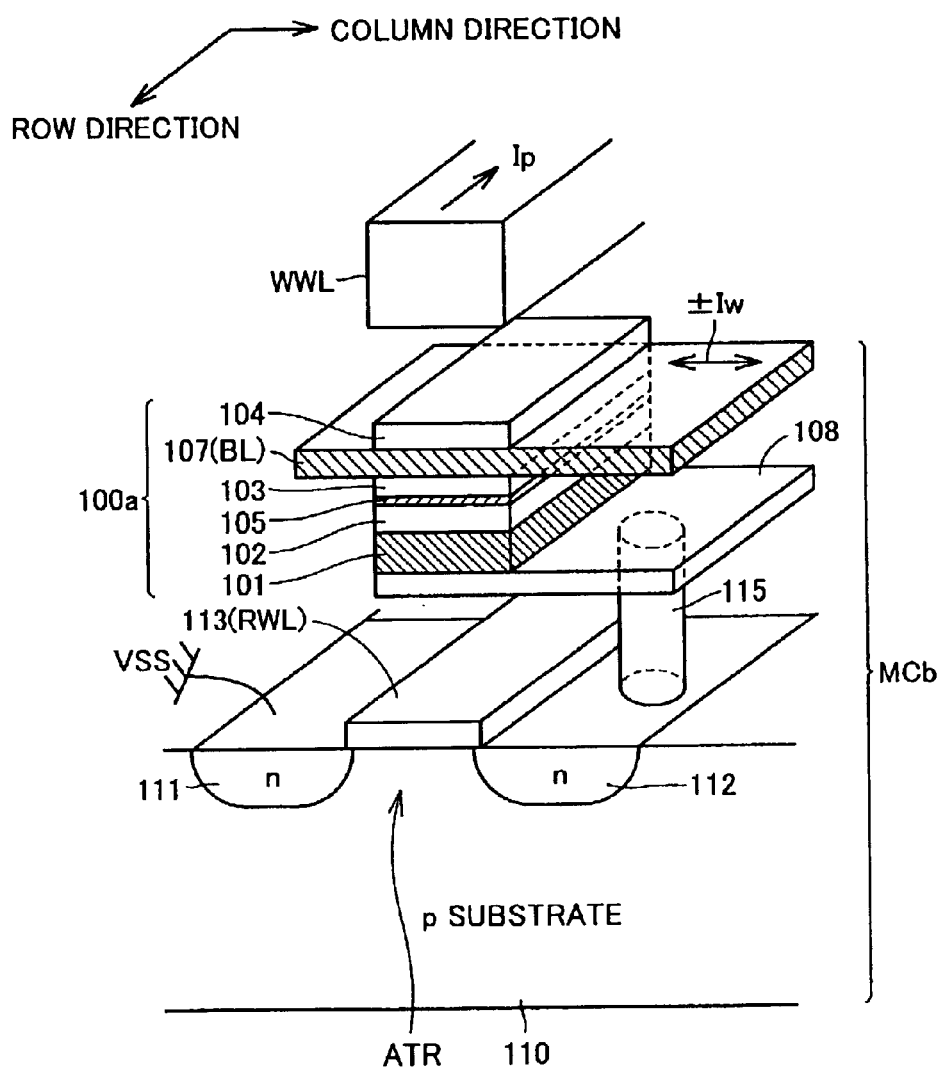
FIG. 5 is a conceptual diagram showing another example of the MTJ memory cell having a two-layer storage node structure.

FIG. 5 shows another example of the MTJ memory cell having a two-layer storage node structure.

Referring to FIG. 5, an MTJ memory cell MCb having a two-layer storage node structure is different from MTJ memory cell MCa of FIG. 3 in that write word line WWL is formed above tunneling magneto-resistance element 100a and bit line BL. Since the structure of MTJ memory cell MCb is otherwise the same as that of MTJ memory cell MCa, detailed description thereof will not be repeated here. Data write and read operations to and from MTJ memory cell MCb can be conducted in the same manner as that of MTJ memory cell MCa.

The above structure eliminates the need to form a wiring layer between tunneling magneto-resistance element 100a and access transistor ATR, and thus reduces the distance therebetween. As a result, the aspect ratio (the ratio of longitudinal dimension to lateral dimension) of via hole 115 is reduced. This facilitates formation of via hole 115, thereby simplifying the manufacturing process.

Figure 6:
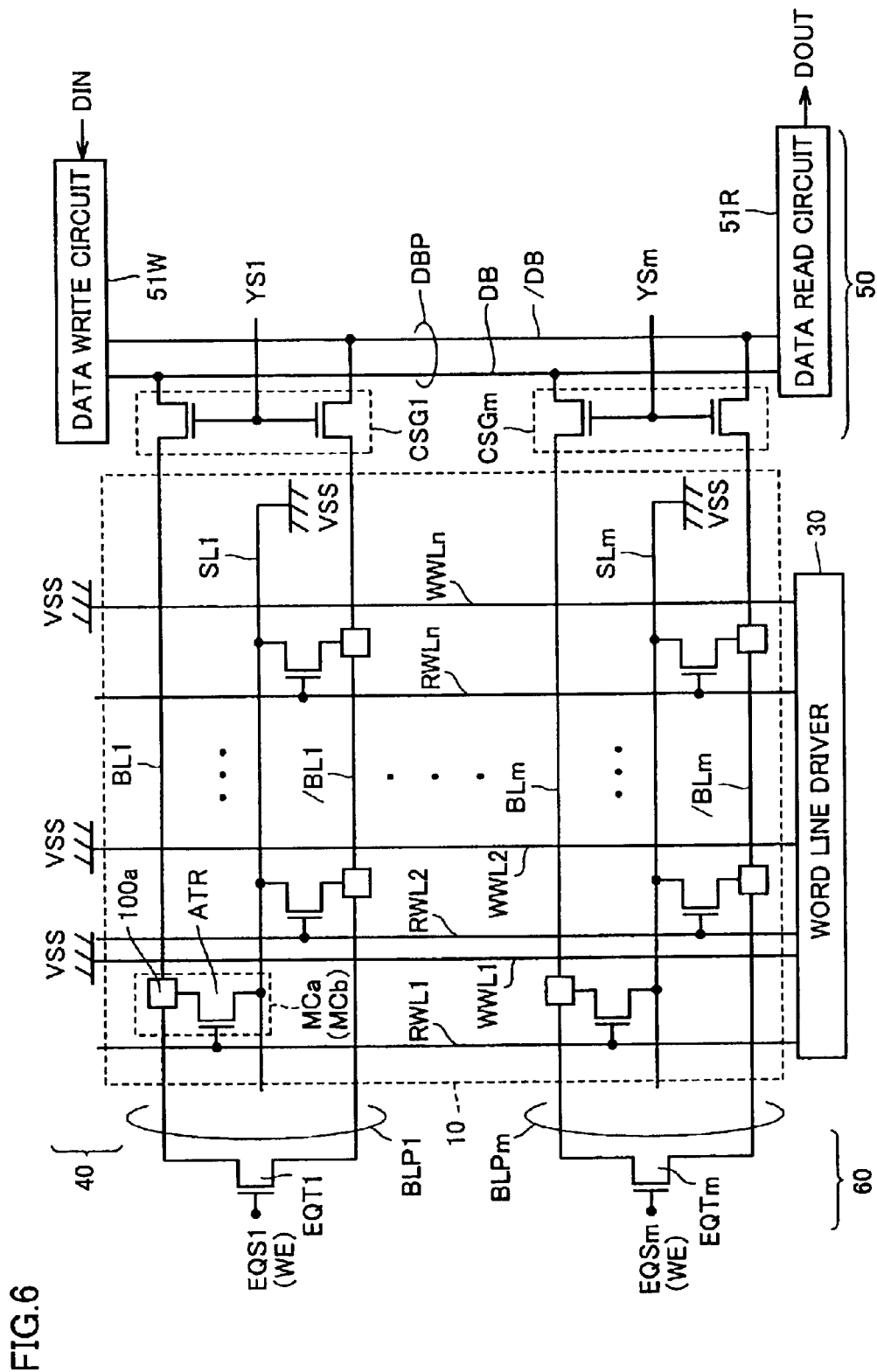
FIG. 6 is a block diagram showing another example of memory array.

FIG. 6 shows another example of memory array 10. Either MTJ memory cell MCa or MCb of FIGS. 2 and 5 may be applied to the structure of FIG. 6.

Referring to FIG. 6, bit line pairs are arranged respectively corresponding to the memory cell columns. Each bit line pair includes two complementary bit lines. FIG. 6 exemplarily shows bit line pairs BLP1, BLPm of the first and $m^{th}$ columns. Bit line pair BLP1 includes bit lines BL1, /BL1, and bit line pair BLPm includes bit lines BLm, /BLm. Hereinafter, bit line pairs BLP1 to BLPm are sometimes generally referred to as bit line pairs BLP. Similarly, bit lines /BL1 to /BLm are sometimes generally referred to as bit lines /BL. Bit lines BL, /BL are formed using intermediate layer 107.

The MTJ memory cells are coupled to either bit lines BL or bit lines /BL in every other row. For example, regarding the memory cells of the first column, the memory cell of the first row is coupled to bit line BL1, and the memory cell of the second row is coupled to bit line /BL1. Similarly, the memory cells of the odd rows are respectively coupled to one bit lines BL1 to BLm of bit line pairs BLP, and the memory cells of the even rows are respectively coupled to the other bit lines /BL1 to /BLm of bit line pairs BLP. Accordingly, when read word line RWL is selectively activated according to the row selection result, either one bit lines BL1 to BLm or the other bit lines /BL1 to /BLm of the bit line pairs are respectively coupled to the corresponding memory cells.

Row decoder 25 activates one of column selection signals YS1 to YSm to the selected state (H level) according to the decode result of column address CA. Column selection signals YS1 to YSm correspond to the memory cell columns, respectively. A data bus pair DBP for transmitting read data and write data includes complementary data buses DB, /DB.

Read/write control circuit 50 includes column selection gates CSG1 to CSGm, a data write circuit 51W, and a data read circuit 51R.

Column selection gates CSG1 to CSGm are respectively arranged between bit line pairs BLP1 to BLPm and data bus pair DBP. Each column selection gate CSG1 to CSGm includes a transistor switch that is electrically coupled between data bus DB and a corresponding bit line BL, and a transistor switch that is electrically coupled between data bus /DB and a corresponding bit line /BL. These transistor switches are turned ON in response to activation of a corresponding column selection signal.

For example, column selection gate CSG1 includes a transistor switch that is electrically coupled between data bus DB and bit line BL1 and turned ON in response to activation of column selection signal YS1, and a transistor switch that is electrically coupled between data bus /DB and bit line /BL1 and turned ON in response to activation of column selection signal YS1.

Short-circuit transistors EQT1 to EQTm for electrically coupling corresponding complementary bit lines to each other and control signals EQS1 to EQSm are provided respectively corresponding to bit line pairs BLP1 to BLPm. Control signal EQS1 to EQSm is activated to H level when a corresponding memory cell column is selected for data write operation. Hereinafter, short-circuit transistors EQT1 to EQTm are sometimes generally referred to as short-circuit transistors EQT.

Each short-circuit transistor EQT electrically couple corresponding bit lines BL and /BL to each other in response to activation of a corresponding control signal EQS1 to EQSm to H level. Control signals EQS1 to EQSm may be replaced with a control signal WE that is activated to H level in data write operation.

In data write operation, data write circuit 51W sets data buses DB, /DB to power supply voltage VDD and ground voltage VSS, or ground voltage VSS and power supply voltage VDD, respectively, according to write data DIN. In data write operation, short-circuit transistor EQT is turned ON at least in the selected memory cell column. Therefore, a data write current flows through bit lines BL, /BL of the selected memory cell column as a reciprocating current according to the voltage difference between data buses DB, /DB. A data write current Ip is supplied to write word line WWL of the selected memory cell row. Data write current Ip has a fixed direction regardless of the write data level.

With the above structure, the direction of data write current ±Iw flowing through bit line BL (/BL) can be easily controlled by merely switching the voltages of data buses DB, /DB according to the write data level. This simplifies the structure of data write circuit 51W.

Hereinafter, data read operation will be described.

In data read operation, one of data buses DB, /DB can be pulled down to ground voltage VSS through a corresponding bit line BL or /BL and tunneling magneto-resistance element 100a of the selected memory cell. As a result, the voltage on data bus DB or /DB connected to the selected memory cell changes according to the storage data level of the selected memory cell. Data read circuit 51R produces read data DOUT according to the voltages on data buses DB, /DB.

Alternatively, memory array 10 may include dummy memory cells (not shown) having an intermediate value of electric resistance values R0 and R1 of the MTJ memory cell so that the selected memory cell and a dummy memory cell are respectively connected to data buses DB, /DB, or data buses /DB, DB in data read operation. In this case, data read circuit 51R is capable of conducting complementary data read operation based on the voltage comparison between data buses DB and /DB. As a result, a read operation margin is improved.

Figure 7:
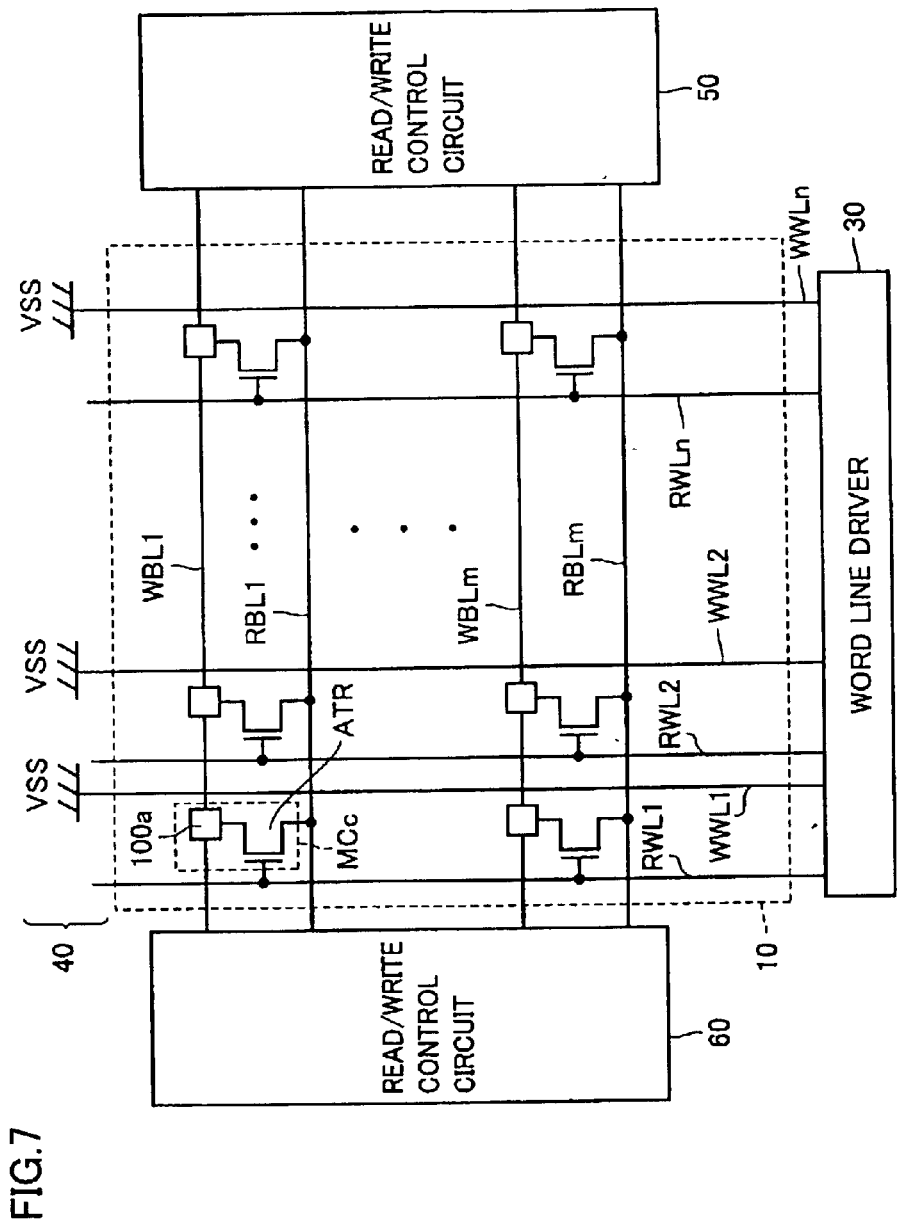
FIG. 7 is a block diagram showing still another example of memory array.

FIG. 7 shows still another example of memory array 10.

Referring to FIG. 7, memory cells MCc having a two-layer storage node structure are arranged in n rows by m columns. Moreover, bit lines BL are replaced with write bit lines WBL for write operation and read bit lines RBL for data read operation, and source lines SL are eliminated.

Write bit lines WBL and read bit lines RBL are arranged respectively corresponding to the memory cell columns. FIG. 7 exemplarily shows write bit lines WBL1, WBLm and read bit lines RBL1, RBLm corresponding to the first and $m^{th}$ columns. Hereinafter, read bit lines RBL1 to RBLm and write bit lines WBL1 to WBLm are sometimes generally referred to as read bit lines RBL and write bit lines WBL, respectively.

Figure 8:
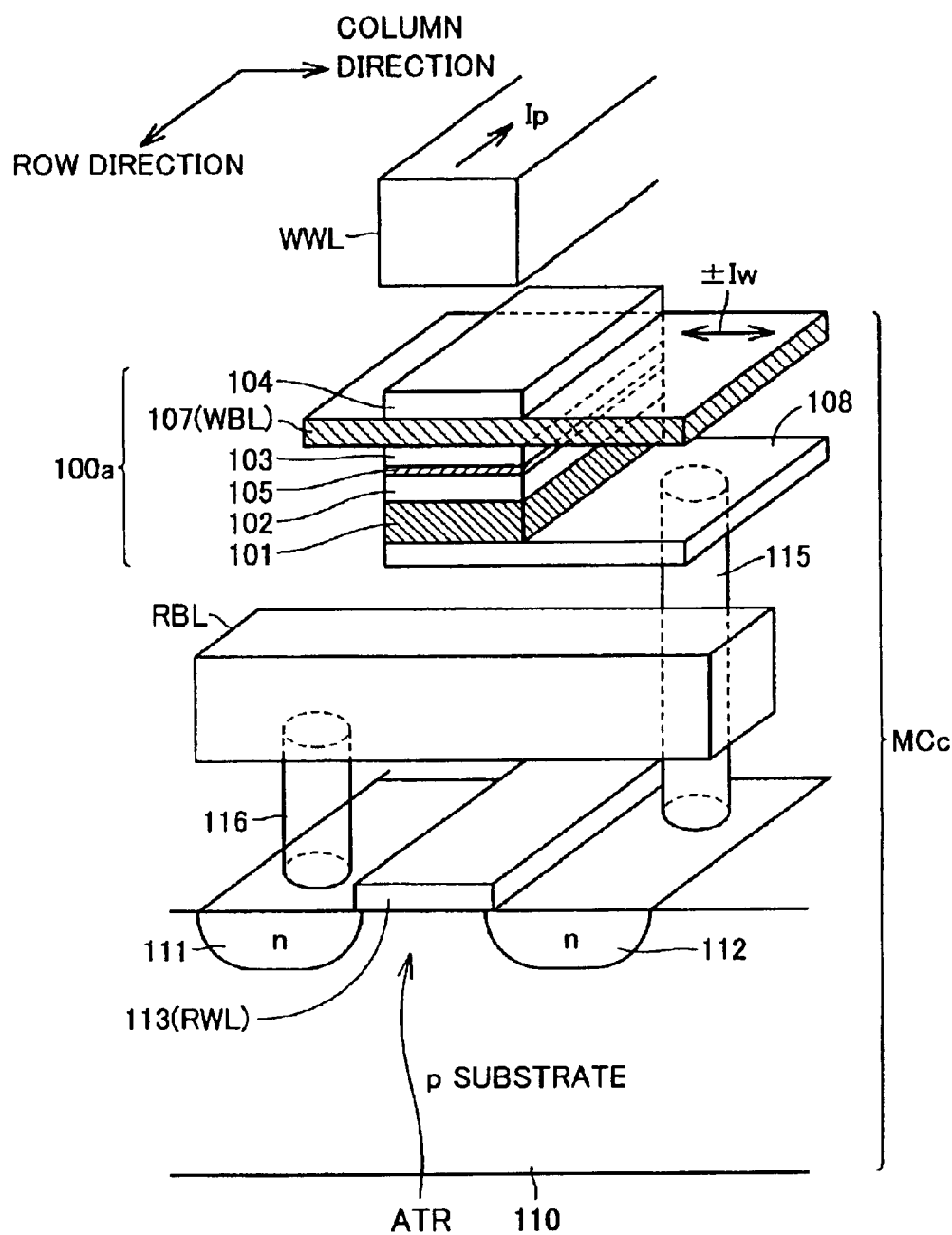
FIG. 8 shows the structure of a memory cell in FIG. 7.

Referring to FIG. 8, MTJ memory cell MCc having a two-layer storage node structure shown in FIG. 7 is different from MTJ memory cell MCa of FIG. 5 in that read bit line RBL is provided in the column direction.

Write bit line WBL is formed using intermediate layer 107. In data write operation, a data write current ±Iw is supplied to write bit line WBL. In data read operation, however, read/write control circuits 50, 60 set each write bit line WBL to ground voltage VSS.

Read bit line RBL is electrically coupled to source/drain region 111 of access transistor ATR through a via hole 116. In data read operation, source/drain region 112 serves as a source of access transistor ATR.

As a result, in response to turning-ON of access transistor ATR, a sense current can be supplied to a path formed by read bit line RBL, access transistor ATR, tunneling magneto-resistance element 100a, and write bit line WBL (ground voltage VSS).

Referring back to FIG. 7, in data write operation, data write currents Ip, ±Iw are respectively supplied to write word line WWL and write bit line WBL corresponding to the selected memory cell.

In data read operation, read word line RWL corresponding to the selected memory cell is activated, and read bit line RBL corresponding to the selected memory cell can be responsively pulled down to ground voltage VSS through tunneling magneto-resistance element 100a of the selected memory cell. As a result, the voltage on read bit line RBL changes according to the storage data level of the selected memory cell, whereby the storage data can be read from the selected memory cell.

Figure 9:
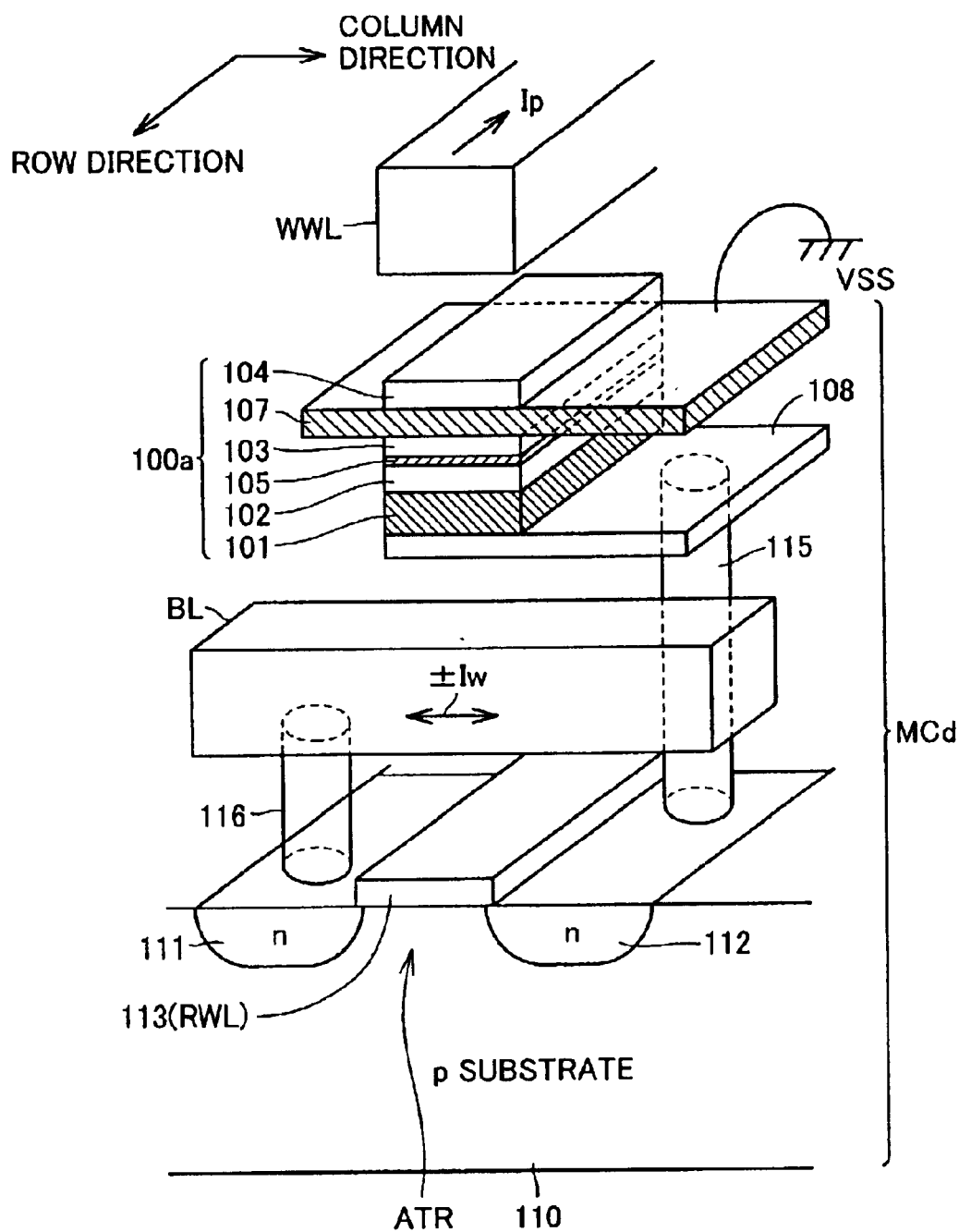
FIG. 9 shows still another example of the MTJ memory cell having a two-layer storage node structure.

FIG. 9 shows still another example of the MTJ memory cell having a two-layer storage node structure.

Referring to FIG. 9, MTJ memory cell MCd is different from MTJ memory cell MCb in FIG. 5 in that bit line BL is not formed in intermediate layer 107 but in an independent metal wiring layer.

More specifically, in FIG. 9, intermediate layer 107 has a fixed voltage (e.g., ground voltage VSS). This eliminates the need to consider electric interference between the MTJ memory cells. Accordingly, intermediate layer 107 can be formed with any shape such as a planar or stripe shape. In other words, the shape of intermediate layer 107 can be designed with improved flexibility. This facilitates the manufacturing process and improves manufacturing yield.

Bit line BL extends in the column direction and is electrically coupled to source/drain region 111 of access transistor ATR through via hole 116. Source/drain region 112 of access transistor ATR is electrically coupled to tunneling magneto-resistance element 100a through via hole 115 and barrier metal 108.

In data write operation, data write currents ±Iw, Ip are respectively supplied to bit line BL and write word line WWL, whereby free magnetic layers 103, 104 can be magnetized in the direction according to write data DIN. Note that free magnetic layers 103, 104 of MTJ memory cell MCd are formed from different materials and with different thicknesses so as to have different magnetic moments (magnetization threshold values).

In data read operation, read word line RWL is activated, whereby bit line BL can be pulled down to ground voltage VSS through electric resistance of tunneling magneto-resistance element 100a. As a result, the voltage on bit line BL changes according to the electric resistance value of the tunneling magneto-resistance element, that is, the storage data level of the MTJ memory cell. The storage data can thus be read from the selected memory cell.

By using the MTJ memory cell having a two-layer storage node structure of the first embodiment, increase in data write current amount for generating the switching magnetic field strength can be suppressed even when the memory cell size is reduced. This facilitates scaling of the memory cell.

Moreover, provided that the memory cell size is the same, the data write current amount for generating the switching magnetic field strength can be suppressed, enabling reduction in power consumption. In particular, since a data write current is supplied to the intermediate layer interposed between two free magnetic layers, the switching magnetic field strength can be obtained efficiently. As a result, data write operation can be conducted with a smaller data write current, enabling further reduction in current consumption.

Moreover, since the bit line is formed using the intermediate layer in the tunneling magneto-resistance element, a required number of metal wiring layers is reduced. This increases the number of metal wiring layers that are available on the region above the MRAM array. Therefore, particularly when a system on-chip device is mounted together with the MRAM device, logic and the like, the logic can be designed with improved flexibility, enabling reduction in chip size.

Second Embodiment

In the first embodiment, the bit line is formed using the intermediate layer in the tunneling magneto-resistance element. The intermediate layer must be designed with a somewhat small thickness. Therefore, when bit line BL is formed using the intermediate layer extending in the column direction, the electric resistance value thereof may become relatively high. This may possibly reduce the read operation speed and may hinder a sufficient amount of data write current from being supplied.

In view of this, in the second embodiment, a so-called "hierarchical bit line structure" is applied to the memory array of the first embodiment, that is, the memory array including MTJ memory cells having a two-layer storage node structure.

Figure 10:
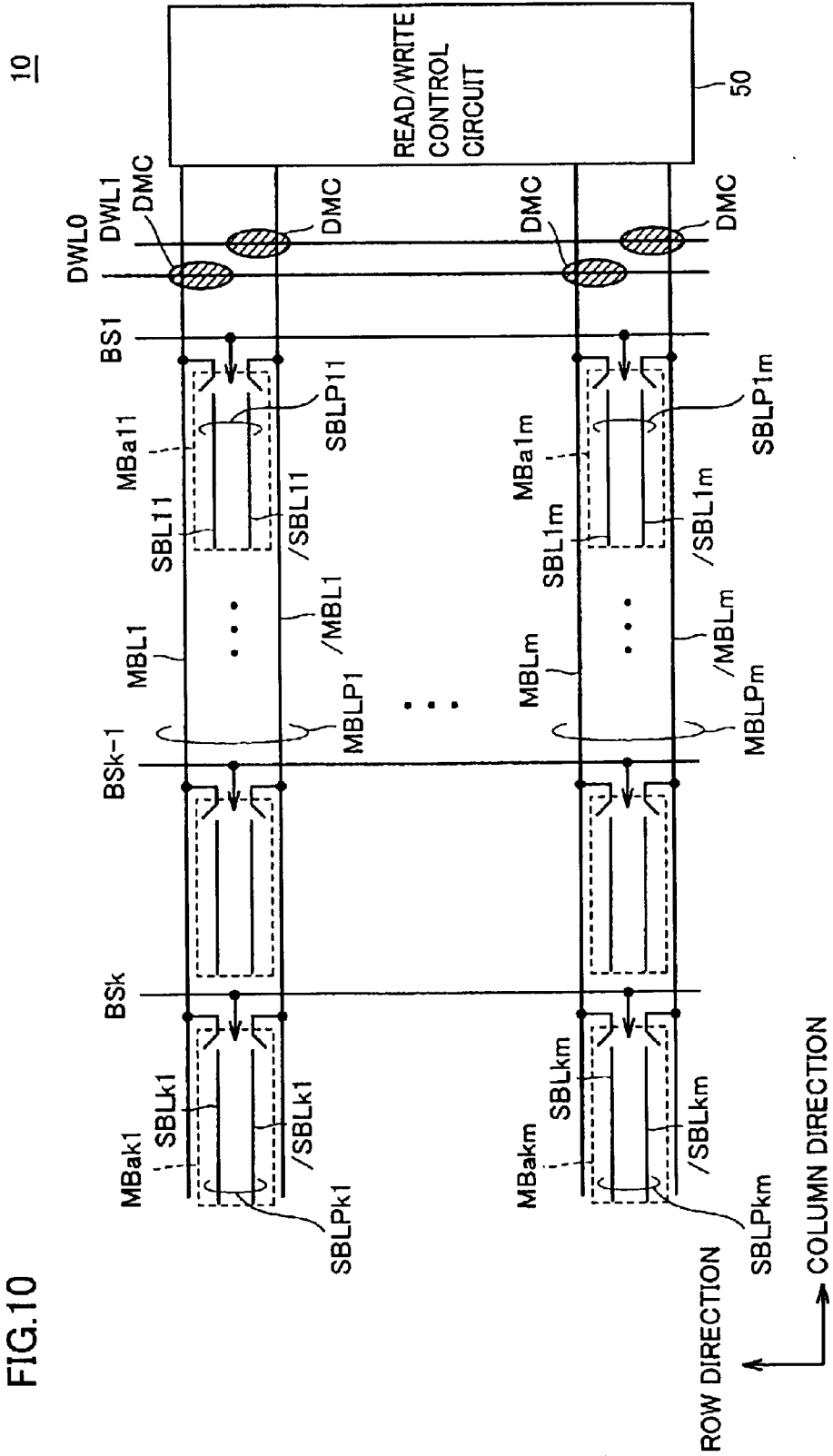
FIG. 10 schematically shows the structure of a memory array according to a second embodiment of the present invention.

Referring to FIG. 10, in memory array 10 of the second embodiment, main bit lines MBL and sub bit lines SBL corresponding to the memory cell columns are arranged in a hierarchical manner. Main bit lines /MBL and sub bit lines /SBL are also arranged corresponding to the memory cell columns. Main bit lines /MBL and sub bit lines /SBL are complementary to main bit lines MBL and sub bit lines /SBL, respectively. Like bit lines BL of FIGS. 3 and 5, sub bit lines SBL, /SBL are formed using intermediate layer 107 of tunneling magneto-resistance element 100a. Main bit lines MBL, /MBL are formed using an independent metal wiring having low electric resistance. Main bit lines MBL, /MBL form a main bit line pair MBLP, and sub bit lines SBL, /SBL form a sub bit line pair SBLP.

FIG. 10 exemplarily shows main bit lines MBL1, /MBL1 and MBLm, /MBLm of the first and $m^{th}$ columns. Main bit lines MBL1, /MBL1 form a main bit line pair MBLP1, and main bit lines MBLm, /MBLm form a main bit line pair MBLPm. Hereinafter, main bit lines MBL1 to MBLm, /MBL1 to /MBLm are sometimes generally referred to as main bit lines MBL, /MBL, respectively. Main bit line pairs MBLP1 to MBLPm are sometimes generally referred to as main bit line pairs MBLP.

Read/write control circuit 50 functions as a supply source of a data write current ±Iw to main bit lines MBL, /MBL of the selected memory cell column. For example, read/write control circuit 50 has the same structure as that of FIG. 6. In this case, read/write control circuit 50 couples main bit lines MBL, /MBL of the selected memory cell column to power supply voltage VDD and ground voltage VSS, or ground voltage VSS and power supply voltage VDD, respectively, according to the write data level DIN.

Each memory cell column is divided into k memory blocks respectively corresponding to the memory cell rows. For example, the MTJ memory cell group of the first column is divided into memory blocks MBa11 to MBak1. Similarly, the MTJ memory cell group of the $m^{th}$ column is divided into memory blocks MBa1m to MBakm. In the entire memory array 10, memory blocks MBa11 to MBakm are arranged in k rows by m columns. Hereinafter, memory blocks MBa11 to MBakm are sometimes generally referred to as memory blocks MBa.

In each memory cell column, two complementary sub bit lines SBL, /SBL are provided in every memory block MBa. Complementary sub bit lines SBL, /SBL form a sub bit line pair SBLP. For example, sub bit lines SBL11, /SBL11 of a sub bit line pair SBLP11 are provided in memory block MBa11.

Hereinafter, sub bit lines SBL11 to SBLkm and /SBL11 to /SBLkm are sometimes generally referred to as sub bit lines SBL and /SBL, respectively.

Block selection signals BS1 to BSk are provided corresponding to the respective memory block rows. Hereinafter, block selection signals BS1 to BSk are sometimes generally referred to as block selection signals BS. Block selection signal BS is activated in the memory block row that includes the selected memory cell.

Therefore, a specific memory block including the selected memory cell can be selected by selecting block selection signal BS and memory cell column (main bit line pair MBLP).

Figure 11:
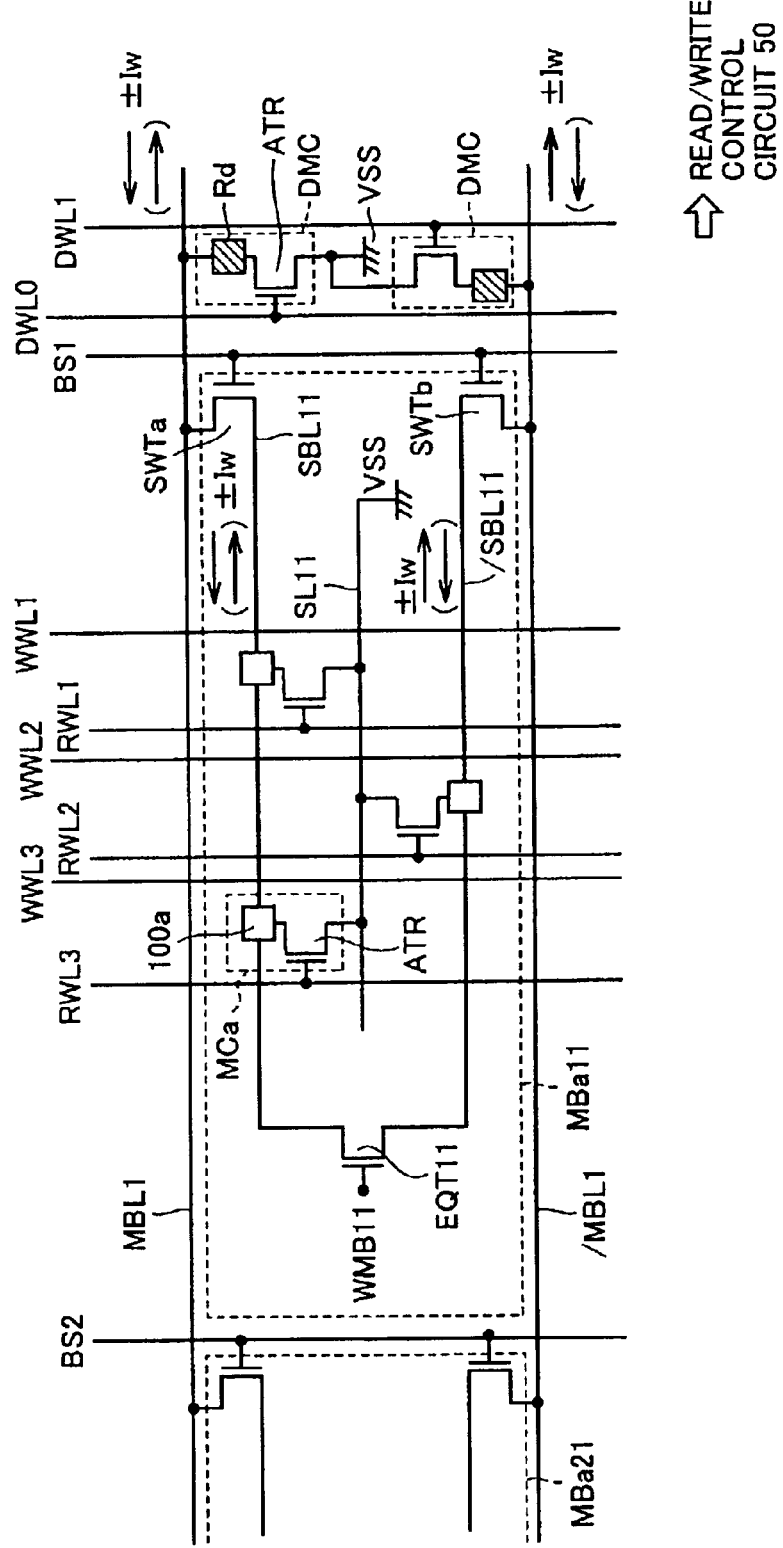
FIG. 11 is a circuit diagram showing the structure of a memory block in FIG. 10.

FIG. 11 is a circuit diagram of memory block MBa. Since each memory block MBa has the same structure, FIG. 11 exemplarily shows the structure of memory block MBa11. Sub bit lines SBL11, /SBL11 are provided in memory block MBa11.

Referring to FIG. 11, memory block MBa11 includes a memory cell group arranged in a plurality of rows (e.g., three rows) by one column.

Each memory block is shown to have three memory cell rows in the second embodiment and modifications thereof described below. However, the present invention is not limited to this. Each memory block may have any number of memory cell rows equal to or larger than two.

As in the structure of FIG. 6, MTJ memory cells MCa of each memory cell column are connected to either sub bit line SBL11 or /SBL11 in every other row. For example, MTJ memory cells MCa of the odd rows are coupled to sub bit line SBL11, and MTJ memory cells MCa of the even rows are coupled to sub bit line /SBL11.

Each memory block is shown to have MTJ memory cells MCa in the second embodiment and modifications thereof described below. However, MTJ memory cells MCa may be replaced with MTJ memory cells MCb or MCd of FIGS. 5 and 9.

MTJ memory cell MCa includes an access transistor ATR and a tunneling magneto-resistance element 100a. Access transistor ATR is electrically coupled between tunneling magneto-resistance element 100a and ground voltage VSS. Access transistor ATR has its gate coupled to read word line RWL of a corresponding memory cell row.

Since sub bit lines SBL11, /SBL11 are provided in every memory block MBa, the wiring length thereof is reduced. This suppresses the electric resistance value of each sub bit line SBL that is formed using intermediate layer 107 of tunneling magneto-resistance element 100a.

Memory block MBa11 further includes current switch transistors SWTa, SWTb and a short-circuit transistor EQT11.

Current switch transistor SWTa is electrically coupled between main bit line MBL1 and one end of sub bit line SBL11 (i.e., the end located closer to read/write control circuit 50). Similarly, current switch transistor SWTb is electrically coupled between main bit line /MBL1 and one end of sub bit line /SBL11 (i.e., the end located closer to read/write control circuit 50). Current switch transistors SWTa, SWTb receive a block selection signal BS1 at their gates.

Short-circuit transistor EQT11 electrically couples sub bit lines SBL11, /SBL11 to each other at the other ends (i.e., the ends located away from read/write control circuit 50) in response to a write selection signal WMB11.

Write selection signal WMB11 is activated to H level at least when block selection signal BS1 is activated in data write operation. Alternatively, write selection signal WMB11 may be activated to H level in response to activation of block selection signal BS1 and the column selection result. In other words, write selection signal WMB11 may be activated to H level when block selection signal BS1 is activated and the memory cell column corresponding to main bit line pair MBLP1 is selected in data write operation.

When memory block MBa11 is selected for data write operation, short-circuit transistor EQT11 and current switch transistors SWTa, SWTb are turned ON. Read/write control circuit 50 then switches the voltage polarities (power supply voltage VDD and ground voltage VSS) of main bit lines MBL1, /MBL1 according to write data DIN. As a result, a data write current ±Iw having a direction corresponding to the level of write data DIN can be supplied to sub bit lines SBL11, /SBL11 as a reciprocating current through short-circuit transistor EQT11. This simplifies the structure of read/write control circuit 50 serving as a supply source of data write current ±Iw.

Write word line WWL corresponding to the selected memory cell is then selectively activated to receive a data write current Ip. As a result, write data DIN can be written to the selected memory cell.

On the other hand, when memory block MBa11 is selected for data read operation, current switch transistors SWTa, STWb are turned ON, whereas short-circuit transistor EQT11 is turned OFF. As a result, sub bit lines SBL11, /SBL11 are electrically coupled to main bit lines MBL1, /MBL1, respectively.

In the second embodiment, so-called complementary data read operation is conducted using dummy memory cells DMC. For the complementary data read operation, a dummy memory cell DMC is provided for each main bit line MBL, /MBL. FIG. 11 exemplarily shows the dummy memory cells respectively corresponding to main bit lines MBL1, /MBL1.

Each dummy memory cell DMC includes an access transistor ATR and a dummy resistor Rd. The electric resistance value of dummy resistor Rd is equal to an intermediate value of the electric resistance values R1 and R0 of the MTJ memory cell (i.e., R1<Rd<R0). The electric resistance values R1 and R0 correspond to the storage data levels "1", "0", respectively.

The dummy memory cell corresponding to main bit line MBL1 is electrically coupled between ground voltage VSS and main bit line MBL1 in response to activation of a dummy word line DWL0. The dummy memory cell corresponding to main bit line /MBL1 is electrically coupled between main bit line /MBL1 and ground voltage VSS in response to activation of a dummy word line DWL1.

Dummy word lines DWL0, DWL1 are selectively activated depending on whether the selected memory cell is located in an odd row or even row. More specifically, when the selected memory cell is located in an odd row, that is, when the selected memory cell is electrically coupled to main bit line MBL1, dummy word line DWL1 is activated in order to electrically couple dummy memory cell DMC to main bit line /MBL1. On the other hand, when the selected memory cell is located in an even row, dummy word line DWL0 is activated in order to electrically couple dummy memory cell DMC to main bit line MBL1.

In data read operation, one of the selected memory cell and dummy memory cell DMC is electrically coupled to one of complementary main bit lines MBL1, /MBL1, and the other is coupled to the other main bit line. Accordingly, the storage data can be read from the selected memory cell by sensing the voltage difference between main bit lines MBL1 and /MBL1.

Sub bit line SBL, /SBL has a short wiring length and thus a low electric resistance value. Therefore, even when the MTJ memory cells having a two-layer storage node structure of the first embodiment are used for reduced power consumption in data write operation, the read operation speed will not be reduced.

First Modification of Second Embodiment

In the first modification of the second embodiment, the hierarchical sub bit line structure capable of efficiently supplying a data write current will be described.

Figure 12:
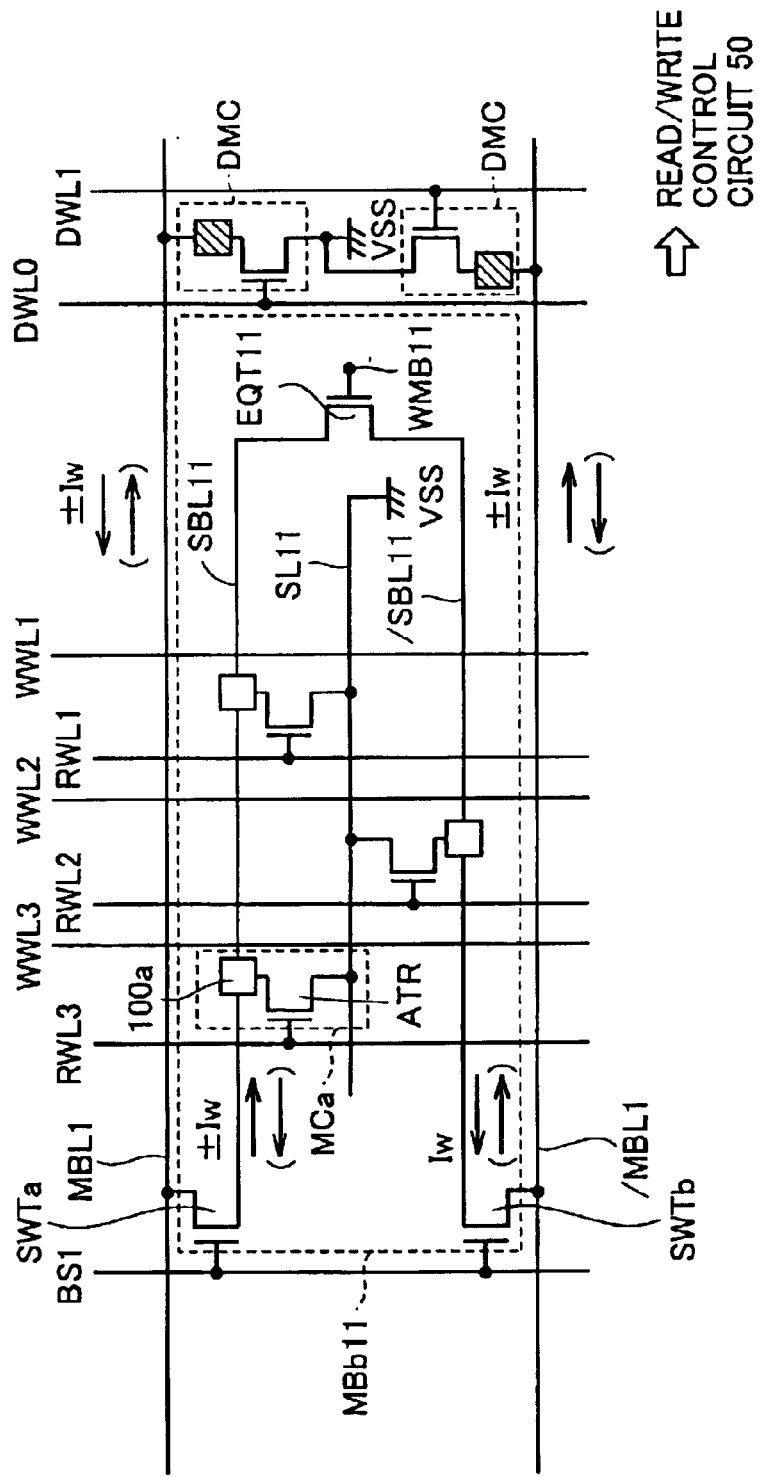
FIG. 12 is a circuit diagram showing the structure of a memory block according to a first modification of the second embodiment.

Referring to FIG. 12, according to the first modification of the second embodiment, memory blocks MBa11 to MBakm in memory array 10 of FIG. 10 are replaced with memory blocks MBb11 to MBbkm. Since memory blocks MBb11 to MBbkm have the same structure, FIG. 12 exemplarily shows the structure of memory block MBb11.

Memory block MBb11 is different from memory block MBa11 of FIG. 11 in the positions of short-circuit transistor EQT11 and current switch transistors SWTa, SWTb.

In memory block MBb11, short-circuit transistor EQT 11 connects sub bit lines SBL11, /SBL11 to each other at their respective one ends located closer to read/write control circuit 50. Similarly, current switch transistor SWTa is electrically coupled between the other end of sub bit line SBL11 located away from read/write control circuit 50 and main bit line MBL1. Current switch transistor SWTb is electrically coupled between the other end of sub bit line /SBL11 located away from read/write control circuit 50 and main bit line /MBL1.

With the above structure, a data write current ±Iw flows through main bit line MBL1 and sub bit line SBL11 in the opposite directions in data write operation. Similarly, a data write current ±Iw flows through main bit line /MBL1 and sub bit line /SBL11 in the opposite directions.

Hereinafter, how a data write magnetic field is generated in the memory block of the first modification of the second embodiment will be described with reference to FIGS. 13A and 13B.

Figure 13A:
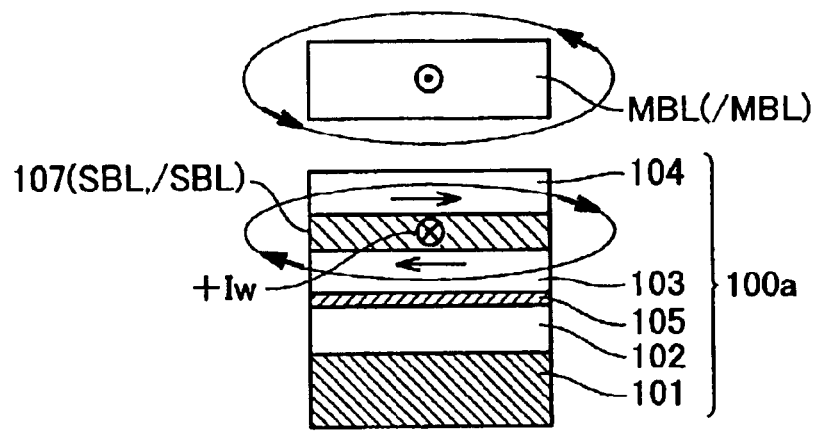
FIGS. 13A and 13B are conceptual diagrams illustrating how a data write magnetic field is generated in the memory block according to the first modification of the second embodiment.

FIG. 13A shows a data write magnetic field generated when a data write current +Iw of the positive direction is supplied to sub bit line SBL (/SBL). In this case, a data write current is supplied to main bit line MBL (/MBL) in the opposite direction. Therefore, the data write magnetic fields respectively generated by the data write currents flowing through sub bit line SBL (/SBL) and main bit line MBL (/MBL) interact with each other in a constructive manner in free magnetic layer 104. The magnetic flux generated by magnetization of one free magnetic layer 104 serves as magnetic flux for magnetizing the other free magnetic layer 103. Therefore, the switching magnetic field strength can be generated with a smaller data write current.

Figure 13B:
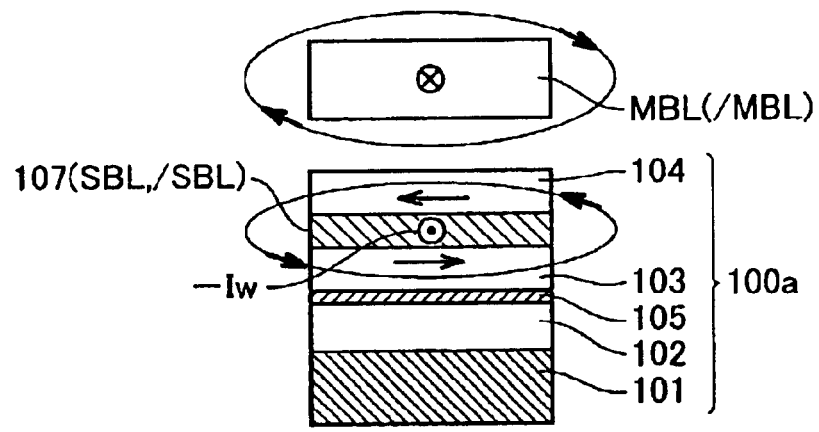

FIG. 13B shows a data write magnetic field generated when a data write current −Iw of the negative direction is supplied to sub bit line SBL (/SBL). As in the case of FIG. 13A, the data write magnetic fields applied to free magnetic layer 104 interact with each other in a constructive manner. Therefore, data write operation to the MTJ memory cell can be conducted with a smaller data write current.

Referring back to FIG. 12, since the structure of memory block MBb11 is otherwise the same as that of memory block MBa11 of FIG. 11, detailed description thereof will not be repeated. Data read operation in the memory block of the first modification of the second embodiment can be conducted in the same manner as that in memory block MBa of the second embodiment.

Second Modification of Second Embodiment

In the second modification of the second embodiment, a memory array in which each main bit line corresponds to a plurality of memory cell columns will be described.

Figure 14:
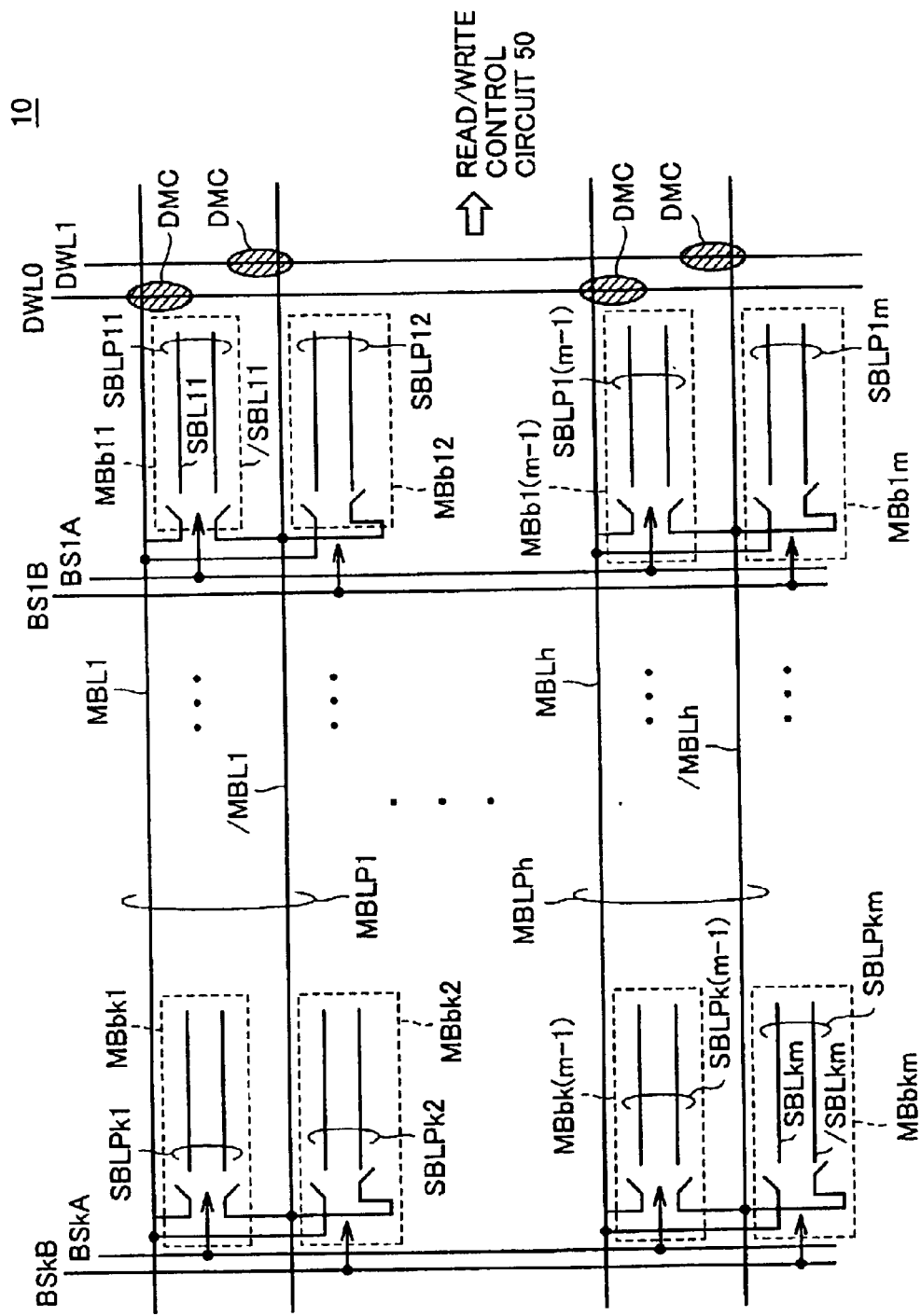
FIG. 14 schematically shows the structure of a memory array according to a second modification of the second embodiment.

Referring to FIG. 14, in the memory array of the second modification of the second embodiment, sub bit lines SBL, /SBL are independently provided in each memory block MBb11 to MBbkm, in each memory cell column. Memory blocks MBb11 to MBbkm are arranged in a matrix. Every two sub bit lines SBL, /SBL form a sub bit line pair SBLP. Each main bit line pair MBLP corresponds to a plurality of memory cell columns. In the example of FIG. 12, each main bit line pair MBLP corresponds to two memory cell columns. Therefore, h main bit line pairs MBLP1 to MBLPh are provided in the entire memory array 10 (where h is an integer equal to m/2). Since a dummy memory cell DMC is provided for each main bit line MBL, /MBL in the same manner as that in FIG. 11, detailed description thereof will not be repeated.

Main bit line pair MBLP1 is shared by memory blocks MBb11 to MBbk1 and memory blocks MBb12 to MBbk2.

Block selection signal BS1 applied to the gates of current switch transistors SWTa, SWTb in FIG. 12 is divided into a plurality of block selection signals in order to select one of a plurality of memory cells corresponding to the same main bit line pair.

In the example of FIG. 14, block selection signal BS1 is divided into two block selection signals BS1A, BS1B. Block selection signal BS1A is activated when a memory block of the first row is selected and the selected memory cell is located in an odd column. On the other hand, block selection signal BS1B is activated when a memory block of the first row is selected and the selected memory cell is located in an even column. In other words, one of block selection signals BS1A, BS1B corresponding to the same memory block row is activated according to whether the selected memory cell is located in an even column or odd column.

Block selection signals BS1A to BSkA are respectively transmitted to memory blocks MBb11 to MBbk1, and block selection signals BS1B to BSkB are respectively transmitted to memory blocks MBb12 to MBbk2. A specific memory block including the selected memory cell can be designated by combination of main bit line pair MBLP and block selection signal BL1A, BS1B to BSka, BSkB.

The above structure reduces the number of main bit lines required for the entire memory array 10. As a result, a wiring pitch of the main bit lines is assured.

Accordingly, a sufficient wiring width, that is, a sufficient cross-sectional area, is assured for the main bit lines that receive a relatively large current in data write operation, enabling reduction in current density. This suppresses electromigration in the main bit line, enabling improvement in operation reliability of the MRAM device.

Since the number of main bit lines is reduced, the number of dummy memory cells is also reduced. This enables reduction in chip area.

Third Modification of Second Embodiment

In the following modifications of the second embodiment, a memory array in which each memory block has an open bit line structure will be described.

Figure 15:
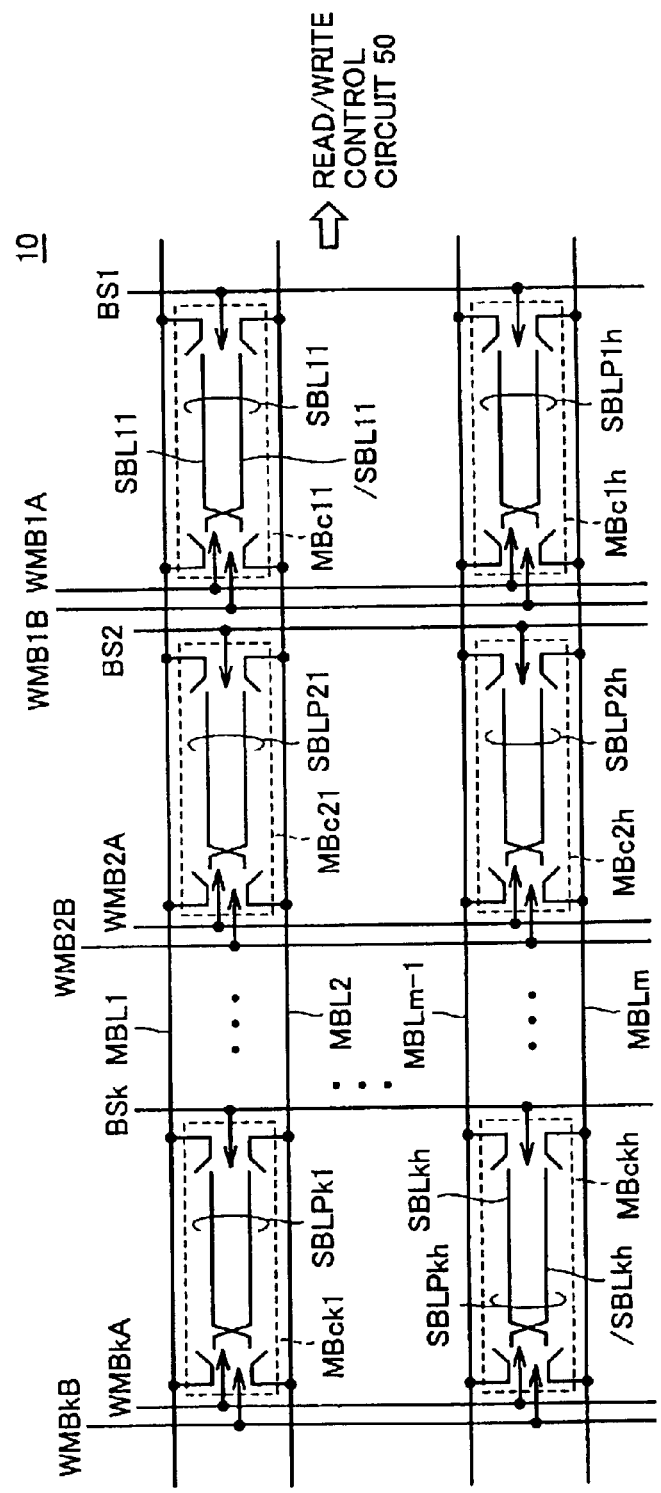
FIG. 15 schematically shows the structure of a memory array according to a third modification of the second embodiment.

Referring to FIG. 15, in memory array 10 of the third modification of the second embodiment, memory blocks MBc11 to MBckh are arranged in k rows by h columns. Each memory block MBc11 to MBckh includes two memory cell columns. Accordingly, provided that the number of memory cell rows and the number of memory cell columns are the same as those of the second embodiment, the number of memory blocks is reduced by half from the second embodiment. Hereinafter, memory blocks MBc11 to MBchk are sometimes generally referred to as memory blocks MBc.

Main bit lines MBL1 to MBLm are arranged respectively corresponding to the memory cell columns. In other words, each memory block MBc corresponds to a pair of main bit lines MBL.

Write selection signals WMB1A, WMB1B to WMBka, WMBkB are provided in addition to block selection signals BS1 to BSk of FIG. 10. Write selection signal WMB1A, WMB1B to WMBkA, WMBkB is selectively activated according to the memory block row of the selected memory cell and whether the selected memory cell is located in an odd column or even column. For example, write selection signal WMB1A is activated when the selected memory cell corresponds to the first memory block row and is located in an odd column. Similarly, write selection signal WMB1B is activated when the selected memory cell corresponds to the first memory block row and is located in an even column.

Figure 16:
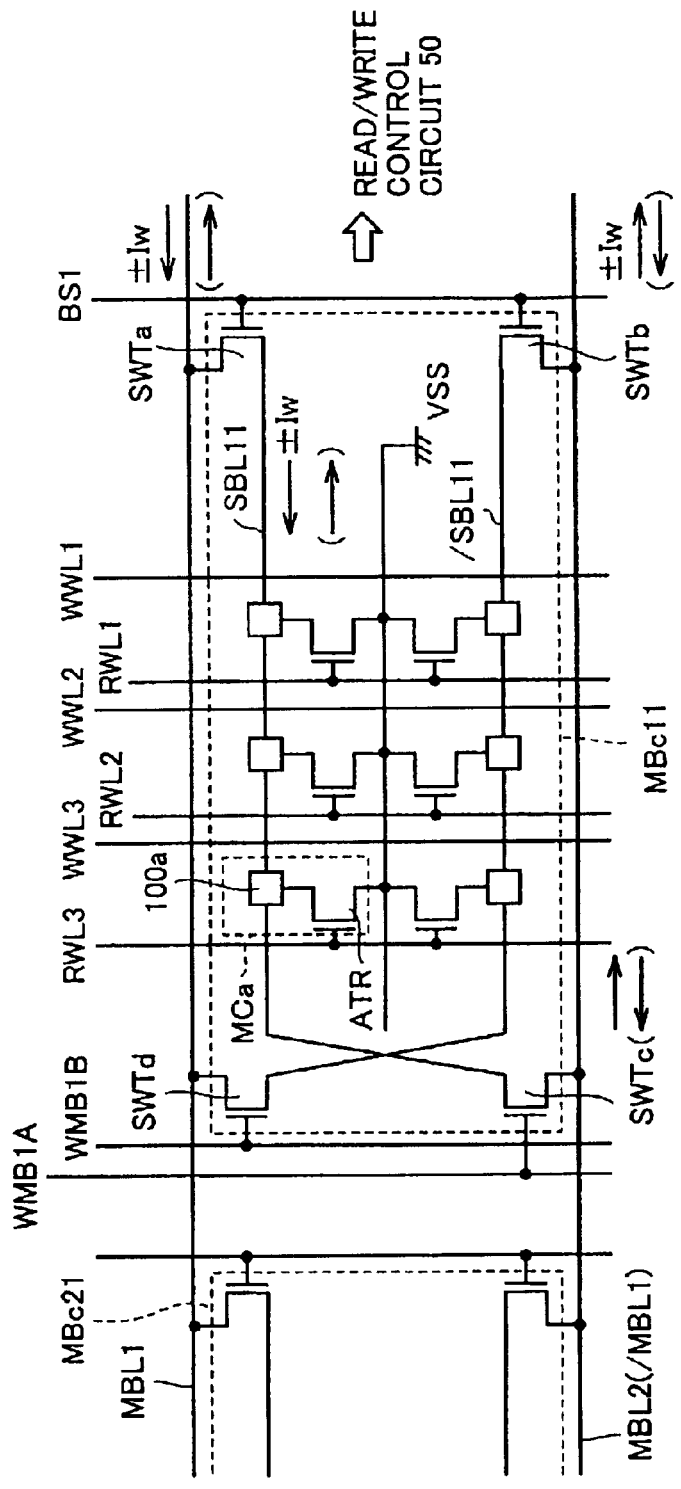
FIG. 16 is a circuit diagram illustrating the structure of a memory block in FIG. 15.

FIG. 16 is a circuit diagram of memory block MBc of FIG. 15. Since memory blocks MBc11 to MBckh have the same structure, FIG. 16 exemplarily shows the structure of memory block MBc11.

Referring to FIG. 16, memory block MBc11 includes memory cells arranged in three rows by two columns. Sub bit lines SBL11, /SBL11 are provided in memory block MBc11. In each memory cell row, an MTJ memory cell MCa is provided for each sub bit line SBL11, /SBL11.

Memory block MBc11 further includes current switch transistors SWTa, SWTb, SWTc, SWTd.

Current switch transistor SWTa is electrically coupled between main bit line MBL1 and one end of sub bit line SBL11 that is located closer to read/write control circuit 50. Current switch transistor SWTb is electrically coupled between main bit line MBL2(/MBL1) and one end of sub bit line /SBL11 that is located closer to read/write control circuit 50. Current switch transistors SWTa, SWTb receive block selection signal BS1 at their gates.

Current switch transistor SWTc is electrically coupled between main bit line MBL2 and the other end of sub bit line SBL11 that is located away from read/write control circuit 50. Current switch transistor SWTd is electrically coupled between main bit line MBL1 and the other end of sub bit line /SBL11 that is located away from read/write control circuit 50. Current switch transistors SWTc, SWTd receive write selection signals WMB1A, WMB1B at their gates, respectively.

Hereinafter, data write operation in memory block MBc11 will be described.

When a memory cell connected to sub bit line SBL11 is selected for data write operation, block selection signal BS1 and write selection signal WMB1A are activated to H level, and current switch transistors SWTa, SWTb, SWTc are turned ON. Current switch transistor SWTd is turned OFF. As a result, a current path is formed by main bit line MBL1, current switch transistor SWTa, sub bit line SBL11, current switch transistor SWTc, and main bit line MBL2 (/MBL1).

Similarly, when a memory cell connected to sub bit line /SBL11 is selected for data write operation, block selection signal BS1 and write selection signal WMB1B are activated to H level, and current switch transistors SWTa, SWTb, SWTd are turned ON. Current switch transistor SWTc is turned OFF. As a result, a current path is formed by main bit line MBL1, current switch transistor SWTd, sub bit line /SBL11, current switch transistor SWTb, and main bit line MBL2 (/MBL1).

Read/write control circuit 50 sets the voltages of the pair of main bit lines MBL1, MBL2 corresponding to memory block MBc11 in the same manner as that of the voltages of complementary main bit lines MBL1, /MBL1 in FIG. 11. As a result, a data write current ±Iw can be supplied to sub bit line SBL11 or /SBL11 in the direction according to the write data level DIN.

On the other hand, in data read operation, current switch transistors SWTc, SWTd are turned OFF, and current switch transistors SWTa, SWTb are turned ON. Accordingly, the memory cells of the selected memory cell row are electrically coupled to main bit lines MBL1, MBL2, respectively. As a result, the storage data can be read from the selected memory cell by sensing the voltage on main bit line MBL of the selected memory cell column.

With the above structure, the same effects as those of the second embodiment can be obtained in data read and write operations even when sub bit lines and MTJ memory cells are arranged in each memory block having the open bit line structure.

Fourth Modification of Second Embodiment

Figure 17:
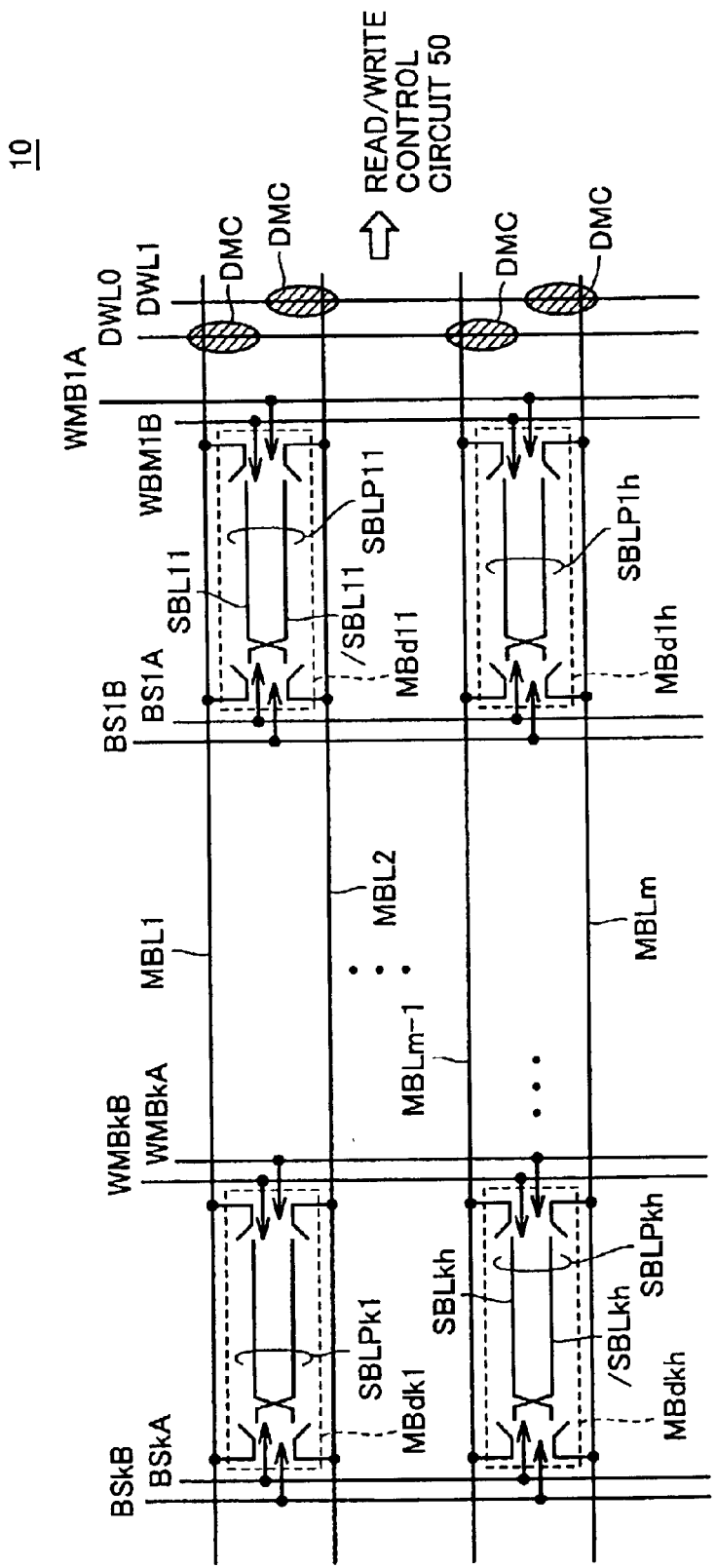
FIG. 17 is a block diagram showing the structure of a memory array according to a fourth modification of the second embodiment.

Referring to FIG. 17, the memory array of the fourth modification of the second embodiment is different from that of the third modification of the second embodiment in FIG. 15 in that memory blocks MBc11 to MBckh are replaced with memory blocks MBd11 to MBdkh. Hereinafter, memory blocks MBd11 to MBdkh are sometimes generally referred to as memory block MBd.

Block selection signals BS1 to BSk are divided into block selection signals BS1A, BS1B to BSkA, BSkB in order to reflect the column selection result. Since block selection signals BS1A, BS1B to BSkA, BSkB are set in the same manner as that described before, detailed description thereof will not be repeated.

Figure 18:
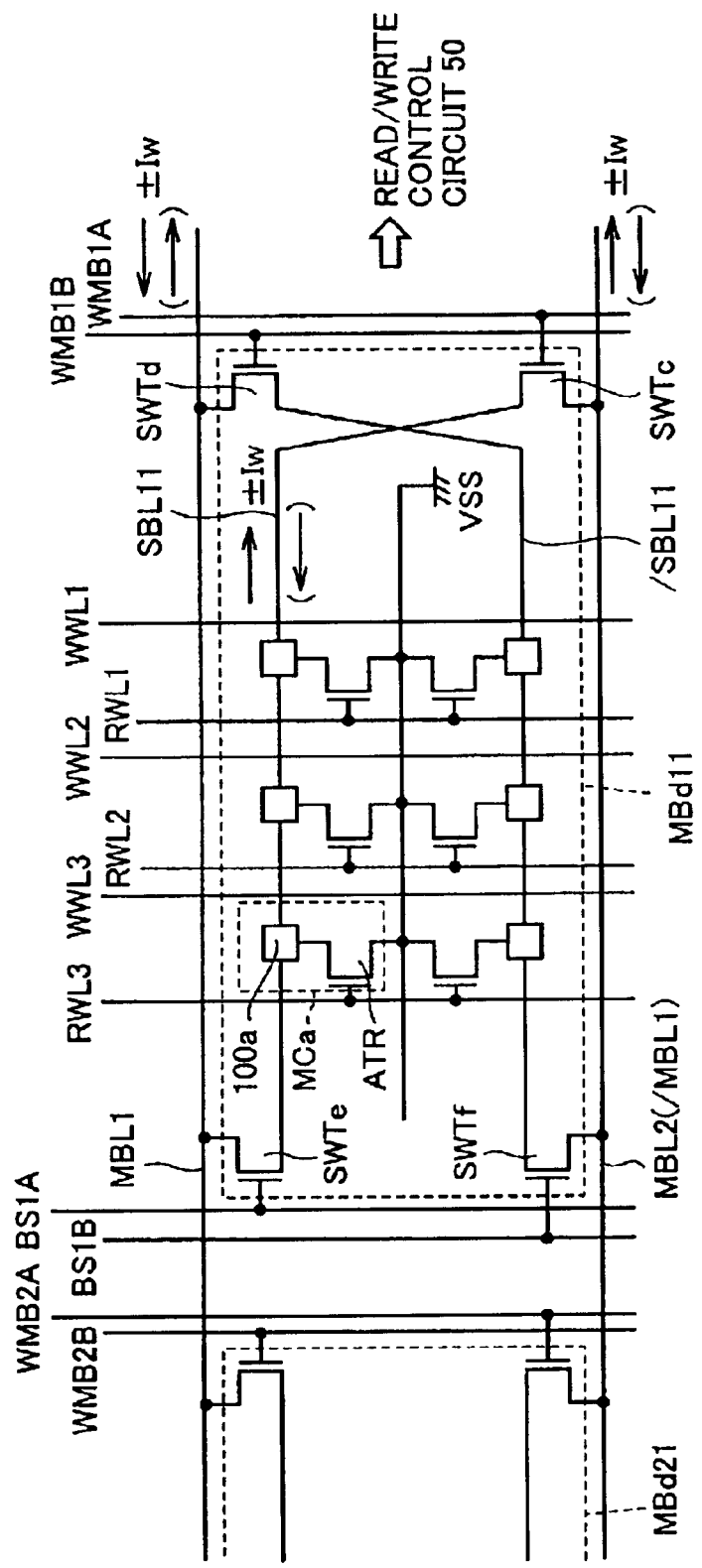
FIG. 18 is a circuit diagram illustrating the structure of a memory block in FIG. 17.

FIG. 18 is a circuit diagram of memory block MBd in FIG. 17. Since memory blocks MBd11 to MBdkh have the same structure, FIG. 18 exemplarily shows the structure of memory block MBd11.

Referring to FIG. 18, memory block MBd11 is different from memory block MBc11 of FIG. 16 in that memory block MBd11 includes current switch transistors SWTc, SWTd, SWTe, SWTf.

Current switch transistor SWTc is electrically coupled between main bit line MBL2 and one end of sub bit line SBL11 that is located closer to read/write control circuit 50. Current switch transistor SWTd is electrically coupled between main bit line MBL1 and one end of sub bit line /SBL11 that is located closer to read/write control circuit 50. Current switch transistors SWTc, SWTd receive write selection signals WMB1A, WMB1B at their gates, respectively.

Current switch transistor SWTe is electrically coupled between main bit line MBL1 and the other end of sub bit line SBL11 that is located away from read/write control circuit 50. Current switch transistor SWTf is electrically coupled between main bit line MBL2 and the other end of sub bit line /SBL11 that is located away from read/write control circuit 50. Current switch transistors SWTe, SWTf receive block selection signals BS1A, BS1B at their gates, respectively.

Hereinafter, data write operation in memory block MBd11 will be described.

When a memory cell connected to sub bit line SBL11 is selected for data write operation, block selection signals BS1A and write selection signal WMB1A are activated, and current switch transistors SWTc, SWTe are turned ON. Current switch transistors SWTd, SWTf are turned OFF. As a result, a data write current ±Iw can be supplied to a current path formed by main bit line MBL1, current switch transistor SWTe, sub bit line SBL11, current switch transistor SWTc, and main bit line MBL2 (/MBL1).

According to the fourth modification of the second embodiment, data write magnetic fields are generated by data write current ±Iw flowing through main bit line MBL1 and sub bit line SBL11 in the opposite directions. These data write magnetic fields are applied to the selected memory cell.

In the illustrated example, data write magnetic fields are generated by data write current ±Iw flowing through main bit line MBL2 (/MBL1) and sub bit line /SBL11 in the opposite directions. These data write magnetic fields are applied to the selected memory cell.

Since the voltages on two main bit lines MBL1, MBL2 of memory block MBd11 are set in the same manner as that in memory block BMc11 of FIG. 16, detailed description thereof will not be repeated.

In the data write operation according to the fourth modification of the second embodiment, the selected memory cell is subjected to the data write magnetic fields that interact with each other in a constructive manner in free magnetic layer 104 of tunneling magneto-resistance element 100a, as in the case of FIG. 13.

As a result, in addition to the effects of the third modification of the second embodiment, the switching magnetic field strength can be generated in the free magnetic layer of the tunneling magneto-resistance element by a smaller data write current. This enables reduction in power consumption.

In data read operation, either block selection signal BS1A or BS1B is selectively activated according to whether the selected memory cell corresponds to sub bit line SBL11 or /SBL11. Write selection signals WMB1A, WMB1B are inactivated in data read operation.

Accordingly, in data read operation, current switch transistors SWTc, SWTd are turned OFF. Current switch transistor SWTe, SWTf is selectively turned ON according to whether the selected memory cell is located in an odd column or even column.

With the above structure, the selected memory cell is electrically coupled to one of the two main bit lines corresponding to the memory block of the selected memory cell (i.e., the main bit line corresponding to the selected memory cell) through sub bit line SBL or /SBL.

Since no MTJ memory cell is coupled to the other main bit line, dummy memory cell DMC is coupled thereto for the complementary data read operation, as in the second embodiment. As a result, a read operation margin is improved. In other words, as shown in FIG. 17, a dummy memory cell that is selected by dummy word line DWL0 is provided for one of adjacent two main bit lines, and a dummy memory cell that is selected by dummy word line DWL1 is provided for the other main bit line in order to conduct the complementary data read operation.

Fifth Modification of Second Embodiment

In the fifth modification of the second embodiment, each main bit line MBL is shared by a plurality of memory block columns.

Figure 19:
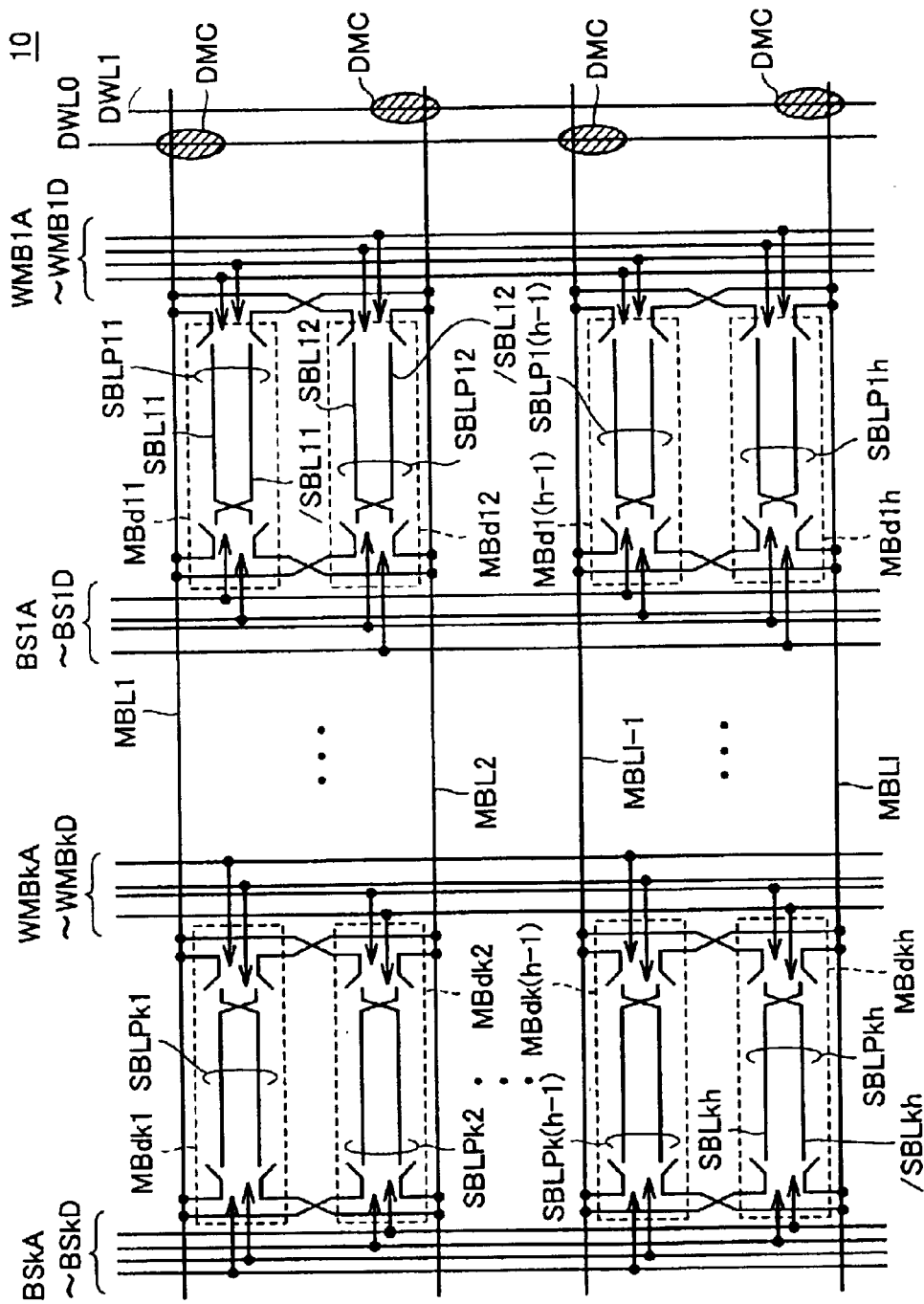
FIG. 19 is a block diagram showing the structure of a memory array 10 according to a fifth modification of the second embodiment.

In a memory array 10 of FIG. 19, each pair of main bit lines MBL is shared by two memory block columns. In other words, two main bit lines MBL are provided for four memory cell columns.

Block selection signals BS1 to BLk of FIG. 15 are therefore divided into block selection signals BS1A, BS1B, BS1C, BS1D to BSA, BSkB, BSkC, BSkD indicating the column selection result. The block selection signal indicates which one of the four memory cell columns corresponding to a respective pair of main bit lines is selected.

Similarly, the write selection signals that are activated in data write operation are divided into write selection signals WMB1A, WMB1B, WMB1C, WMB1D to WMBkA, WMBkB, WMBkC, WMBkD.

For example, when a memory cell corresponding to sub bit line SBL12 is selected for data write operation in memory block MBd12, block selection signals BS1C and write selection signal WMB1C are activated. On the other hand, when a memory cell corresponding to sub bit line /SBL12 is selected for data read operation, only block selection signal BS1D is activated.

The block selection signal and the write selection signal which are applied to the gates of current switch transistors SWTc, SWTd, SWTe, SWTf in FIG. 18 are replaced with the block selection signal and the write selection signal of FIG. 19 which reflect the column selection result (that is, which indicate which one of the four memory cell columns is selected). Since memory blocks MBd11 to MBdkm have otherwise the same structure as that of FIG. 18, detailed description thereof will not be repeated.

With the above structure, the number of main bit lines MBL in the entire memory array 10 can further be reduced to l (where l is an integer defined by h/2=m/4). In other words, the required number of main bit lines is half the number of memory cell columns. As a result, the wiring pitch and wiring width (i.e., cross-sectional area) of the main bit lines are assured, whereby current density is suppressed. This prevents electromigration and the like, enabling improvement in operation stability of the MRAM device.

Third Embodiment

In the third embodiment, technology of applying the hierarchical bit line structure in the second embodiment to an MTJ memory cell having a structure other than the two-layer storage node structure in the first embodiment will be described.

Figure 20:
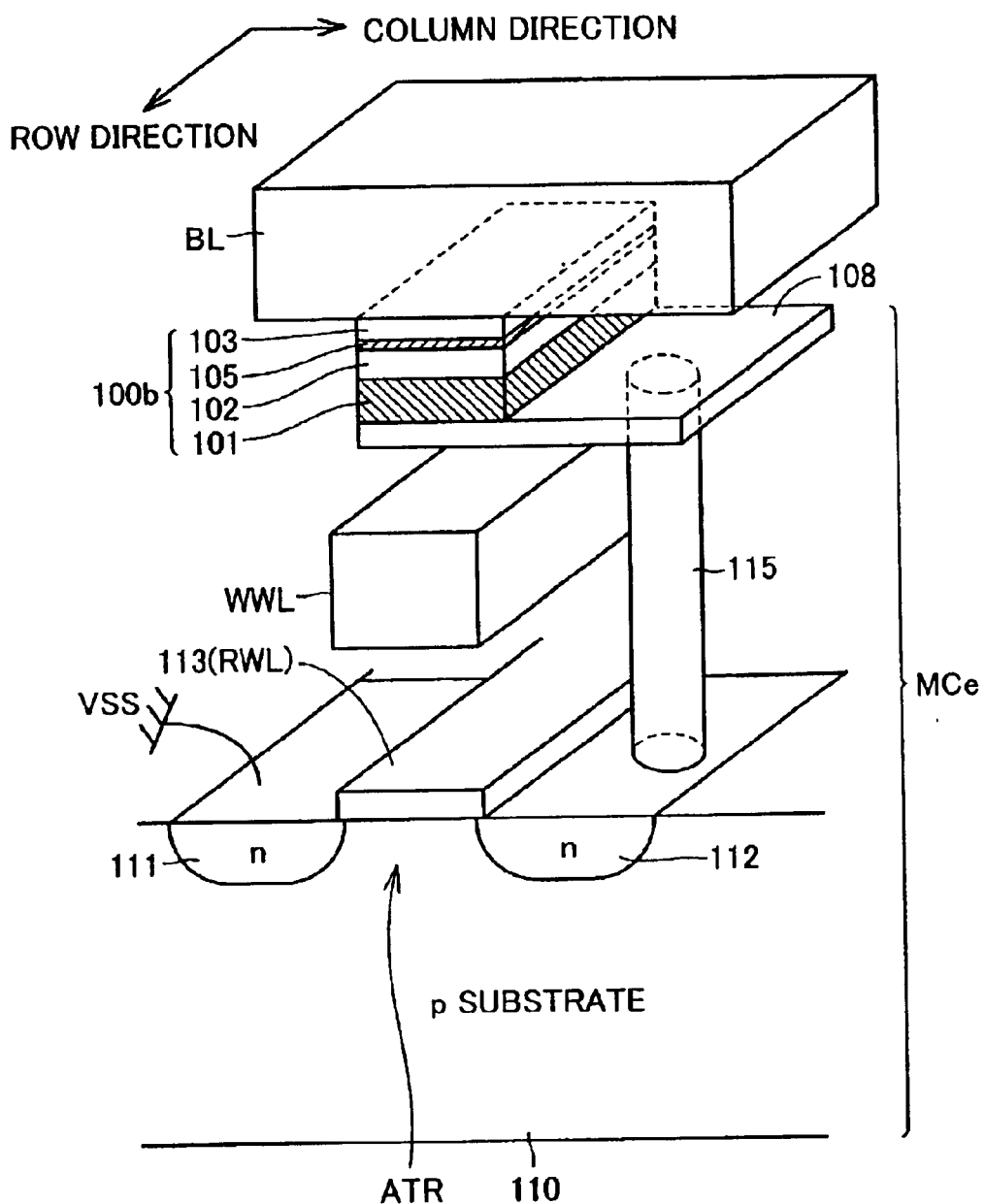
FIG. 20 shows the structure of an MTJ memory cell having a single-layer storage node structure.
Figure 48:
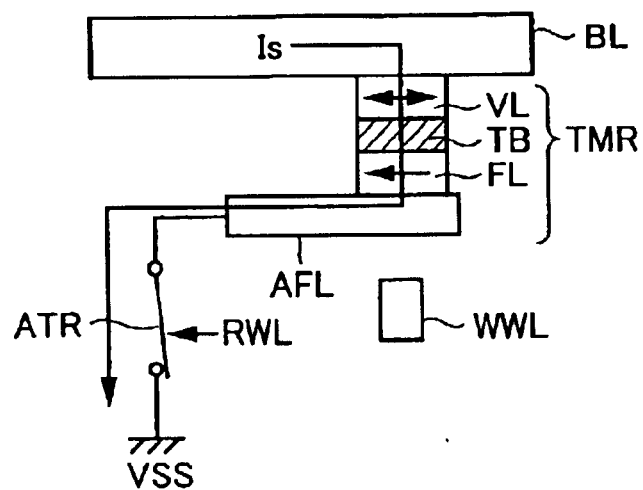
FIG. 48 is a conceptual diagram illustrating the structure of an MTJ memory cell and data read operation therefrom.
Figure 49:
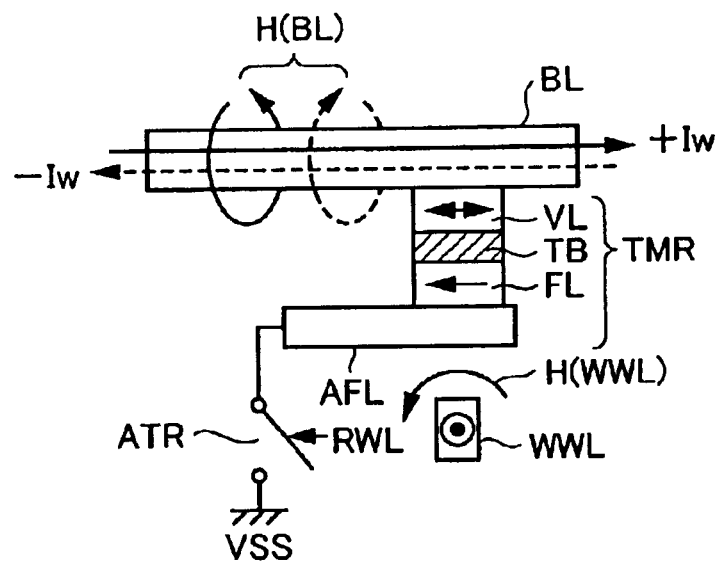
FIG. 49 is a conceptual diagram illustrating data write operation to an MTJ memory cell.

Referring to FIG. 20, an MTJ memory cell MCe having a single-layer storage node structure includes a tunneling magneto-resistance element 100b and an access transistor ATR. Tunneling magneto-resistance element 100b includes an antiferromagnetic material layer 101, a fixed magnetic layer 102, a free magnetic layer 103, and a tunneling barrier 105. Tunneling magneto-resistance element 100b has the same structure as that of the conventional tunneling magneto-resistance element TMR in FIGS. 48 and 49. MTJ memory cell MCe has a single free magnetic layer corresponding to a storage node.

Since access transistor ATR has the same structure as that of MTJ memory cell MCa of FIG. 3, detailed description thereof will not be repeated. Access transistor ATR is electrically coupled to tunneling magneto-resistance element 100b through barrier metal 108 and via hole 115.

Free magnetic layer 103 is electrically coupled to bit line BL. Bit line BL is formed in a metal wiring layer and extends in the column direction. Write word line WWL is formed in another metal wiring layer and extends in the row direction. A data write magnetic field for changing the magnetization direction of free magnetic layer 103 is generated according to combination of the data write magnetic fields respectively generated by a data write current Ip flowing through write word line WWL and a data write current ±Iw flowing through bit line BL.

Figure 21:
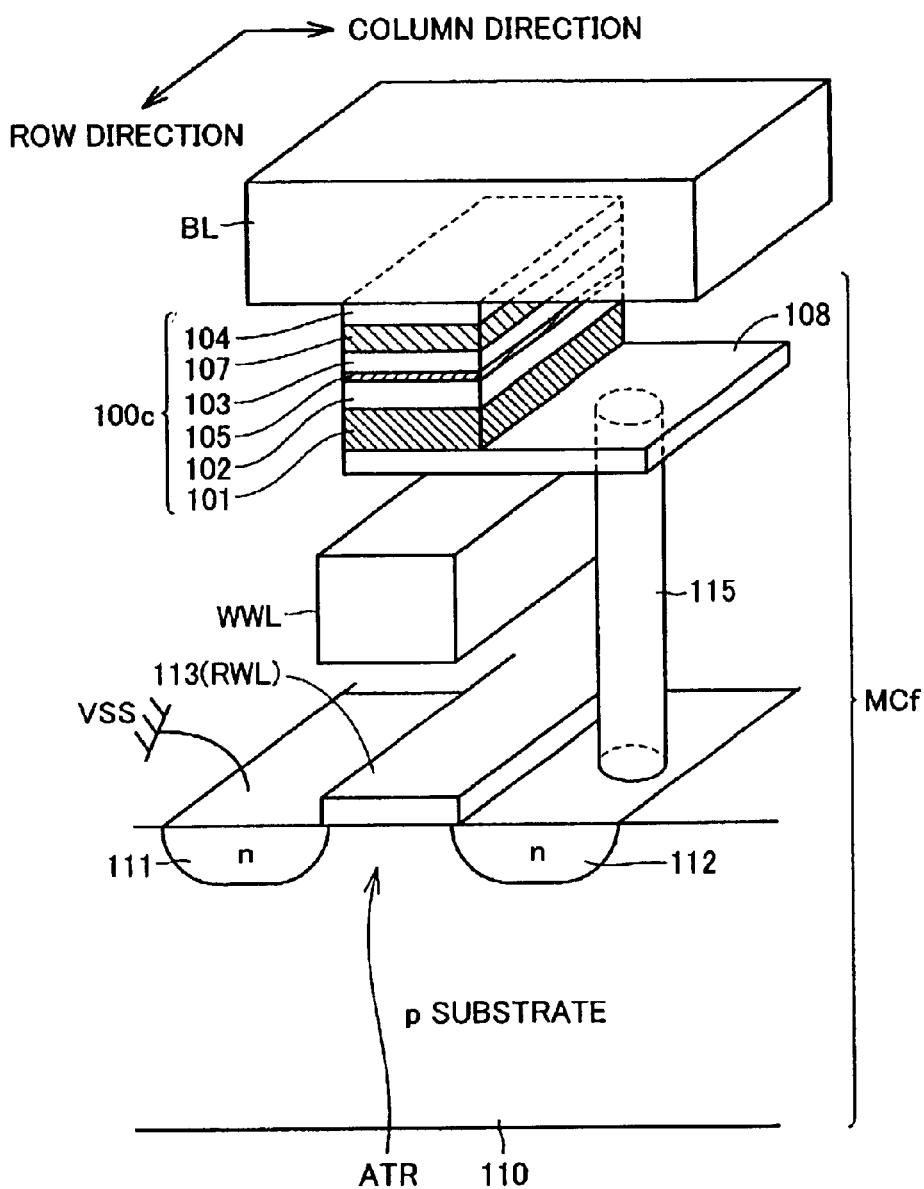
FIG. 21 shows the structure of a common MTJ memory cell having a two-layer storage node structure.

Referring to FIG. 21, a memory cell MCf having a two-layer storage node structure includes a tunneling magneto-resistance element 100c and an access transistor ATR.

Tunneling magneto-resistance element 100c includes an antiferromagnetic material layer 101, a fixed magnetic layer 102, free magnetic layers 103, 104, a non-magnetic intermediate layer 107 formed between free magnetic layers 103, 104, and a tunneling barrier 105.

Tunneling magneto-resistance element 100c has the same structure as that of the conventional tunneling magneto-resistance element of FIG. 51.

Since access transistor ATR has the same structure as that in MTJ memory cell MCa of FIG. 3, detailed description thereof will not be repeated. Access transistor ATR is electrically coupled to tunneling magneto-resistance element 100c through barrier metal 108 and via hole 115.

Figure 52:
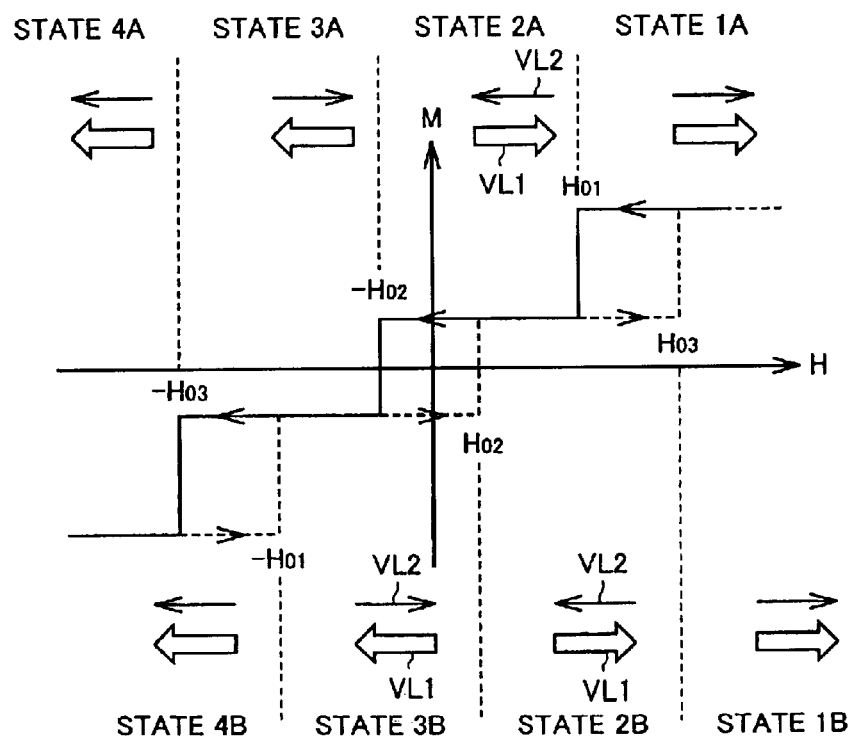
FIG. 52 is a hysteresis diagram illustrating magnetization in the tunneling magneto-resistance element in FIG. 51.
Figure 53:
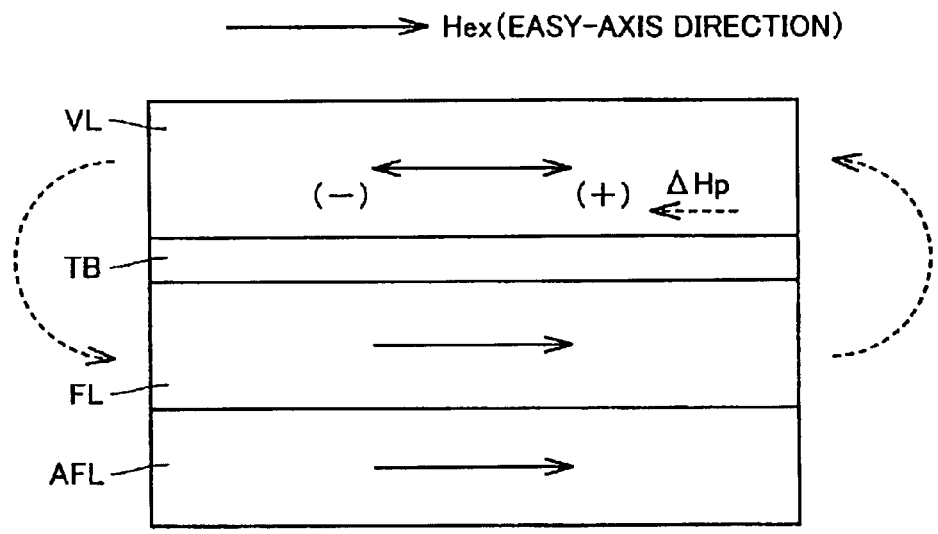
FIG. 53 is a conceptual diagram illustrating non-uniformity of magnetization characteristics in an MTJ memory cell having a single-layer storage node structure.
Figure 54:
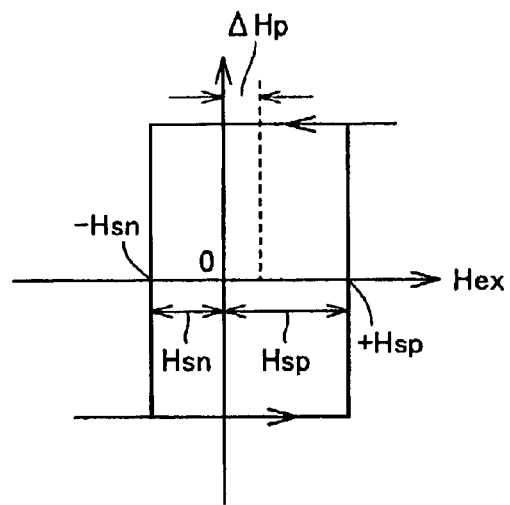
FIG. 54 is a hysteresis diagram illustrating magnetization characteristics in a free magnetic layer in FIG. 53.
Figure 55:
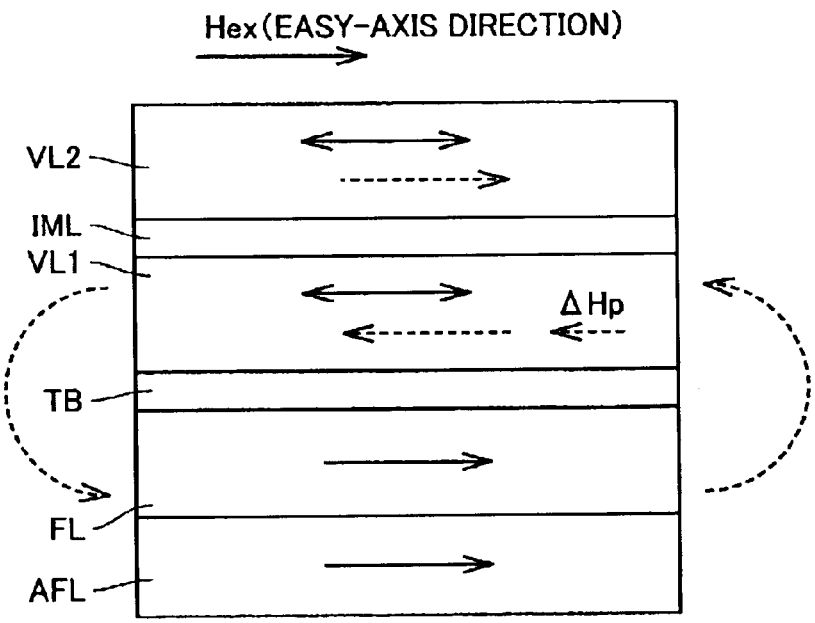
FIG. 55 is a conceptual diagram illustrating non-uniformity of magnetization characteristics in an MTJ memory cell having a two-layer storage node structure.
Figure 56:
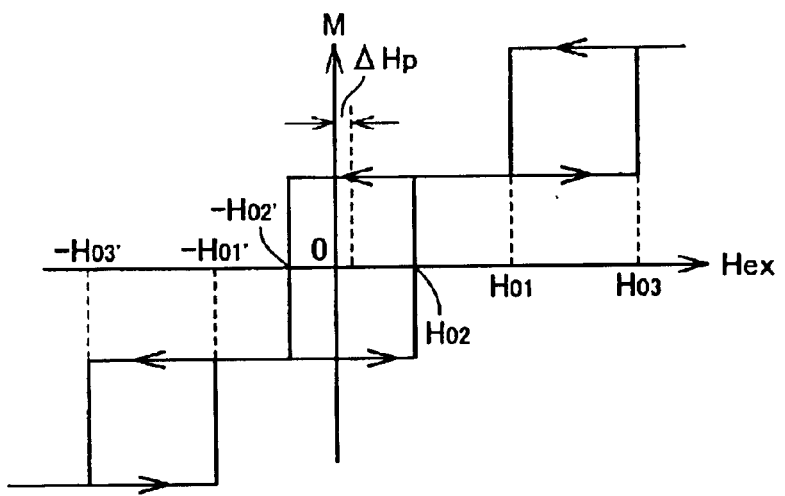
FIG. 56 is a hysteresis diagram illustrating magnetization characteristics in free magnetic layers in FIG. 55.

Data write operation to memory cell MCf is conducted in the same manner as that described in the "Description of the Background Art" in connection with FIG. 52.

In the third embodiment, the hierarchical bit line structure is applied to the memory array including MTJ memory cells MCe or MCf shown in FIGS. 20 and 21. Each memory block is shown to include MTJ memory cells MCe in the third embodiment and modifications thereof. However, each memory block may alternatively include MTJ memory cells MCf instead of MTJ memory cells MCe.

Figure 22:
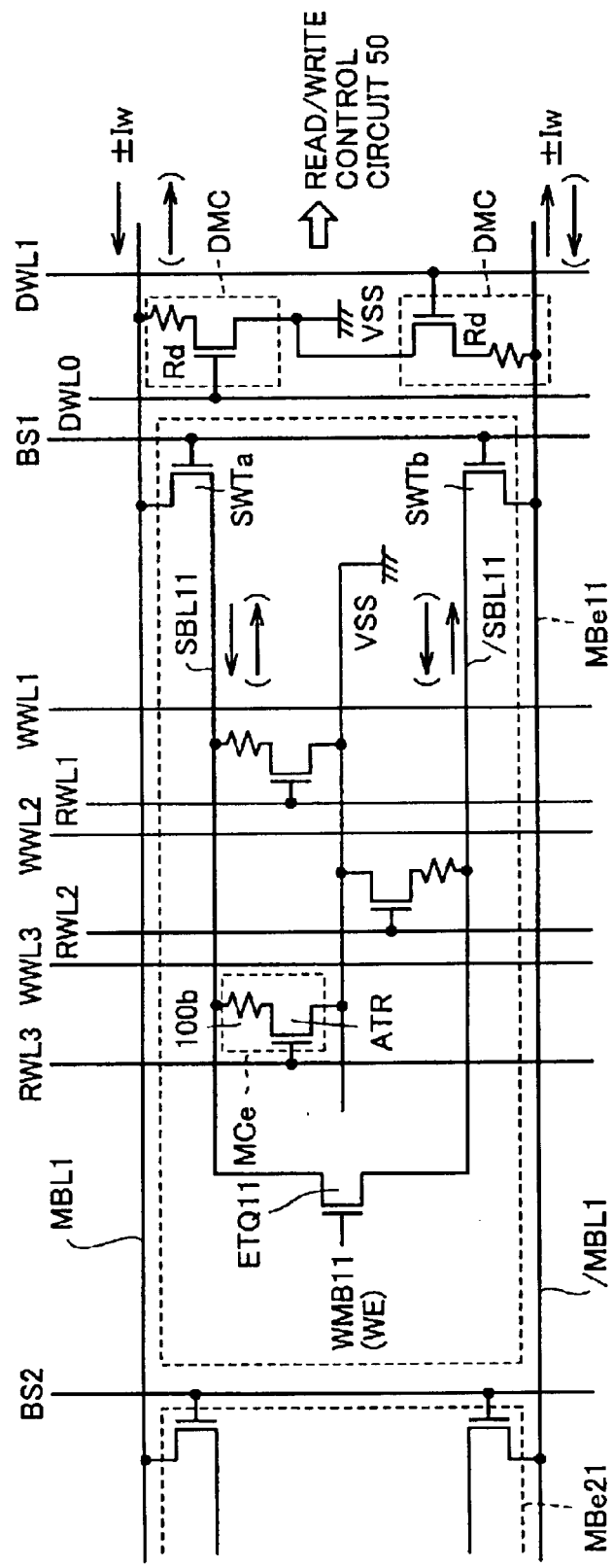
FIG. 22 is a circuit diagram showing the structure of a memory block according to a third embodiment of the present invention.

FIG. 22 is a circuit diagram of a memory block according to the third embodiment.

In the third embodiment, memory blocks MBa11 to MBakm of memory array 10 in FIG. 10 are replaced with memory blocks MBe11 to MBekm. Since memory blocks MBe11 to MBekm have the same structure, FIG. 22 exemplarily shows the structure of memory block MBe11. Hereinafter, memory blocks MBe11 to MBekm are sometimes generally referred to as memory blocks MBe.

Memory block MBe11 of FIG. 22 is different from memory block MBa11 of FIG. 11 in that MTJ memory cells MCa are replaced with MTJ memory cells MCe. Read and write operations from and to MTJ memory cell MCf are conducted in the same manner as that described in connection with FIG. 11.

Note that, in the third embodiment and modifications thereof, each memory block is shown to have three memory cell rows. However, the present invention is not limited to this. Each memory block may have any number of memory cell rows equal to or larger than two.

By applying the hierarchical bit line structure, the same effects as those of the second embodiment can be obtained even for the memory array including the conventional MTJ memory cells.

First Modification of Third Embodiment

Figure 23:
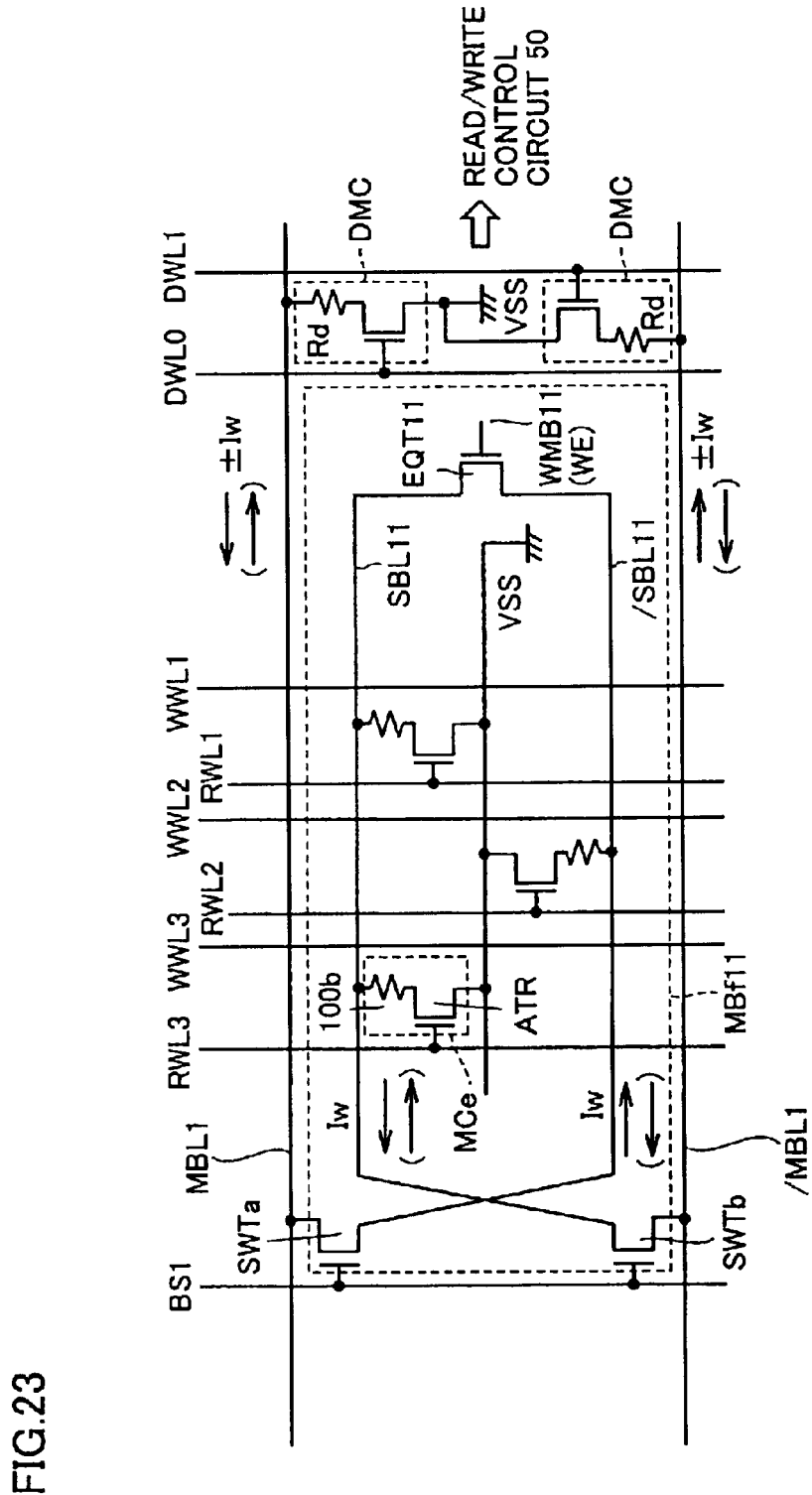
FIG. 23 is a circuit diagram showing the structure of a memory block according to a first modification of the third embodiment.

Referring to FIG. 23, in the first modification of the third embodiment, memory blocks MBa11 to MBakm in memory array 10 of FIG. 10 are replaced with memory blocks MBf11 to MBfkm. Since memory blocks MBf11 to MBfkm have the same structure, FIG. 23 exemplarily shows the structure of memory block MBf11. Hereinafter, memory blocks MBf11 to MBfkm are sometimes generally referred to as memory blocks MBf.

Memory block MBf11 of the first modification of the third embodiment is different from memory block MBb11 of FIG. 12 in that current switch transistor SWTa is electrically coupled between main bit line MBL1 and one end of sub bit line /SBL11 that is located away from read/write control circuit 50, and in that current switch transistor SWTb is electrically coupled between main bit line /MBL1 and one end of sub bit line SBL11 that is located away from read/write control circuit 50. Moreover, memory cells MCa are replaced with memory cells MCe.

With the above structure, a data write current ±Iw for data write operation is turned back by short-circuit transistor EQT11, and flows through main bit line MBL1 and sub bit line SBL11 in the same direction. Similarly, a data write current ±Iw flows through main bit line /MBL1 and sub bit line /SBL11 in the same direction.

Hereinafter, how a data write magnetic field is generated in the memory block of FIG. 23 will be described with reference to FIGS. 24A and 24B.

Figure 24A:
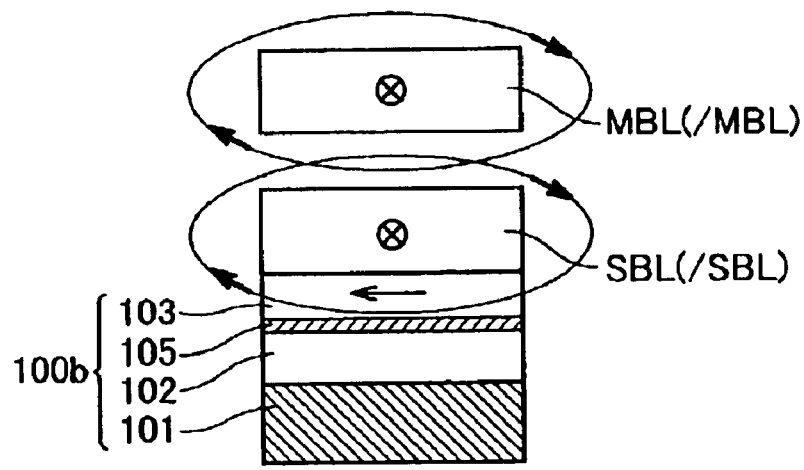
FIGS. 24A and 24B are conceptual diagrams illustrating how a data write magnetic field is generated in the memory block according to the first modification of the third embodiment.

FIG. 24A shows an example in which a data write current +Iw of the positive direction is supplied to sub bit line SBL (/SBL). In this case, a data write current of the same direction is supplied to a corresponding main bit line MBL (/MBL). Accordingly, the data write magnetic fields respectively generated by these data write currents interact with each other in a constructive manner in free magnetic layer 103.

Figure 24B:
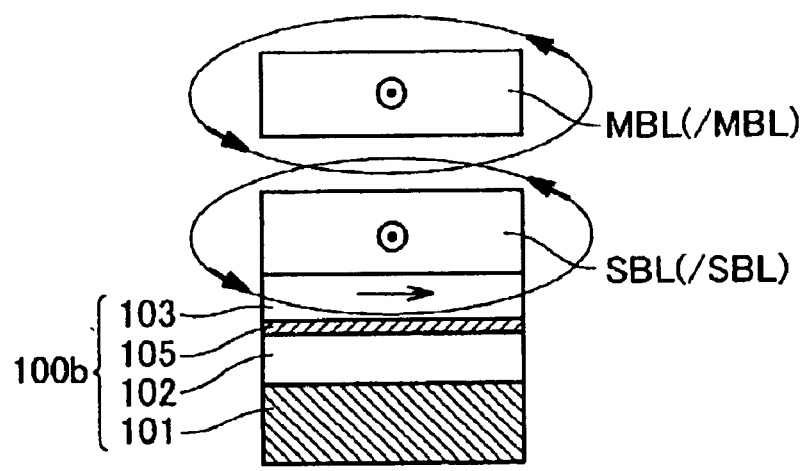

FIG. 24B shows an example in which a data write current −Iw of the negative direction is supplied to sub bit line SBL (/SBL). In this case as well, the data write magnetic fields respectively generated by the data write currents flowing through sub bit line SBL (/SBL) and main bit line MBL (/MBL) interact with each other in a constructive manner in free magnetic layer 103.

As a result, the switching magnetic field strength in free magnetic layer 103 can be obtained with a smaller data write current. This enables reduction in power consumption of the MRAM device and reduction in magnetic noise generated for the memory cells other than the selected memory cell in data write operation.

By applying the hierarchical bit line structure, increased read operation speed and reduced power consumption can be realized even in the conventional MTJ memory cells.

When MTJ memory cells MCf of FIG. 21 having a conventional two-layer storage node structure are used, a data write magnetic field generated by the same data write current ±Iw is larger in free magnetic layer 103 than in free magnetic layer 104. Therefore, even when free magnetic layers 103, 104 are designed to have the same magnetic moment (magnetization threshold value), free magnetic layer 104 can be magnetized according to magnetization of free magnetic layer 103. It should be noted that, as described in connection with FIG. 51, when free magnetic layer 103 is designed to have a larger magnetic moment (magnetization threshold value) than that of free magnetic layer 104, magnetization of free magnetic layers 103, 104, that is, the data write operation, can be conducted with improved reliability.

Second Modification of Third Embodiment

Figure 25:
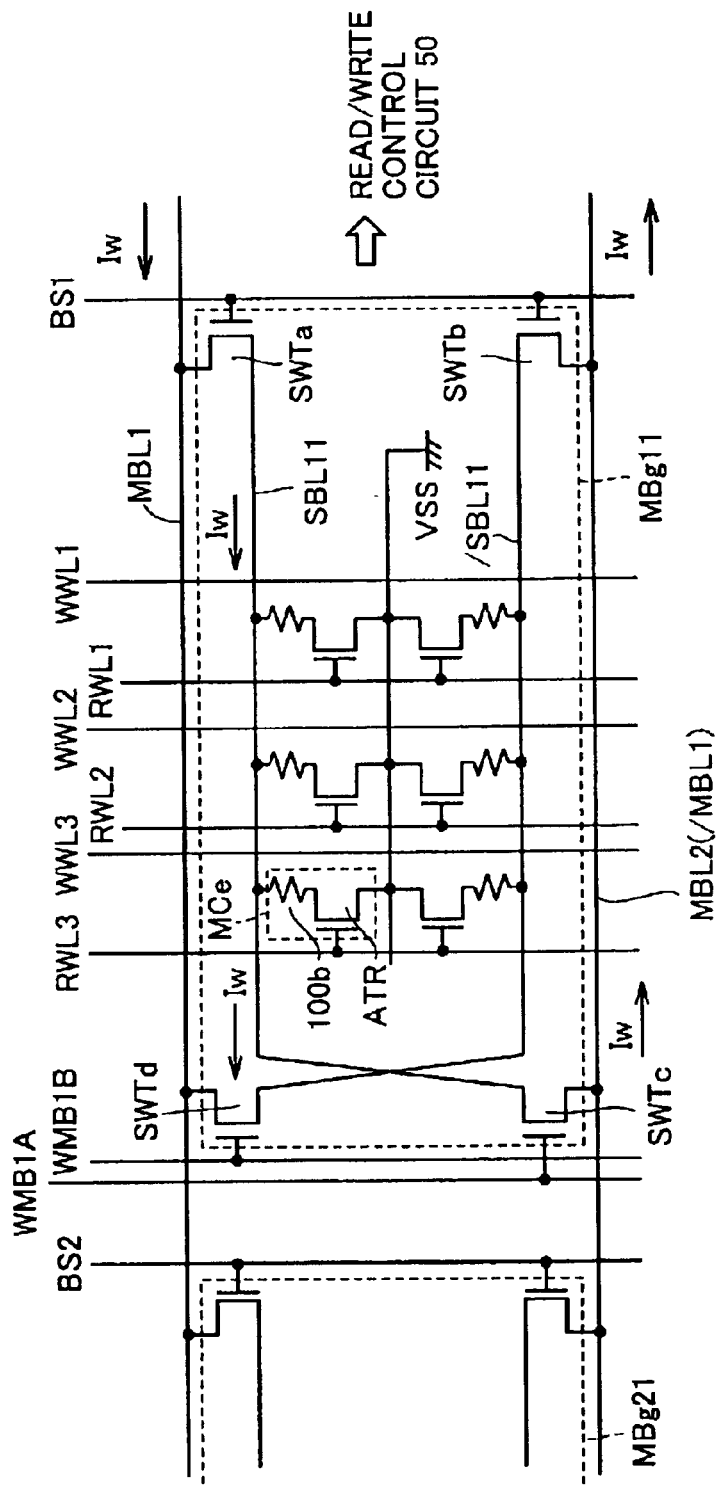
FIG. 25 is a circuit diagram showing the structure of a memory block according to a second modification of the third embodiment.

Referring to FIG. 25, in the second modification of the third embodiment, memory blocks MBc11 to MBckm in memory array 10 of FIG. 15 are replaced with memory blocks MBg11 to MBgkm. Since memory blocks MBg11 to MBgkm have the same structure, FIG. 25 exemplarily shows the structure of memory block MBg11. Hereinafter, memory blocks MBg11 to MBgkm are sometimes generally referred to as memory blocks MBg.

Memory block MBg11 in the second modification of the third embodiment has the same structure as that of memory block MBc11 of FIG. 16 except that memory cells MCa are replaced with memory cells MCf. Sub bit lines SBL11, /SBL11 are arranged according to the open bit line structure. In each memory cell column, MTJ memory cell MCe is provided in every memory cell row.

Since connection and ON/OFF conditions of current switch transistors SWTa, SWTb, SWTc, SWTd are the same as those described in connection with FIG. 16, detailed description thereof will not be repeated.

With the above structure, the same effects as those of the third modification of the second embodiment can be obtained even in the memory array having the conventional MTJ memory cells arranged according to the open bit line structure.

Third Modification of Third Embodiment

Figure 26:
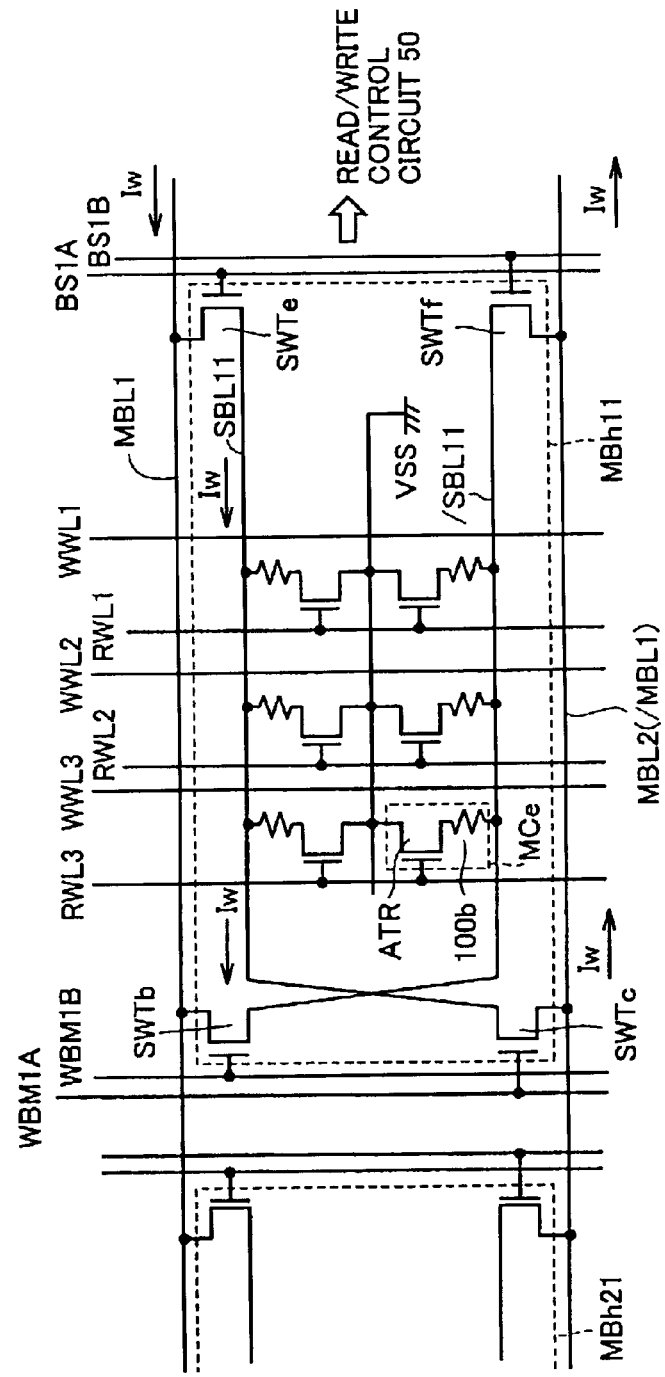
FIG. 26 is a circuit diagram showing the structure of a memory block according to a third modification of the third embodiment.

Referring to FIG. 26, in the third modification of the third embodiment, memory blocks MBc11 to MBckm in memory array 10 of FIG. 15 are replaced with memory blocks MBh11 to MBhkm. Since memory blocks MBh11 to MBhkm have the same structure, FIG. 26 exemplarily shows the structure of memory block MBh11. Hereinafter, memory blocks MBh11 to MBhkm are sometimes generally referred to as memory blocks MBh.

Memory block MBh11 in the third modification of the third embodiment is different from memory block MBg11 of FIG. 25 in that current switch transistors SWTa, SWTb are replaced with current switch transistors SWTe, SWTf.

Current switch transistor SWTe is electrically coupled between main bit line MBL1 and one end of sub bit line SBL11 that is located closer to read/write control circuit 50. Current switch transistor SWTf is electrically coupled between main bit line /MBL1 and one end of sub bit line /SBL11 that is located closer to read/write control circuit 50. Current switch transistors SWTe, SWTf respectively receive block selection signals BS1A, BS1B at their gates.

With the above structure, a data write current ±Iw having the same direction as that of main bit line MBL1 can be supplied to sub bit line SBL11 by turning ON current switch transistors SWTc, SWTe. On the other hand, a data write current ±Iw having the same direction as that of main bit line MBL2 (/MBL1) can be supplied to sub bit line /SBL11 by turning ON current switch transistors SWTd, SWTf.

In data read operation, current switch transistors SWTc, SWTd are turned OFF, and one of current switch transistors SWTe, SWTf that corresponds to the selected memory cell is turned ON. As in memory block MBd11 of FIG. 18, one of the pair of main bit lines that is not electrically coupled to the selected memory cell is coupled to a dummy memory cell in order to conduct complementary data read operation.

According to the third and its modifications embodiment by applying the hierarchical bit line structure, data write and read operations can be conducted even in the memory array including the conventional MTJ memory cells. In particular, the data write magnetic fields respectively generated by the data write currents flowing through the main bit line and the sub bit line interact with each other in a constructive manner in the free magnetic layer. This enables reduction in data write current, and thus enables reduction in magnetic noise and power consumption.

Fourth Embodiment

In the fourth embodiment, another structural example of the MTJ memory cell having a two-layer storage node structure described in the first embodiment will be described.

Figure 27:
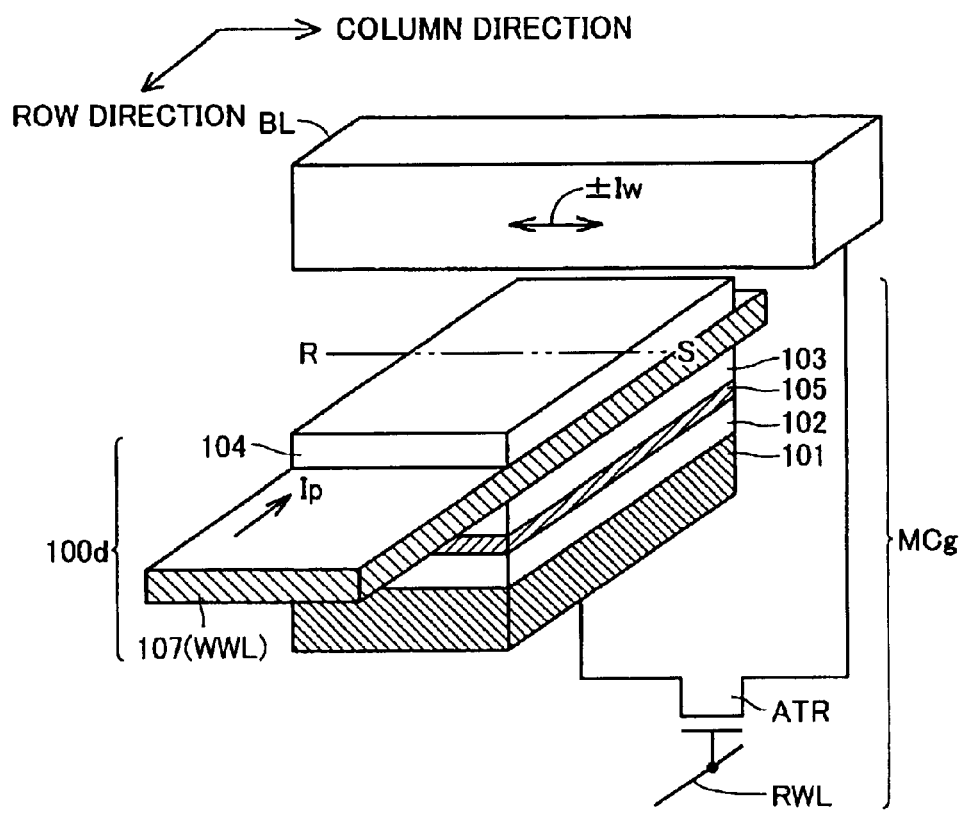
FIG. 27 is a conceptual diagram showing the structure of an MTJ memory cell having a two-layer storage node structure according to a fourth embodiment of the present invention.

Referring to FIG. 27, an MTJ memory cell MTg having a two-layer storage node structure according to the fourth embodiment includes a tunneling magneto-resistance element 100d and an access transistor ATR. Tunneling magneto-resistance element 100d includes an antiferromagnetic material layer 101, a fixed magnetic layer 102, free magnetic layers 103, 104, a tunneling barrier 105 and an intermediate layer 107.

In the fourth embodiment, intermediate layer 107 extends in the row direction and forms write word line WWL. Bit line BL extends in the column direction and is formed in a metal wiring layer located above or below tunneling magneto-resistance element 100d. In the example of FIG. 27, bit line BL is formed in a layer located above tunneling magneto-resistance element 100d.

Access transistor ATR is electrically coupled between tunneling magneto-resistance element 100d and bit line BL. Read word line RWL extending in the row direction is formed at the gate of access transistor ATR.

Figure 28A:
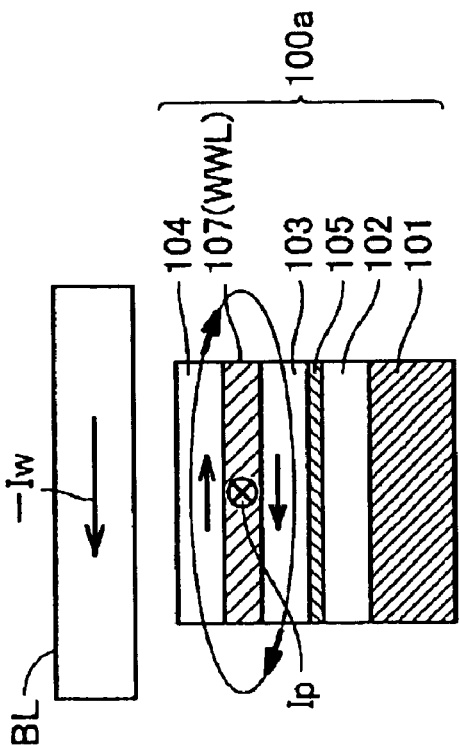
FIGS. 28A and 28B are conceptual diagrams illustrating how a data write magnetic field is generated in the MTJ memory cell of FIG. 27.
Figure 28B:
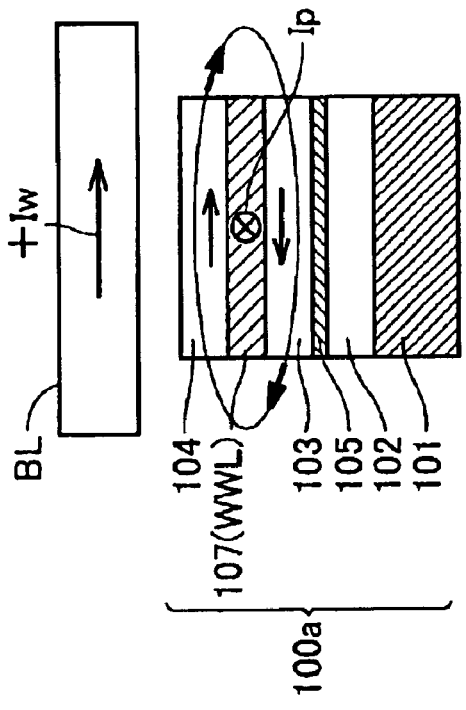

Hereinafter, how a data write magnetic field is generated in MTJ memory cell MCg will be described with reference to FIGS. 28A and 28B. FIGS. 28A and 28B correspond to a cross-sectional view taken along line R–S of FIG. 27.

In the example of FIG. 28A, a data write current +Iw of the positive direction is supplied to bit line BL. In the example of FIG. 28B, a data write current –Iw of the negative direction is supplied to bit line BL. In both examples of FIGS. 28A and 28B, a data write current Ip flows through intermediate layer 107 (write word line WWL) in a fixed direction.

Free magnetic layers 103, 104 are magnetized in the hard-axis (HA) direction by data write current Ip flowing through intermediate layer 107. With this structure, the amount of data write current required to generate a data write magnetic field of the hard-axis (HA) direction in free magnetic layers 103, 104 can be reduced. This enables reduction in power consumption and magnetic noise in the MRAM device.

Free magnetic layers 103, 104 are magnetized in the easy-axis (EA) direction by a data write current ±Iw flowing through bit line BL.

In tunneling magneto-resistance element 100d, a magnetic field of the easy-axis (EA) direction generated by the data write current flowing through bit line BL is superimposed on a magnetic field of the hard-axis (HA) direction generated by the data write current flowing through intermediate layer 107 (write word line WWL), whereby data write operation is conducted. In other words, in order that data write operation involving inversion of the magnetization direction is conducted only to the memory cell subjected to the magnetic field resulting from superimposition of the above two magnetic fields, free magnetic layers 103, 104 must be formed from different materials and with different thicknesses so as to have different magnetic moments (magnetization threshold values).

Figure 29:
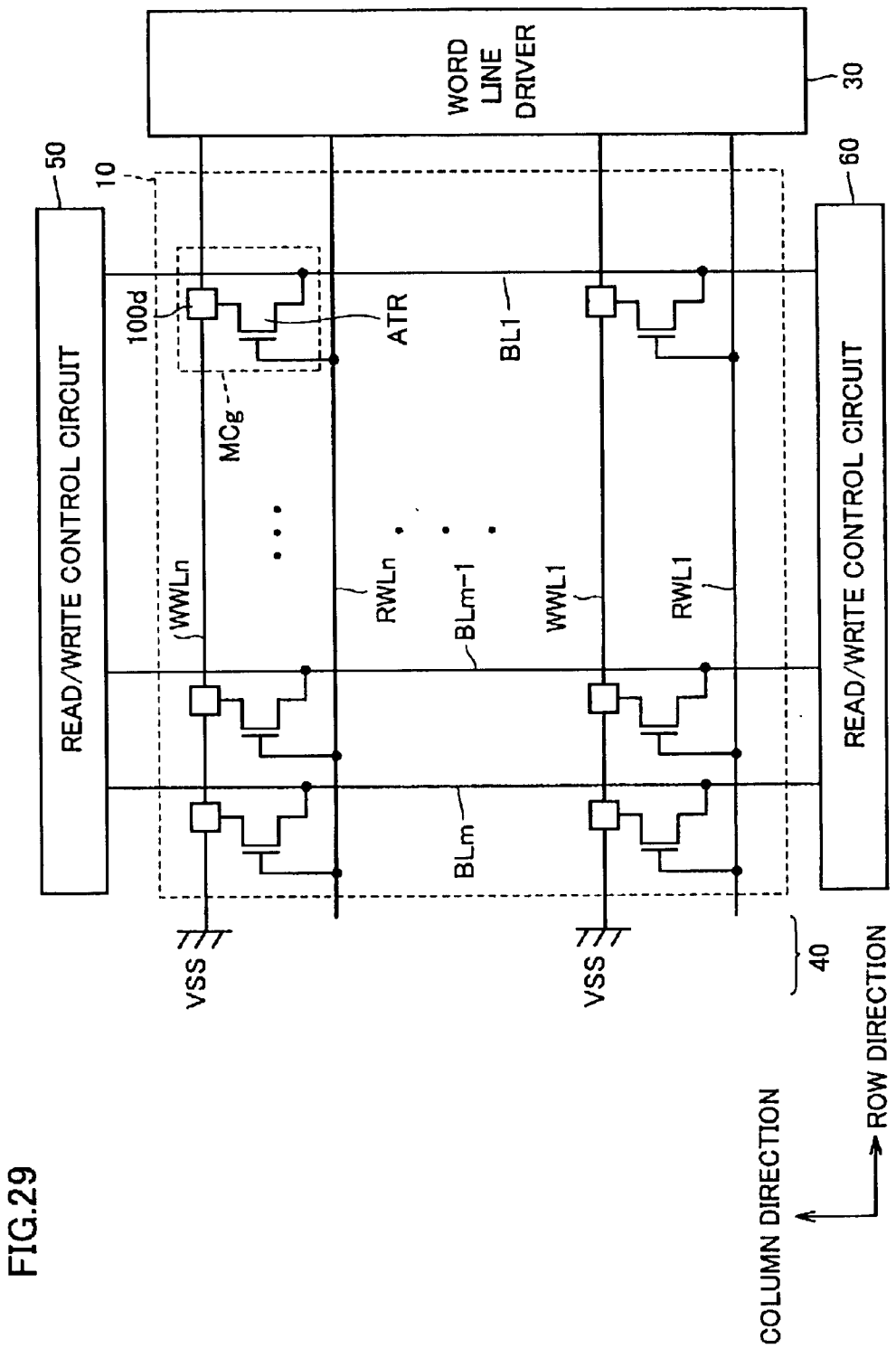
FIG. 29 is a block diagram showing the structure of a memory array having MTJ memory cells of FIG. 27 arranged in a matrix.

Referring to FIG. 29, memory array 10 includes MTJ memory cells MCg having a two-layer storage node structure. MTJ memory cells MCg are arranged in n rows by m columns (where n, m is a natural number). Memory cell MCg includes an access transistor ATR and a tunneling magneto-resistance element 100d.

Read word lines RWL1 to RWLn and write word lines WWL1 to WWLn are arranged respectively corresponding to the memory cell rows. Bit lines BL1 to BLm are arranged respectively corresponding to the memory cell columns.

Word line current control circuit 40 couples each write word line WWL to ground voltage VSS in the region facing word line driver 30 with memory array 10 interposed therebetween. This enables a data write current Ip of a fixed direction to be supplied to the write word line that is selectively coupled to power supply voltage VDD by word line driver 30.

FIG. 29 exemplarily shows read word lines RWL1, RWLn, write word lines WWL1, WWLn, bit lines BL1, BLm−1, BLm corresponding to the first and $n^{th}$ rows and the first, $(m-1)^{th}$ and $m^{th}$ columns, and some of corresponding memory cells.

In data read operation, intermediate layer 107, that is, write word line WWL, is fixed to ground voltage VSS. By selectively activating read word line RWL corresponding to the selected memory cell, tunneling magneto-resistance element 100d is electrically coupled between a corresponding bit line BL and ground voltage VSS. The storage data can be read from the selected memory cell by sensing a voltage change on bit line BL coupled to the selected memory cell.

Intermediate layer 107 is formed from a non-magnetic conductor between free magnetic layers 103, 104. The shape and electric characteristics of intermediate layer 107 can be arbitrarily determined. In the fourth embodiment, write word line WWL is formed using intermediate layer 107. Therefore, intermediate layer 107 extends in the column direction with a stripe shape so that intermediate layers 107 of the MTJ memory cells of the same memory cell column are electrically coupled to each other.

First Modification of Fourth Embodiment

Figure 30:
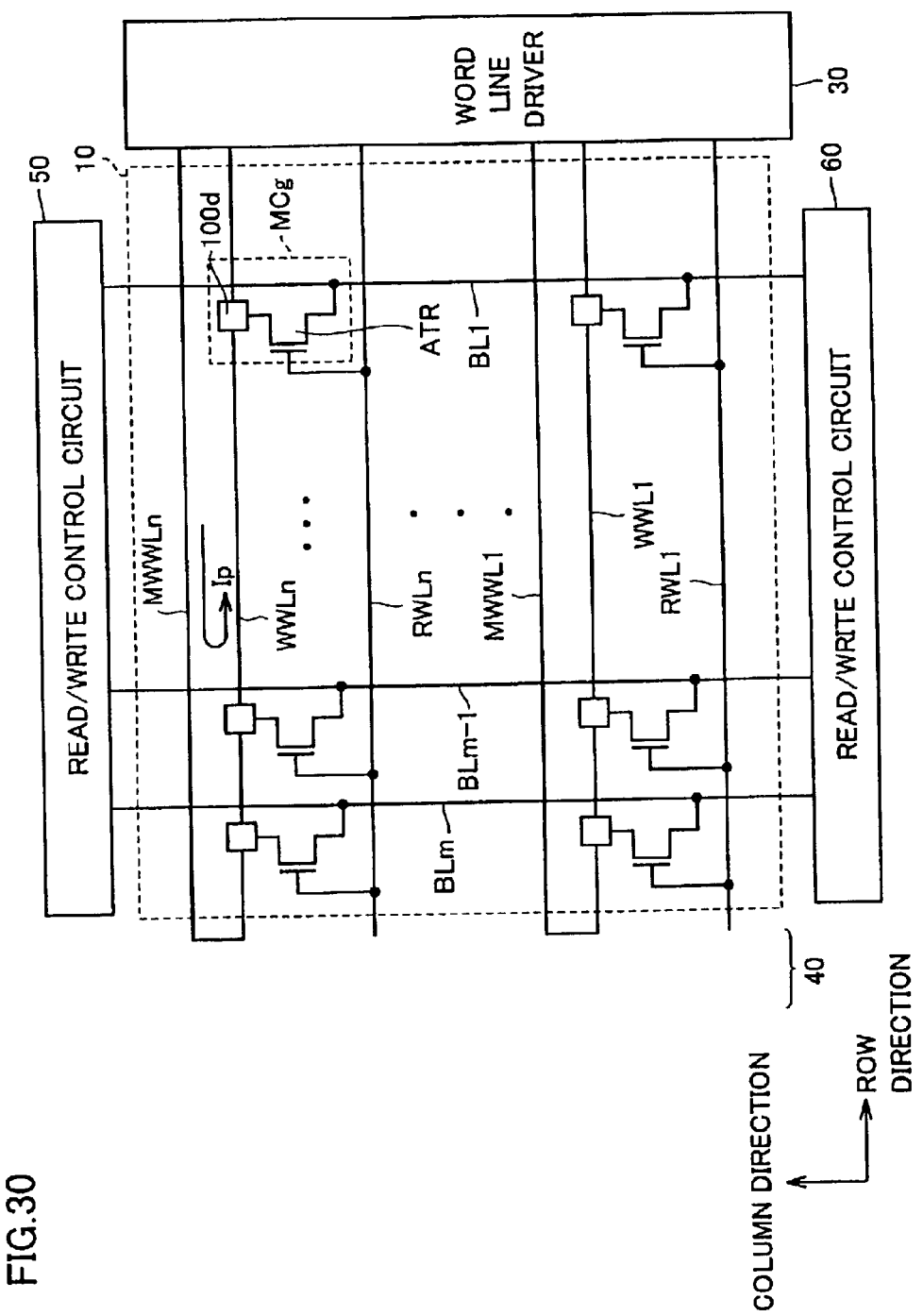
FIG. 30 is a circuit diagram showing the structure of a memory array according to a first modification of the fourth embodiment.

Referring to FIG. 30, in the memory array of the first modification of the fourth embodiment, write word lines WWL are arranged in a hierarchical manner. More specifically, main write word lines MWWL1 to MWWLn are additionally provided corresponding to the respective memory cell rows. Hereinafter, main write word lines MWWL1 to MWWLn are sometimes generally referred to as main write word lines MWWL.

In a memory cell MCh of the fourth embodiment, write word line WWL is formed using intermediate layer 107 of tunneling magneto-resistance element 100d. Therefore, write word line WWL has a relatively high electric resistance value. Main write word line MWWL1 to MWWLn is formed using a metal wiring layer located above tunneling magneto-resistance element 100d.

In each memory cell row, main write word line MWWL and write word line WWL are electrically coupled to each other at their respective one ends in the region opposite to word line driver 30 (word line current control circuit 40). Each write word line WWL, that is, intermediate layer 107, is electrically coupled to ground voltage VSS at its one end located at word line driver 30. In data write operation, word line driver 30 couples main write word line MWWL corresponding to the selected memory cell to power supply voltage VDD according to the row selection result.

With the above structure, a data write current Ip can be supplied to main write word line MWWL and write word line WWL of the memory cell row corresponding to the selected memory cell in the opposite directions. The data write currents flowing through main write word line MWWL and write word line WWL respectively generate magnetic fields of the hard-axis (HA) direction in the free magnetic layers of the selected memory cell. These magnetic fields interact with each other in a constructive manner. As a result, data write current Ip can further be suppressed.

A data write current ±Iw having the direction according to the write data level DIN is supplied to bit line BL of the memory cell column corresponding to the selected memory cell, whereby data can be written to the selected memory cell.

In data read operation, each main write word line MWWL and each write word line WWL are set to ground voltage VSS and read word line RWL corresponding to the selected memory cell is activated. As a result, tunneling magneto-resistance element 100d of the selected memory cell is electrically coupled between a corresponding bit line BL and ground voltage VSS.

Second Modification of Fourth Embodiment

Figure 31:
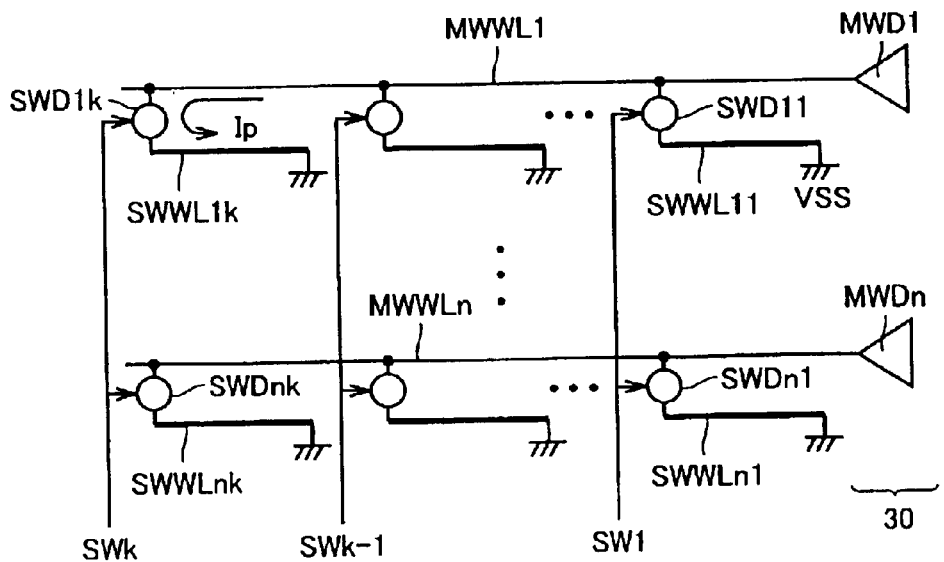
FIG. 31 is a conceptual diagram illustrating a hierarchical word line structure according to a second modification of the fourth embodiment.

Referring to FIG. 31, each memory cell row is divided into prescribed regions, and write word line WWL of each memory cell row is divided into sub write word lines corresponding to the respective prescribed regions. For example, write word line WWL1 of the first memory cell row is divided into k sub write word lines SWWL11 to SWWL1k (where k is a natural number). Similarly, write word line WWL of the $n^{th}$ memory cell row is divided into k sub write word lines SWWLn1 to SWWLnk. Hereinafter, sub write word lines SWWL11 to SWWLnk are sometimes generally referred to as sub write word lines SWWL. Sub word selection signals SW1 to SWk are defined as signals corresponding to the respective prescribed regions of sub write word lines SWWL.

The hierarchical word line structure of main write word line MWWL and sub write word line SWWL is thus applied to each memory cell row. Like the first modification of the fourth embodiment, each sub write word line SWWL is formed using intermediate layer 107 of tunneling magneto-resistance element 100d.

This enables reduction in wiring length of sub write word line SWWL that is formed in a thin intermediate layer having a relatively high electric resistance value per unit resistance, and thus enables reduction in electric resistance value of sub write word line SWWL.

Main write word line MWWL1 to MWWLn is selectively coupled to power supply voltage VDD by a corresponding main word driver MWD1 to MWDn in word line driver 30. Sub word drivers SWD11 to SWDnk are respectively provided for sub write word lines SWWL11 to SWWLnk. Hereinafter, sub word drivers SWD11 to SWDnk are sometimes generally referred to as sub word drivers SWD.

Each sub word driver SWD11 to SWDnk couples one end of a corresponding sub write word line SWWL to power supply voltage VDD in response to activation of both a corresponding main write word line MWWL and a corresponding sub word selection signal SWi (where i is an integer in the range of 1 to k). Each sub word driver SWD11 to SWDnk thus activates a corresponding sub write word line SWWL.

For example, sub word driver SWD may be formed from a switching element that is connected between a corresponding main write word line MWWL and one end of a corresponding sub write word line SWWL and turned ON/OFF in response to a corresponding sub word selection signal SWi. The other end of sub write word line SWWL that is not connected to sub word driver SWD is coupled to ground voltage VSS.

Sub word drivers SWD are arranged so that the data write magnetic fields respectively generated by a data write current Ip flowing through main write word line MWWL and a data write current Ip flowing through sub write word line SWWL interact with each other in the free magnetic layers of the selected memory cell.

More specifically, in FIG. 31, each sub word driver SWD is arranged at one end of a corresponding sub write word line SWWL that is located away from a corresponding main word driver MWD. The other end of sub write word line SWWL that is located closer to main word driver MWD is electrically coupled to ground voltage VSS.

With the above structure, a data write current Ip for generating a required magnetic field of the hard-axis (HA)

direction can be suppressed in the MTJ memory cell of the fourth embodiment. Moreover, the electric resistance value of the write word line can be reduced as compared to the case where the write word line is formed using an intermediate layer extending in the row direction in the entire memory array 10. This enables high-speed operation.

Third Modification of Fourth Embodiment

Figure 32:
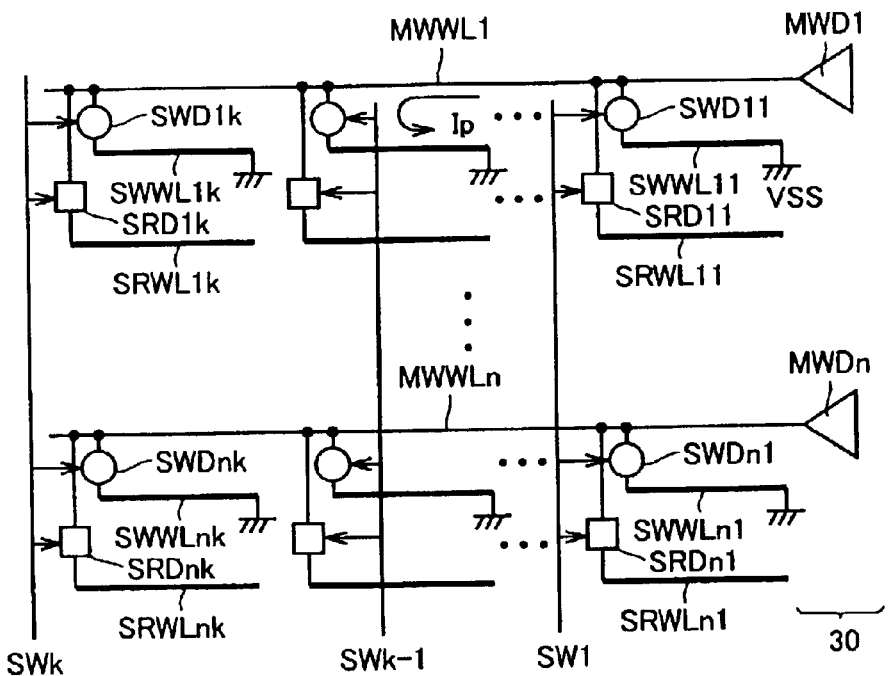
FIG. 32 is a conceptual diagram illustrating a hierarchical word line structure according to a third modification of the fourth embodiment.

Referring to FIG. 32, in the third modification of the fourth embodiment, write word lines WWL are arranged in a hierarchical manner by using main write word lines MWWL and sub write word lines SWWL, as in the second modification of the fourth embodiment. Read word lines RWL are divided in the same manner as that of the write word lines. For example, read word line RWL1 corresponding to the first memory cell row is divided into sub read word lines SRWL11 to SRWL1k respectively corresponding to sub write word lines SWWL11 to SWWL1k.

As described before, read word line RWL is formed from a relatively high resistance material such as polysilicon by using a gate electrode layer of access transistor ATR. By providing sub read word lines SRWL having a reduced wiring length in each memory cell row, the electric resistance value of each sub read word line SRWL can be reduced.

Sub read drivers SRD11 to SRD1k respectively correspond to sub read word lines SRWL11 to SRWL1k. Hereinafter, sub read drivers SRD11 to SRD1k are sometimes generally referred to as sub read drivers SRD. Sub read driver SRD may be formed from a switching element that is connected between a corresponding main write word line MWWL and one end of a corresponding sub read word line SRWL and turned ON in response to activation of a corresponding sub word selection signal SWi in data read operation.

Main word driver MWD1 to MWDn selectively activates a corresponding main write word line MWWL corresponding to the selected memory cell in both data read and write operations.

With the above structure, in data write operation, a data write current Ip can be supplied to both main write word line MWWL and sub write word line SWWL to generate data write magnetic fields, as in the case of FIG. 31. Accordingly, the same effects as those of the modification of the third embodiment in FIG. 31 can be obtained in data write operation.

In data read operation, a sub read word line SRWL corresponding to the selected memory cell is activated in response to activation of a corresponding main write word line MWWL and turning-ON of a corresponding sub read driver SRD. As a result, data can be read from the selected memory cell.

Sub read word line SRWL is activated through main write word line MWWL formed as a metal wiring having a low electric resistance value. Accordingly, sub read word line SRWL corresponding to the selected memory cell can be rapidly activated. In other words, a signal can be propagated trough sub read word line SRWL with reduced time in data read operation, enabling high-speed data read operation.

Fifth Embodiment

In the first to fourth embodiments, write word line WWL or bit line BL is formed using an intermediate layer that extends in the row or column direction between two free magnetic layers. In the fifth embodiment, the structure capable of supplying a data write current only to the intermediate layer of the selected memory cell will be described. This structure is realized by forming an independent intermediate layer in every memory cell.

Figure 33:
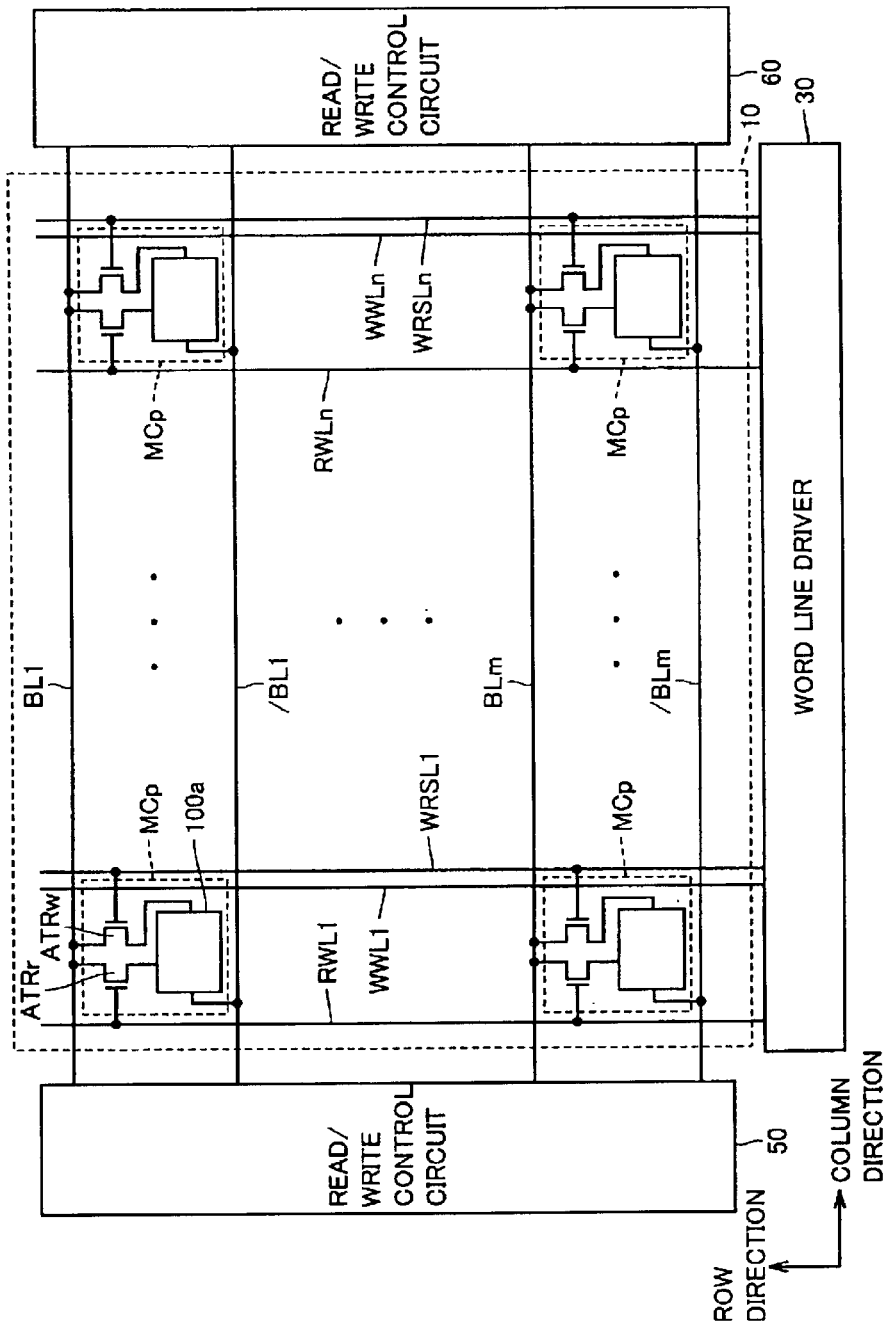
FIG. 33 is a block diagram showing the structure of a memory array according to a fifth embodiment of the present invention.

Referring to FIG. 33, MTJ memory cells MCp of the fifth embodiment are arranged in n rows by m columns in the entire memory array 10. Each MTJ memory cell MCp includes a tunneling magneto-resistance element 100a and access transistors ATRr, ATRw as access elements.

Read word lines RWL1 to RWLn and write word lines WWL1 to WWLn are arranged corresponding to the respective memory cell rows. Write row selection lines WRSL1 to WRSLn are additionally arranged corresponding to the respective memory cell rows. Hereinafter, write row selection lines WRS1 to WRSLn are sometimes generally referred to as write row selection lines WRSL.

Bit lines BL, /BL are arranged corresponding to the respective memory cell columns. Accordingly, read word lines RWL1 to RWLn, write word lines WWL1 to WWLn, write row selection lines WRSL1 to WRSLn and bit lines BL1 to BLm, /BL1 to /BLm are arranged in the entire memory array 10.

In data write operation, write row selection line WRSL of the selected row is activated to H level. Word line driver 30 is thus capable of driving write row selection line WRSL according to the same decode result as that of a corresponding write word line WWL. Although a data write current Ip is supplied to write word line WWL of the selected row, a current is not actively supplied to write row selection line WRSL. This is because write row selection line WRSL is provided in order to control the gate voltage of a corresponding access transistor ATRw.

In each MTJ memory cell MCp, tunneling magneto-resistance element 100a is electrically coupled to a corresponding bit line /BL. Access transistors ATRr, ATRw are electrically coupled between a corresponding bit line BL and tunneling magneto-resistance element 100a. The gate voltage of access transistor ATRr is controlled by a corresponding read word line RWL, and the gate voltage of access transistor ATRw is controlled by a corresponding write row selection line WRSL.

Figure 34:
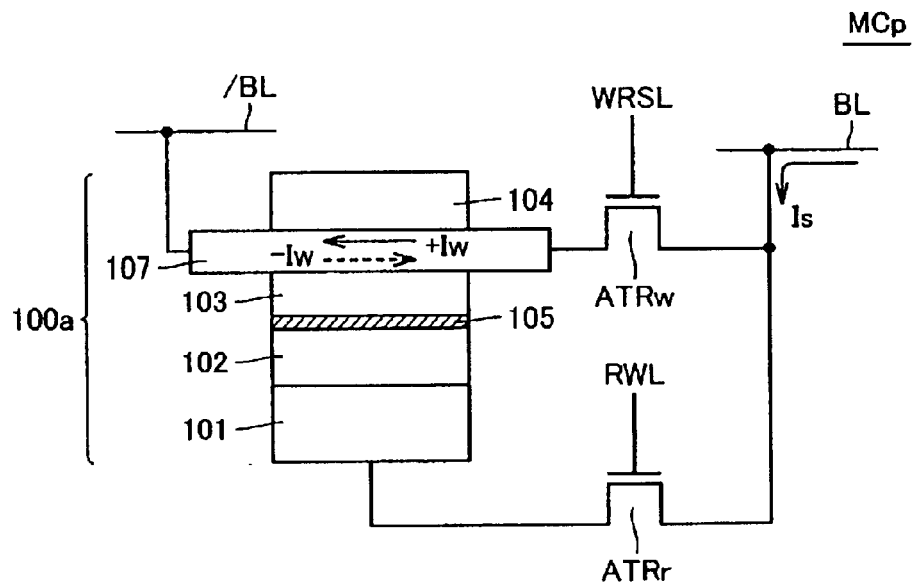
FIG. 34 is a conceptual diagram illustrating the structure of an MTJ memory cell according to the fifth embodiment.

Referring to FIG. 34, in the fifth embodiment, intermediate layer 107 is formed from a non-magnetic conductor, and every MTJ memory cell MCp has an independent intermediate layer 107. One end of intermediate layer 107 is electrically coupled to a corresponding bit line /BL. The other end of intermediate layer 107 is electrically coupled to a corresponding bit line BL through access transistor ATRw. In other words, access transistor ATRw is connected in series with intermediate layer 107 between corresponding bit lines BL, /BL, and serves to selectively supply a data write current to intermediate layer 107.

Data write operation to tunneling magneto-resistance element 100a is conducted in the same manner as that described in connection with FIGS. 4A and 4B. More specifically, by controlling the voltages at both ends of intermediate layer 107, a data write current +Iw or −Iw is supplied to intermediate layer 107 according to the write data level. Free magnetic layers 103, 104 can thus be magnetized according to the write data level.

Access transistor ATRr is provided between antiferromagnetic material layer 101 and a corresponding bit line BL. A write row selection line WRSL and a read word line RWL are respectively connected to the gates of access transistors ATRw, ATRr.

Figure 35:
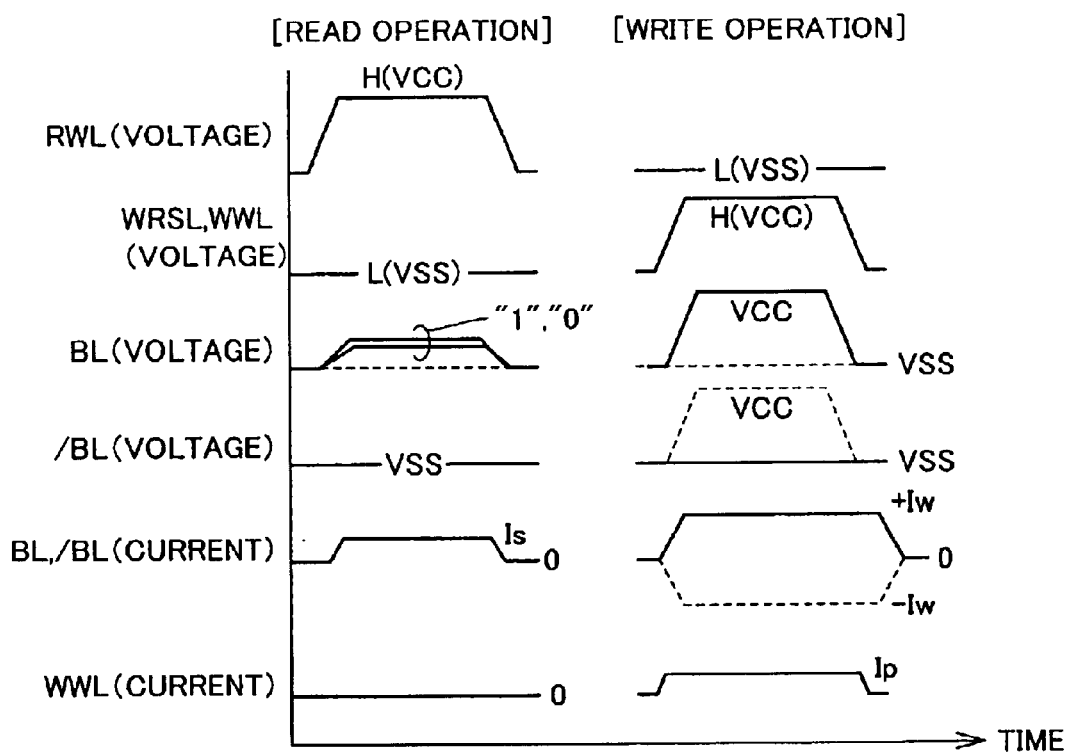
FIG. 35 is an operating waveform chart illustrating data read and write operations from and to the MTJ memory cell according to the fifth embodiment.

Referring to FIG. 35, in data read operation, word line driver 30 activates read word line RWL of the selected row from L level to H level. In response to this, access transistor ATRr of the selected row is turned ON. Since the voltages on each write row selection line WRSL and each write word line WWL are retained at L level (ground voltage VSS), each access transistor ATRw is turned OFF.

Read/write control circuits 50, 60 couple bit line /BL to ground voltage VSS and supply a sense current (data read current) Is to bit line BL. Turned-ON access transistor ATRr allows tunneling magneto-resistance element 100a of the selected memory cell to be electrically coupled between bit line BL receiving sense current Is and ground voltage VSS. As a result, the voltage on bit line BL changes according to the storage data of the selected MTJ memory cell. The storage data can be read from the selected MTJ memory cell by sensing the voltage on bit line BL.

In data write operation, word line driver 30 activates write row selection line WRSL and write word line WWL of the selected row to H level (power supply voltage VCC). As a result, a data write current Ip is supplied to write word line WWL of the selected row, and access transistor ATRw of the selected row is turned ON.

Read/write control circuits 50, 60 set one of bit lines BL, /BL of the selected column to one of power supply voltage VCC and ground voltage VSS, and the other bit line to the other voltage. For example, in order to write data "1", read/write control circuits 50, 60 set bit line BL to power supply voltage VCC and bit line /BL to ground voltage VSS so as to supply a data write current +Iw to intermediate layer 107. On the other hand, in order to write data "0", read/write control circuits 50, 60 set bit line /BL to power supply voltage VCC and bit line BL to ground voltage VSS so as to supply a data write current −Iw to intermediate layer 107. Bit lines BL, /BL of the non-selected columns are set to ground voltage VSS.

In data write operation, a data write current is thus supplied only to intermediate layer 107 of the selected memory cell. Even if a non-selected memory cell is located on the same memory cell column or the same memory cell row as that of the selected memory cell, a data write current ±Iw will not be supplied to intermediate layer 107 of the non-selected memory cell. Bit lines BL, /BL are located away from the tunneling magneto-resistance element. Therefore, in the fifth embodiment, data can be prevented from being erroneously written to the non-selected memory cells.

First Modification of Fifth Embodiment

Figure 36:
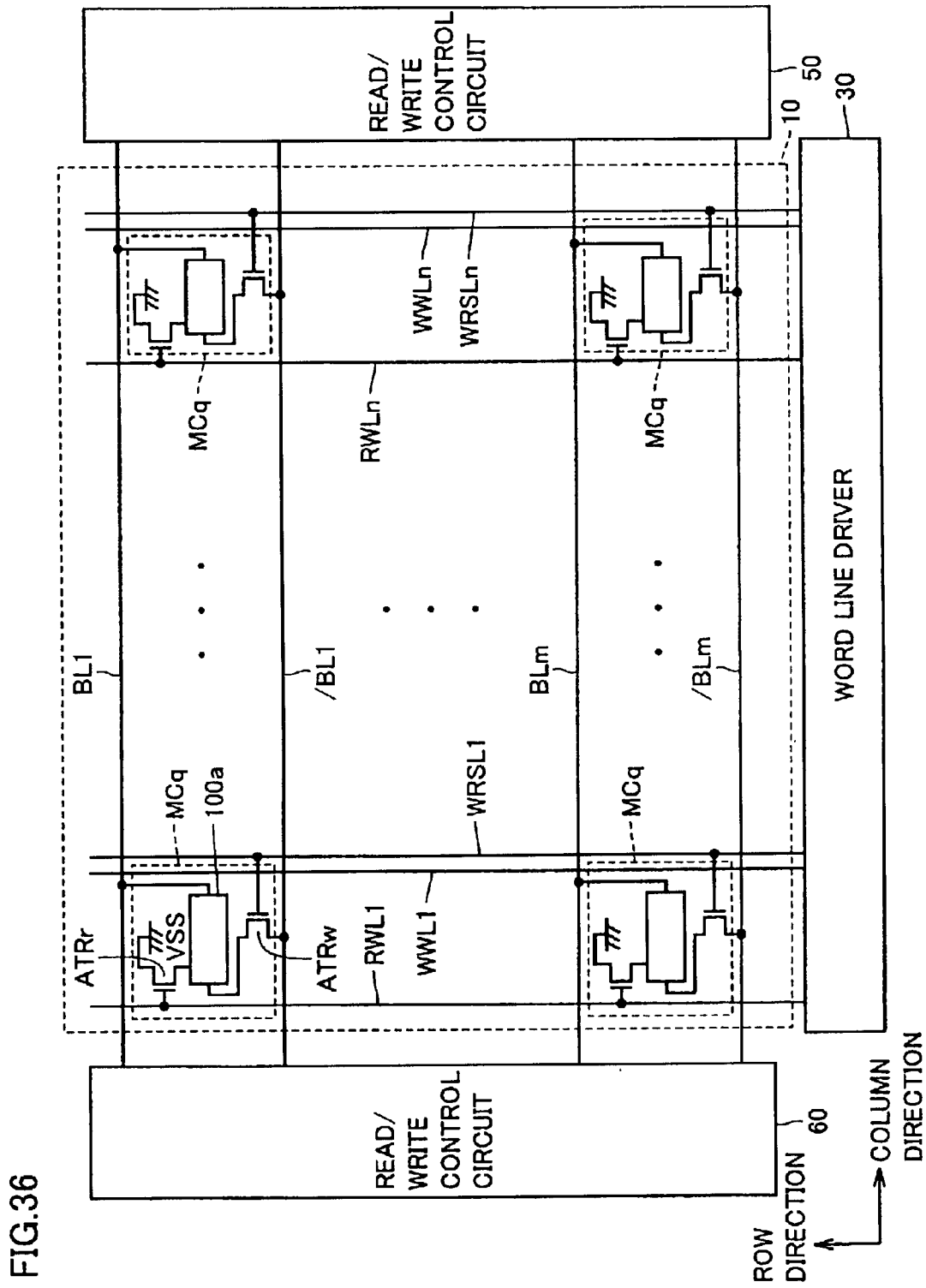
FIG. 36 is a block diagram showing the structure of a memory array according to a first modification of the fifth embodiment.

Referring to FIG. 36, in the first modification of the fifth embodiment, MTJ memory cells MCq are arranged in n rows by m columns in the entire memory array 10. Each MTJ memory cell MCq includes a tunneling magneto-resistance element 100a coupled to a corresponding bit line BL, an access transistor ATRw provided between a corresponding bit line /BL and tunneling magneto-resistance element 100a, and an access transistor ATRr provided between tunneling magneto-resistance element 100a and ground voltage VSS. The gate voltage of access transistor ATRr is controlled by a corresponding read word line RWL and the gate voltage of access transistor ATRw is controlled by a corresponding write row selection line WRSL.

Since read word lines RWL, write word lines WWL, write row selection lines WRSL and bit lines BL, /BL are arranged in the same manner as that in the fifth embodiment, detailed description thereof will not be repeated.

Figure 37:
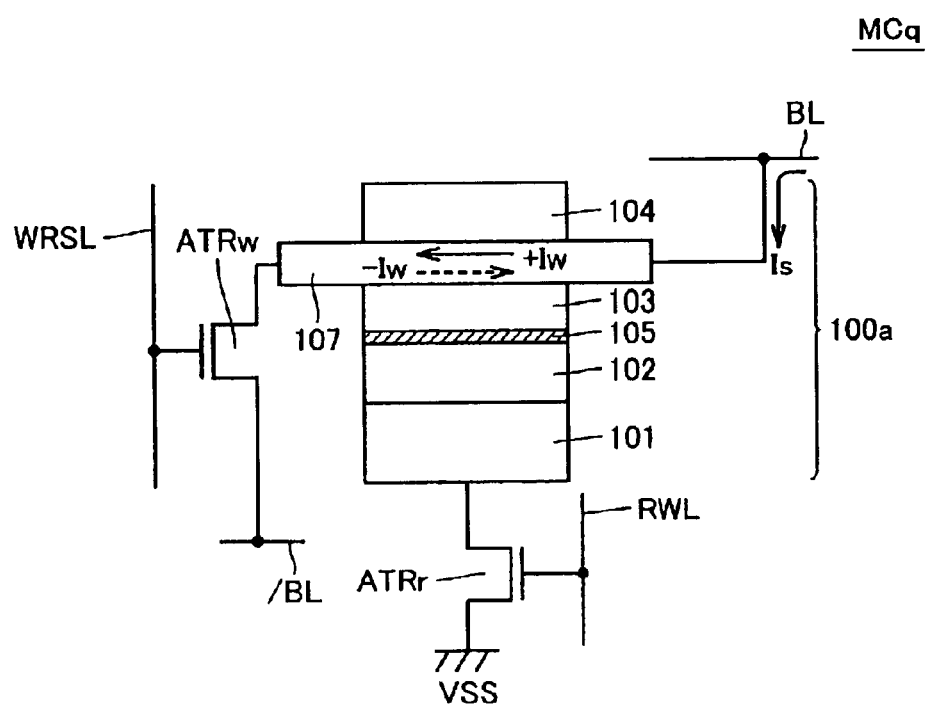
FIG. 37 is a conceptual diagram illustrating the structure of an MTJ memory cell according to the first modification of the fifth embodiment.

Referring to FIG. 37, in the first modification of the fifth embodiment, every MTJ memory cell MCq includes an independent intermediate layer 107. One end of intermediate layer 107 is coupled to a corresponding bit line BL, and the other end thereof is connected to a corresponding bit line /BL through access transistor ATRw. Accordingly, as in the fifth embodiment, access transistor ATRw is connected in series with intermediate layer 107 between corresponding bit lines BL, /BL, and serves to selectively supply a data write current to intermediate layer 107. Access transistor ATRr is connected between antiferromagnetic material layer 101 and ground voltage VSS.

Access transistor ATRw is turned ON when a corresponding write row selection line WRSL is set to H level (power supply voltage VCC), and turned OFF when the corresponding write row selection line WRSL is set to L level (ground voltage VSS). Similarly, access transistor ATRr is turned ON when a corresponding read word line RWL is set to H level (power supply voltage VCC), and turned OFF when the corresponding read word line RWL is set to L level (ground voltage VSS).

In the first modification of the fifth embodiment, the respective operating waveforms of read word line RWL, write word line WWL, write row selection line WRSL and bit lines /BL, BL in data read and write operations are the same as those shown in FIG. 35. In other words, in the first modification of the fifth embodiment as well, the voltage and current on read write word line RWL, write word line WWL, write row selection line WRSL and bit lines /BL, BL are controlled in the same manner as that of the fifth embodiment in order to conduct data read and write operations. In data write operation, a data write current ±Iw is supplied only to intermediate layer 107 of the selected memory cell as in the case of the fifth embodiment. The data can thus be prevented from being erroneously written to the non-selected memory cells.

Second Modification of Fifth Embodiment

Figure 38:
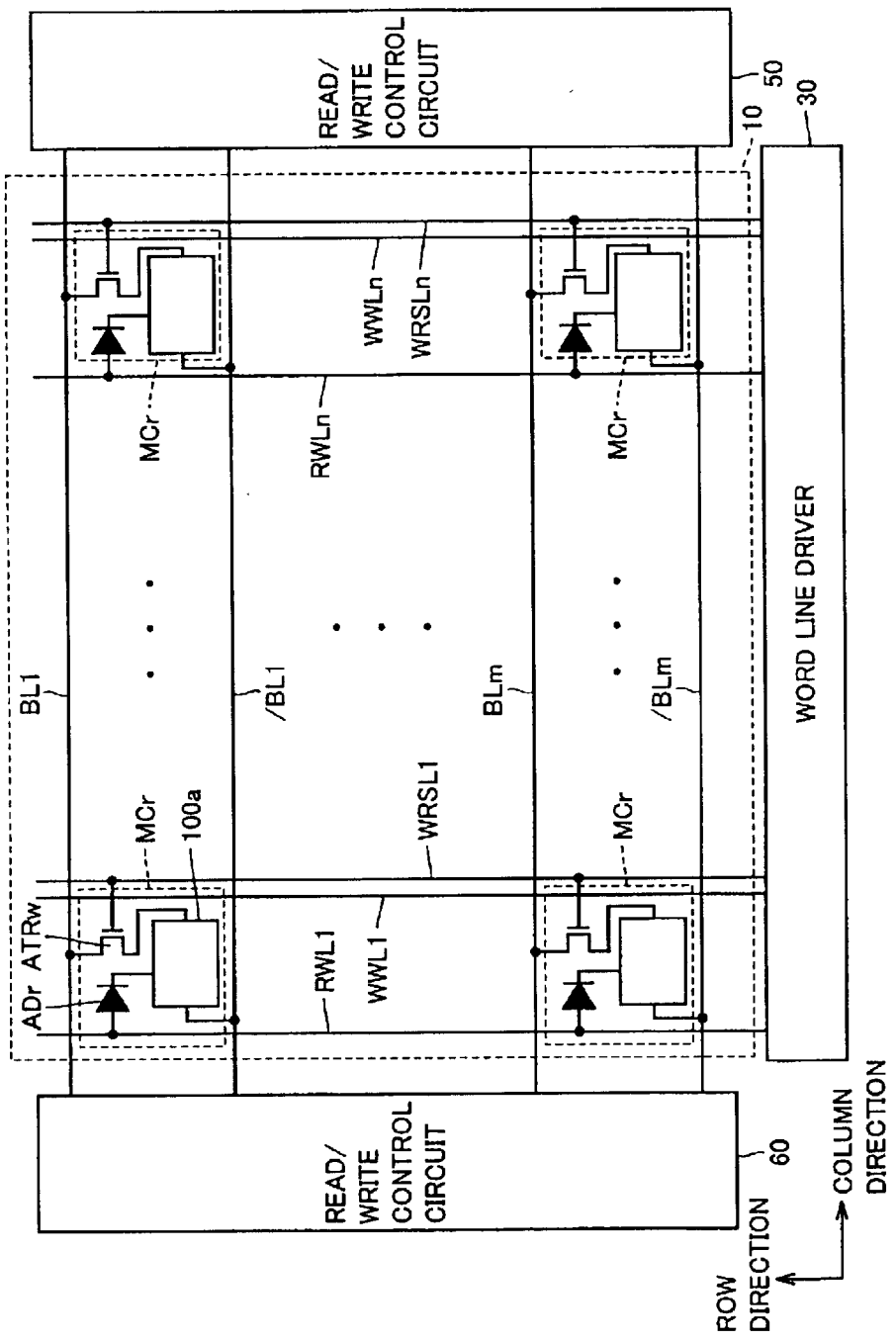
FIG. 38 is a block diagram showing the structure of a memory array according to a second modification of the fifth embodiment.

Referring to FIG. 38, in the second modification of the fifth embodiment, MTJ memory cells MCr are arranged in n rows by m columns in the entire memory array 10. Each MTJ memory cell MCr includes a tunneling magneto-resistance element 100a coupled to a corresponding bit line /BL, an access transistor ATRw electrically coupled between a corresponding bit line BL and tunneling magneto-resistance element 100a, and an access diode ADr as an access element coupled between a corresponding read word line RWL and tunneling magneto-resistance element 100a. The forward direction of access diode ADr is the direction from read word line RWL toward tunneling magneto-resistance element 100a.

Since read word lines RWL, write word lines WWL, write row selection lines WRSL and bit lines BL, /BL are arranged in the same manner as that of the fifth embodiment, detailed description thereof will not be repeated.

Figure 39:
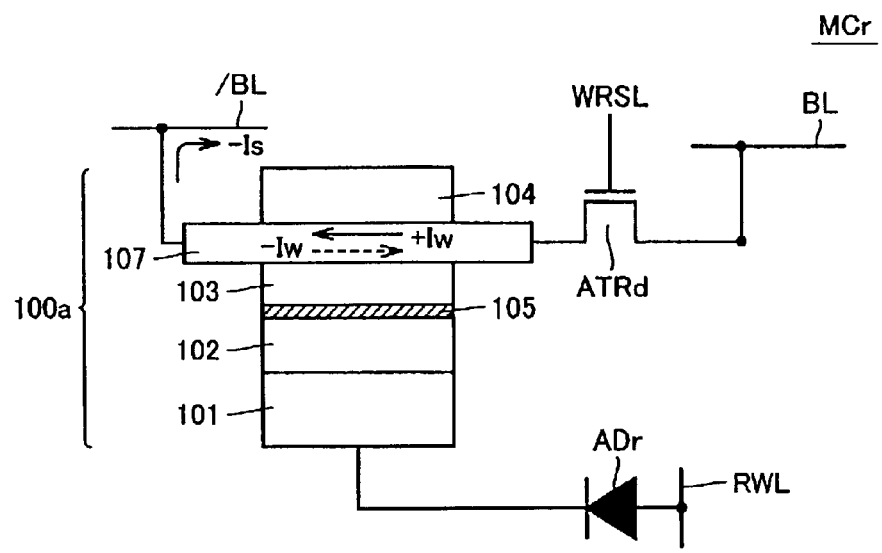
FIG. 39 is a conceptual diagram showing the structure of an MTJ memory cell according to the second modification of the fifth embodiment.

Referring to FIG. 39, MTJ memory cell MCr in the second modification of the fifth embodiment is different from MTJ memory cell MCp in the fifth embodiment shown in FIG. 34 in that access transistor ATRr is replaced with access diode ADr. Access diode ADr is electrically coupled between a corresponding read word line RWL and antiferromagnetic material layer 101, and the forward direction of access diode ADr is the direction from read word line RWL toward antiferromagnetic material layer 101. Since the structure of MTJ memory cell MCr is otherwise the same as that of MTJ memory cell MCp of the fifth embodiment, detailed description thereof will not be repeated.

Figure 40:
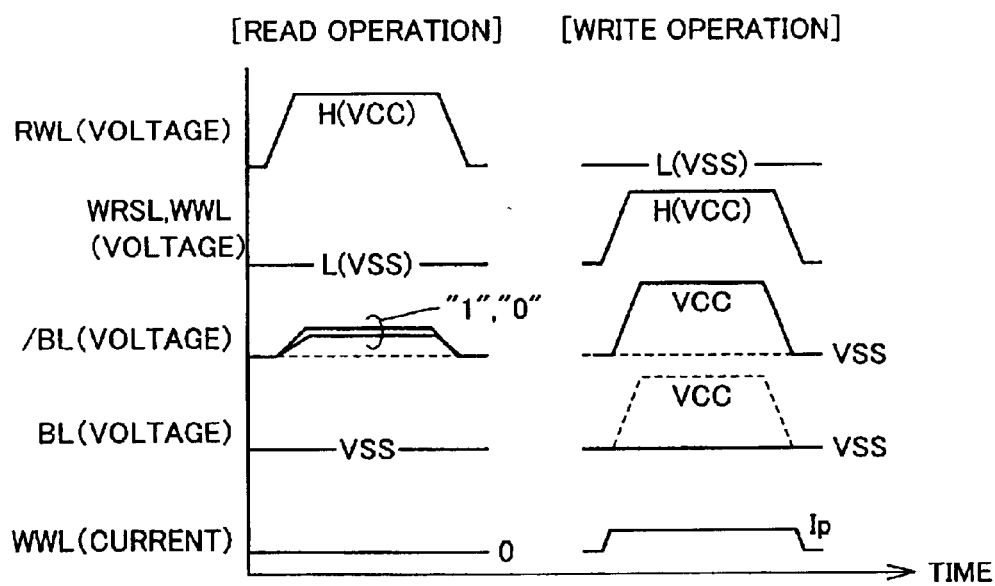
FIG. 40 is an operating waveform chart illustrating data read and write operations from and to the MTJ memory cell according to the second modification of the fifth embodiment.

Referring to FIG. 40, in data read operation, word line driver 30 activates a read word line RWL of the selected row from L level to H level (power supply voltage VCC). Read/write control circuits 50, 60 connect bit line /BL to ground voltage VSS in order to supply a sense current (data read current) −Is of the negative direction thereto. As a result, access diode ADr of the selected row is forward-biased and turned ON.

On the other hand, each write row selection line WRSL and each write word line WWL are retained at L level (ground voltage VSS). Therefore, each access transistor ATRw is turned OFF. Read/write control circuits 50,60 set bit line BL to ground voltage VSS.

Turned-ON access diode ADr allows the sense current to be supplied to tunneling magneto-resistance element 100a of the selected memory cell. As a result, data can be read from the selected MTJ memory cell by sensing the voltage on bit line BL.

Read word lines RWL of the non-selected rows are retained at L level (ground voltage VSS). Therefore, corresponding access diodes ADr will not be forward biased, and are retained in OFF state.

Since the operating waveforms in data write operation are the same as those shown in FIG. 35, detailed description thereof will not be repeated. In the second modification of the fifth embodiment, a data write current is supplied only to the intermediate layer of the selected memory cell in data write operation. Accordingly, as in the fifth embodiment and the first modification thereof, data can be prevented from being erroneously written to the non-selected memory cells. Moreover, using a diode as an access element instead of an access transistor enables reduction in size of the MTJ memory cell.

Third Modification of Fifth Embodiment

Figure 41:
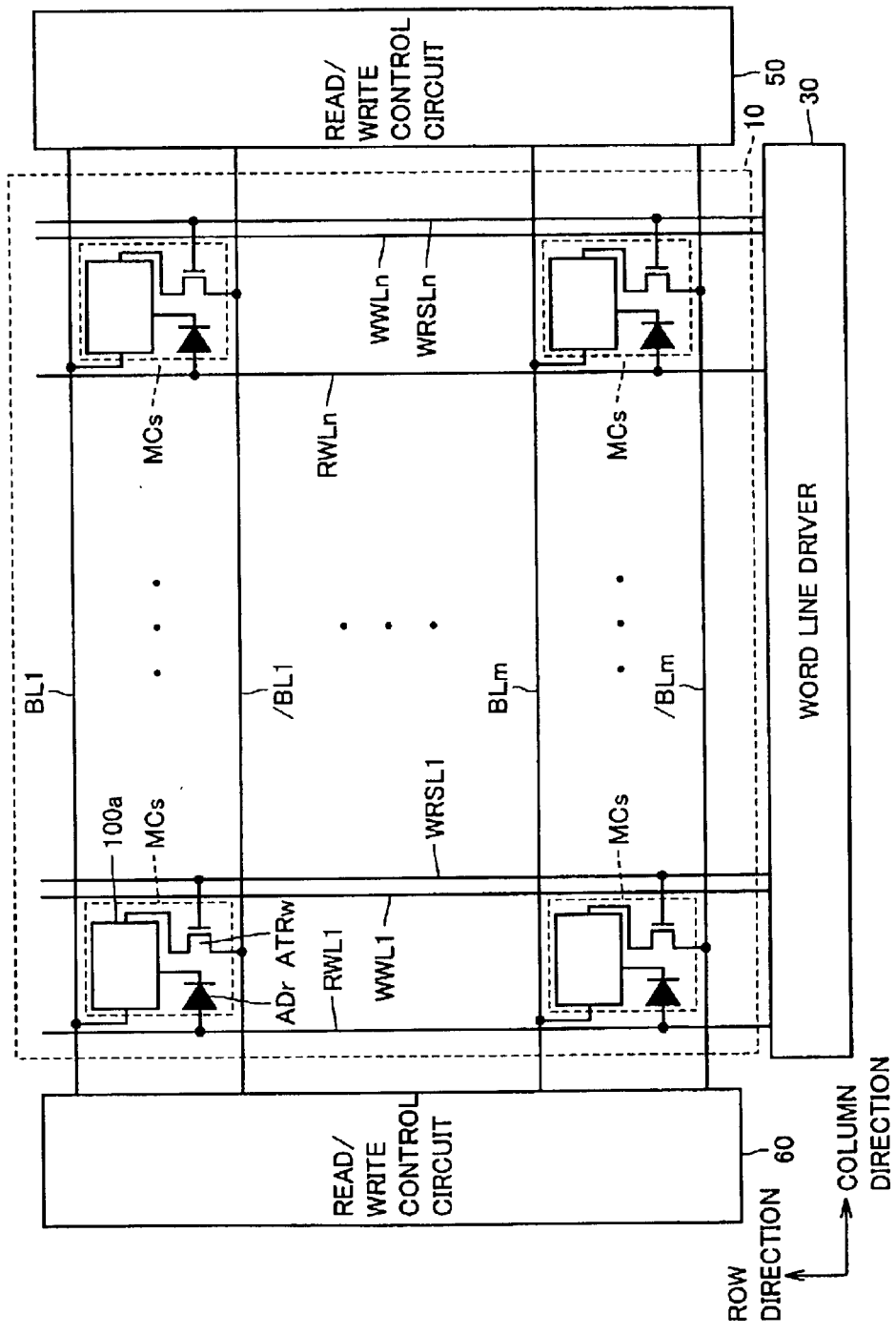
FIG. 41 is a block diagram showing the structure of a memory array according to a third modification of the fifth embodiment.

Referring to FIG. 41, in the third modification of the fifth embodiment, MTJ memory cells MCs are arranged in n rows by m columns in the entire memory array 10. Each MTJ memory cell MCs includes a tunneling magneto-resistance element 100a coupled to a corresponding bit line BL, an access transistor ATRw electrically coupled between a corresponding bit line /BL and tunneling magneto-resistance element 100a, and an access diode ADr as an access element coupled between a corresponding read word line RWL and tunneling magneto-resistance element 100a. The forward direction of access diode ADr is the direction from read word line RWL toward tunneling magneto-resistance element 100a. Since read word lines RWL, write word lines WWL, write row selection lines WRSL and bit lines BL, /BL are arranged in the same manner as that of the fifth embodiment, detailed description thereof will not be repeated.

Figure 42:
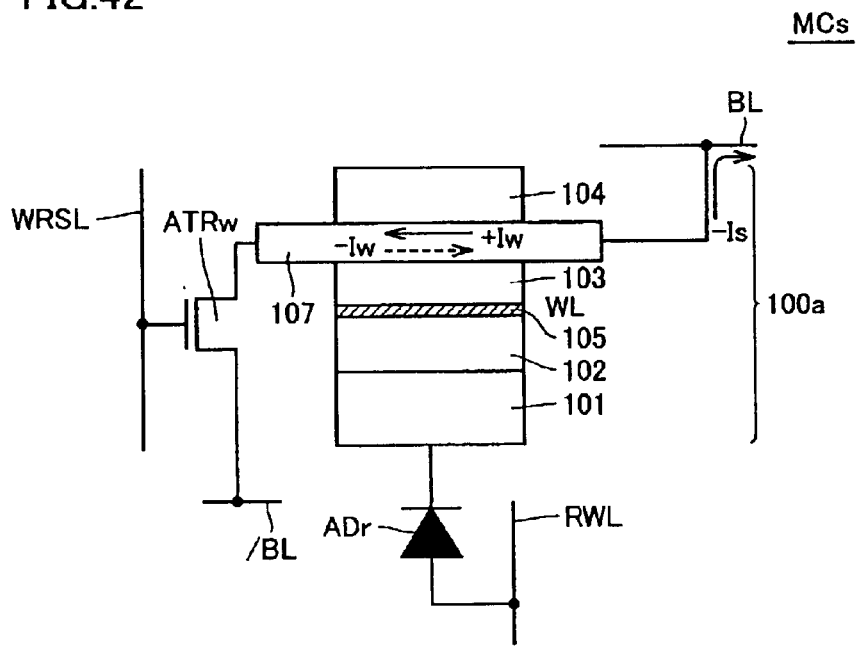
FIG. 42 is a conceptual diagram illustrating the structure of an MTJ memory cell according to the third modification of the fifth embodiment.

Referring to FIG. 42, MTJ memory cell MCs of the third modification of the fifth embodiment is different from MTJ memory cell MCr of the fifth embodiment shown in FIG. 39 in that access transistor ATRw is provided between intermediate layer 107 and bit line /BL. Intermediate layer 107 is electrically coupled to bit line BL. Since the structure of MTJ memory cell MCs is otherwise the same as that of MTJ memory cell MCr of the second modification of the fifth embodiment, detailed description thereof will not be repeated.

Figure 43:
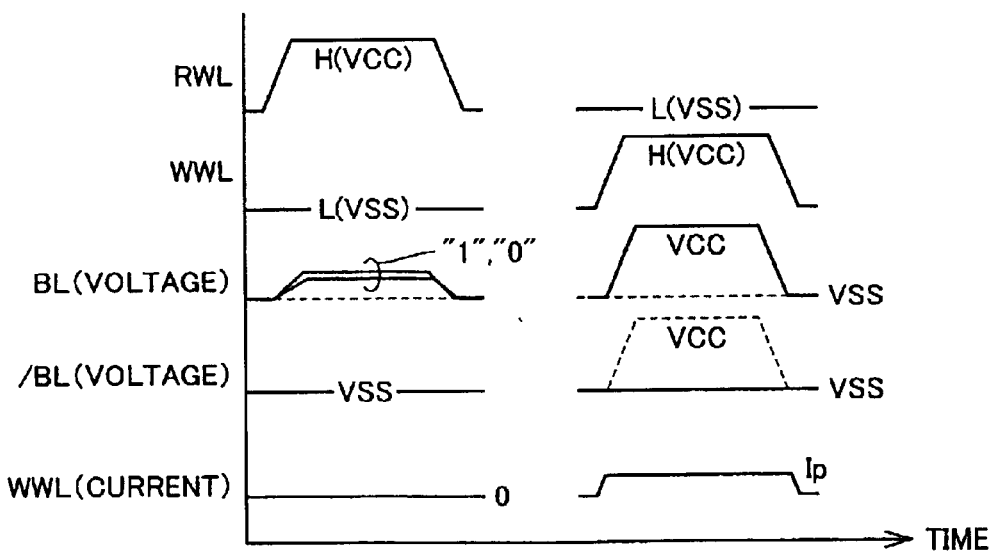
FIG. 43 is an operating waveform chart illustrating data read and write operations from and to the MTJ memory cell according to the third modification of the fifth embodiment.

Referring to FIG. 43, data write and read operations in the third modification of the fifth embodiment are different from those of the second modification of the fifth embodiment shown in FIG. 40 in that the voltages on bit lines BL, /BL are switched each other. Since the data write and read operations of the third modification of the fifth embodiment are otherwise the same as those of the second modification of the fifth embodiment, detailed description thereof will not be repeated.

In the third modification of the fifth embodiment as well, a diode is used as an access element as in the second modification of the fifth embodiment. This enables reduction in size of the MTJ memory cell.

Sixth Embodiment

In the structure described in the sixth embodiment, symmetric magnetization characteristics of the MTJ memory cell can be obtained independently of the write data level.

As can be seen from the following description, the structure of the sixth embodiment can be applied to any of tunneling magneto-resistance elements 100a, 100b and 100c described in the first to fifth embodiments. Accordingly, in the sixth embodiment, these tunneling magneto-resistance elements are generally referred to as tunneling magneto-resistance element 100. The free magnetic layers in each type of tunneling magneto-resistance element are generally referred to as free magnetic layer VL.

Figure 44:
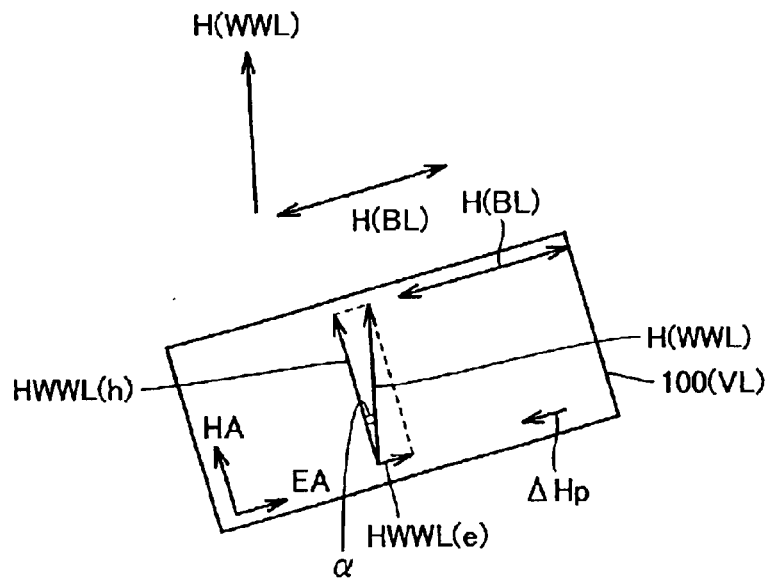
FIG. 44 is a conceptual diagram illustrating the direction of a data write magnetic field according to a sixth embodiment of the present invention.

Referring to FIG. 44, in data write operation, data write magnetic fields H(BL) and H(WWL) are applied to tunneling magneto-resistance element 100. Data write magnetic field H(BL) is generated by a data write current ±Iw flowing through bit line BL, and data write magnetic field H(WWL) is generated by a data write current Ip flowing through write word line WWL. Free magnetic layer VL in tunneling magneto-resistance element 100 is subjected to a coupling magnetic field ΔHp of the easy-axis (EA) direction that results from magnetostatic coupling with a magnetic field of the fixed magnetic layer.

Data write magnetic field H(BL) mainly includes a component along the easy-axis (EA) direction of free magnetic layer VL, and data write magnetic field H(WWL) mainly includes a component along the hard-axis (HA) direction of free magnetic layer VL. In other words, data write magnetic field H(BL) is applied to magnetize free magnetic layer VL in the easy-axis (EA) direction, and data write magnetic field H(WWL) is applied to magnetize free magnetic layer VL in the hard-axis (HA) direction.

In the sixth embodiment, data write magnetic field H(WWL) is not applied in the direction exactly in parallel with the hard axis HA of free magnetic layer VL, but at a prescribed angle α with the hard axis HA. Accordingly, data write magnetic field H(WWL) is decomposed into a component HWWL(e) of the easy-axis (EA) direction and a component HWWL(h) of the hard-axis (HA) direction.

These components are defined by the following expressions (1) and (2):

$$HWWL(e) = H(WWL) \cdot \sin \alpha \qquad (1); \text{ and}$$

$$HWWL(h) = H(WWL) \cdot \cos \alpha \qquad (2).$$

Prescribed angle α is set so as to satisfy the following expression (3):

$$H(WWL) \cdot \sin \alpha + \Delta Hp = 0 \qquad (3).$$

Uniform coupling magnetic field ΔHp is thus cancelled by the component of H(WWL) along the easy-axis (EA) direction. In other words, data write magnetic field H(WWL) includes a component of the direction that cancels coupling magnetic field ΔHp.

In the sixth embodiment, data write magnetic field H(BL) is applied along the easy axis (EA) in the direction according to the write data level. As a result, magnetization along the easy-axis (EA) direction is realized by data write magnetic field H(BL) alone.

With the above structure, symmetric magnetization characteristics can be obtained along the easy-axis (EA) direction independently of the write data level, that is, the direction of data write current ±Iw. This enables suppression of data write current ±Iw required for data write operation, and thus enables reduction in power consumption of the MRAM device and current density of bit line BL. As a result, operation reliability of the MRAM device is improved.

Note that, for magnetization along the hard-axis (HA) direction, prescribed angle α is required to satisfy the following expression (4):

$$H(WWL) \cdot \cos \alpha > HSWh \qquad (4)$$

Figure 50:
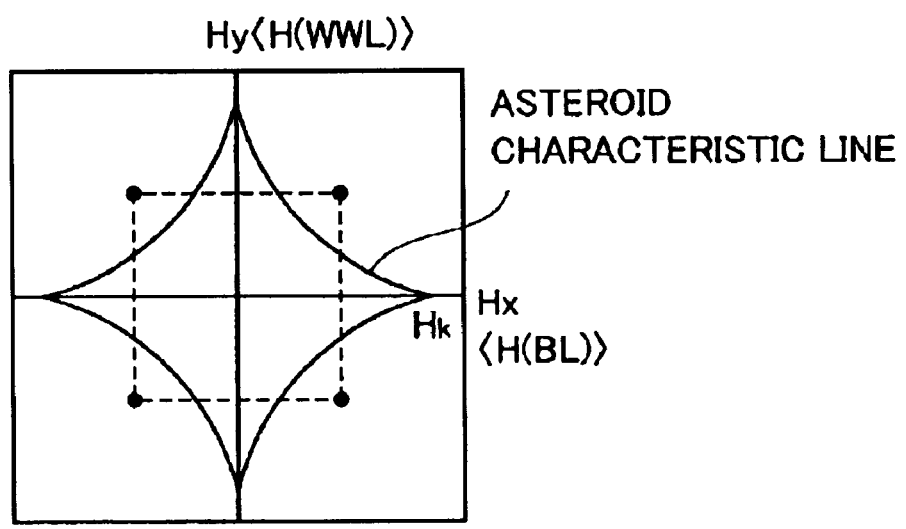
FIG. 50 is a conceptual diagram illustrating the relation between the direction of a data write current and the magnetization direction in data write operation to an MTJ memory cell.

Note that HSWh indicates a magnetization threshold value in the magnetization characteristics along the hard-axis (HA) direction, and corresponds to a value along the ordinate in the asteroid characteristic line shown in FIG. 50.

Figure 45:
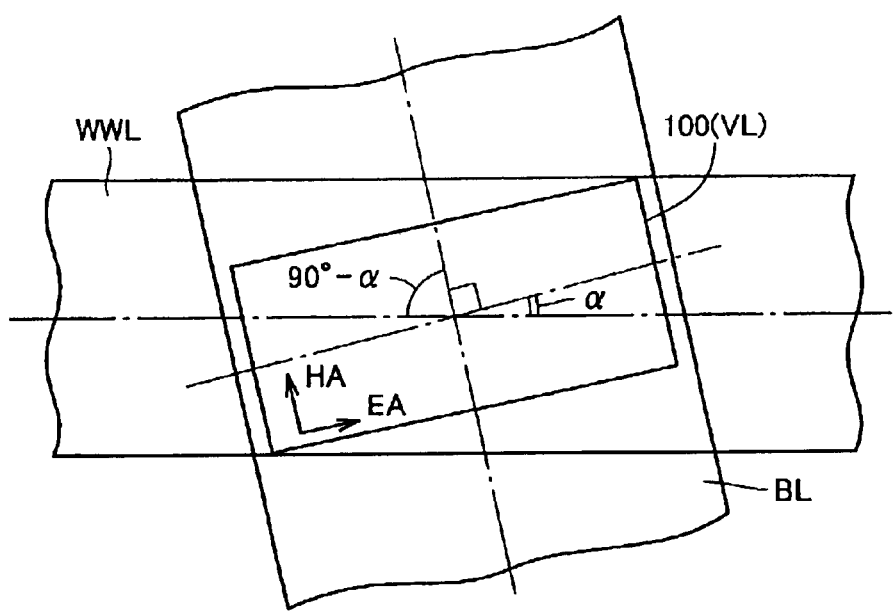
FIG. 45 is a conceptual diagram showing the arrangement of a tunneling magneto-resistance element according to the sixth embodiment.

Referring to FIG. 45, in order to realize the relation between the magnetic fields shown in FIG. 44, bit line BL extends in the direction perpendicular to the easy axis (EA) of free magnetic layer VL. When tunneling magneto-resistance element 100 (free magnetic layer VL) has a rectangular shape, the easy axis (EA) corresponds to the direction along the longer side of the rectangular.

On the other hand, write word line WWL extends at prescribed angle α with the easy axis (EA). In other words, write word line WWL and bit line BL do not extend perpendicularly to each other, but extend at an angle of (90−α) degrees.

The arrangement of FIG. 45 can be implemented by appropriately designing the respective formation patterns and polishing patterns (e.g., polishing patterns by CMP (Chemical Mechanical Polishing)) of at least free magnetic layer VL of tunneling magneto-resistance element 100 and metal wiring layers of write word line WWL and bit line BL. This arrangement enables the data write magnetic fields of the sixth embodiment shown in FIG. 44 to be applied to the MTJ memory cell.

Modification of Sixth Embodiment

In the structure described in the modification of the sixth embodiment, bit line BL and write word line WWL extend perpendicularly to each other and the same effects as those of the sixth embodiment can be obtained.

Figure 46:
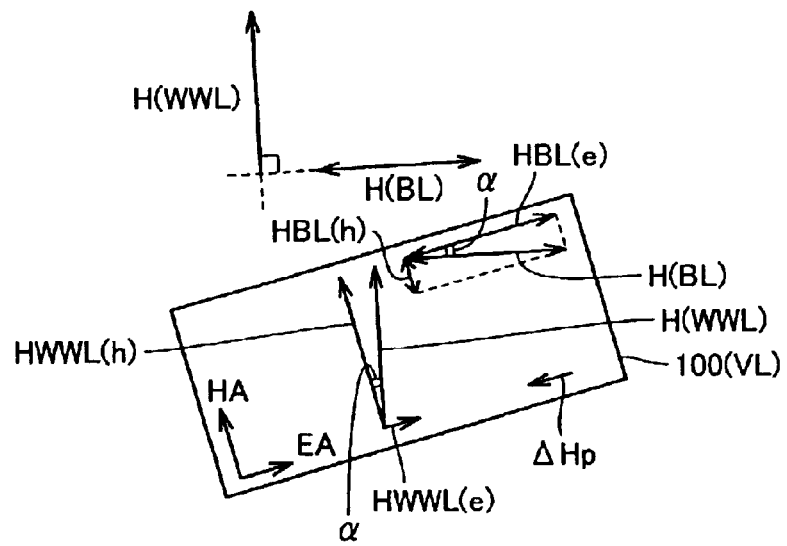
FIG. 46 is a conceptual diagram showing the direction of a data write magnetic field according to a modification of the sixth embodiment.

Referring to FIG. 46, in the modification of the sixth embodiment, tunneling magneto-resistance element 100 is arranged so that data write magnetic field H(BL) is applied at a prescribed angle α with the easy-axis (EA) direction of free magnetic layer VL. Data write magnetic fields H(WWL), H(BL) are applied in the directions perpendicular to each other. In other words, bit line BL and write word line WWL extend perpendicularly to each other. Accordingly, as in the sixth embodiment, data write magnetic field H(WWL) is applied at a prescribed angle α with the hard-axis (HA) direction of free magnetic layer VL. Data write magnetic field H(BL) is applied in one of the opposite (antiparallel) directions according to the write data level.

A magnetic field H(e) applied to tunneling magneto-resistance element 100 (free magnetic layer VL) in the easy-axis (EA) direction is therefore defined by the following expression (5):

$$H(e)=H(WWL) \cdot \sin \alpha \pm H(BL) \cdot \cos \alpha + \Delta Hp \qquad (5).$$

The same effects as those of the sixth embodiment can be obtained by setting prescribed angle α so as to satisfy the above expression (3) as in the sixth embodiment.

Similarly, a magnetic field H(h) applied to tunneling magneto-resistance element 100 (free magnetic layer VL) in the hard-axis (HA) direction is defined by the following expression (6):

$$H(h)=H(WWL) \cdot \cos \alpha \pm H(BL) \cdot \sin \alpha \qquad (6).$$

In order to rewrite the magnetization direction of free magnetic layer VL in the selected MTJ memory cell, the following expressions (7) and (8) must be satisfied:

$$|\pm H(BL) \cdot \cos \alpha| > HSWe \qquad (7); \text{ and}$$

$$|H(WWL) \cdot \cos \alpha \pm H(BL) \cdot \sin \alpha| > HSWh \qquad (8).$$

Note that HSWh and HSWe are threshold values for magnetization in the hard-axis (HA) and easy-axis (EA) directions, and correspond to values along the ordinate and abscissa of the asteroid characteristic line shown in FIG. 50, respectively.

Prescribed angle α and data write magnetic fields H(WWL), H(BL) need only be set so as to satisfy the above expressions. Note that, as can be seen from the above expression (8), in the structure of the modification of the sixth embodiment, H(WWL) must have a larger value than that in the normal structure (i.e., the structure where prescribed angle α is zero) in order to obtain symmetric magnetization characteristics along the easy-axis (EA) direction. In other words, a larger data write current Ip must be supplied to write word line WWL.

Accordingly, in the structure of the modification of the sixth embodiment, current consumption can be suppressed in the case where data write currents Ip and ±Iw required for data write operation satisfy the relation: Ip<|±Iw|. For example, this case corresponds to the structure of writing data in parallel to a plurality of memory cell columns along a single selected row in each data write operation.

Typically, data write operation according to the above structure is effective in the MRAM device that is applied to a system LSI (Large Scale Integrated circuit) integrated on the same semiconductor chip as that of a logic such as a processor and required to receive and output multi-bit data in parallel from and to other circuits in order to implement high-speed data processing with low power consumption.

Figure 47:
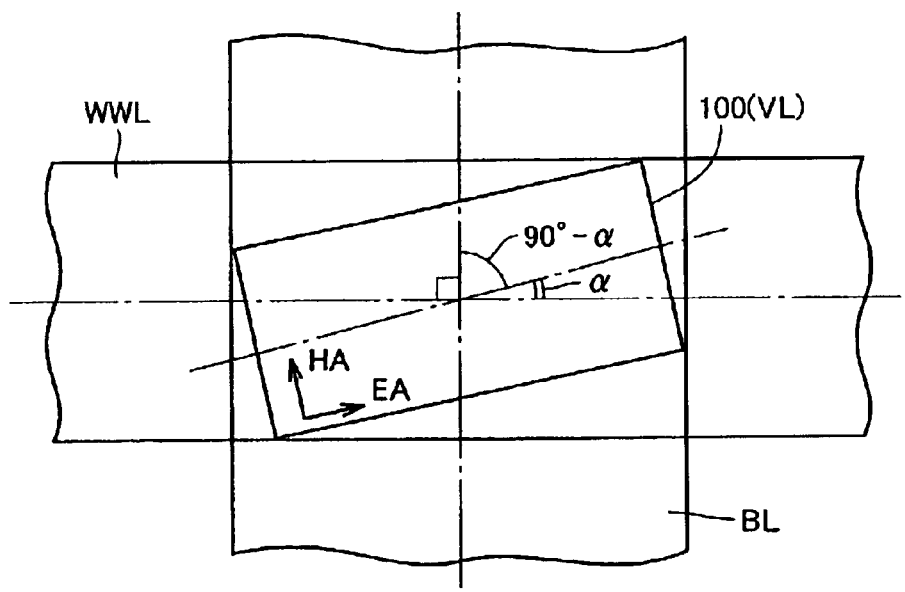
FIG. 47 is a conceptual diagram showing the arrangement of a tunneling magneto-resistance element according to the modification of the sixth embodiment.

Referring to FIG. 47, in order to realize the relation between the magnetic fields shown in FIG. 46, write word line WWL extends at prescribed angle α with the easy-axis (EA) direction of tunneling magneto-resistance element 100 (free magnetic layer VL). When tunneling magneto-resistance element 100 has an elongated shape such as a rectangular shape, write word line WWL extends at prescribed angle α with the direction along the longer side of tunneling magneto-resistance element 100. Moreover, bit line BL and write word line WWL extend perpendicularly to each other.

This arrangement can also be realized by appropriately designing the respective formation patterns and polishing patterns of the magnetic layers and metal wiring layers. This arrangement enables the data write magnetic fields of the modification of the sixth embodiment shown in FIG. 46 to be applied to the MTJ memory cell.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:
   a plurality of memory cells for storing data, wherein each memory cell includes a magnetic storage portion having an electric resistance value varying according to a magnetization direction that is rewritten in response to an applied magnetic field, and an access element for allowing a data read current to be selectively supplied to said magnetic storage portion corresponding to a memory cell selected for a data read operation, said thin film magnetic memory device further comprising:

a global data line and a local data line that are arranged in a hierarchical manner, for passing therethrough a data write current for magnetizing said magnetic storage portion in a direction according to write data in data write operation.

2. The thin film magnetic memory device according to claim 1, wherein magnetic fields respectively generated by said data write currents flowing through said global data line and said local data line in said data write operation interact with each other in a constructive manner in said magnetic storage portion.

3. The thin film magnetic memory device according to claim 1, wherein said plurality of memory cells are arranged in a matrix, said global data line is provided corresponding to one of every memory cell row and every memory cell column, and said local data line is provided for every prescribed segment of a memory cell group corresponding to a same global data line, said thin film magnetic memory device further comprising:

a data write circuit for setting one end of one of a pair of global data lines to a first voltage and one end of the other global data line to a second voltage according to a write data level in data write operation;

a first current switch portion provided for every pair of local data lines, for electrically coupling respective one ends of a corresponding pair of local data lines to each other in said data write operation; and a second current switch portion provided for every pair of local data lines, for connecting the other ends of said corresponding pair of local data lines to corresponding two global data lines, respectively.

4. The thin film magnetic memory device according to claim 1, further comprising:

a data read circuit for supplying said data read current to each of a pair of global data lines in said data read operation and producing read data based on voltage comparison between said pair of global data lines; and a reference voltage generating portion provided for every global data line, for generating a reference voltage in response to passage of said data read current, wherein a memory cell selected for said data read operation is electrically connected to a corresponding global data line through a corresponding local data line and receives said data read current, and in said data read operation, a global data line that forms a pair with a global data line corresponding to said selected memory cell is connected to said reference voltage generating portion.

5. The thin film magnetic memory device according to claim 1, wherein said plurality of memory cells are arranged in a matrix, said global data line is provided corresponding to one of every memory cell row and every memory cell column, and said local data line is provided for every prescribed segment of a memory cell group corresponding to a same global data line, said thin film magnetic memory device further comprising:

a data write circuit for setting one end of one of a pair of global data lines to a first voltage and one end of the other global data line to a second voltage according to a write data level in data write operation; and a current switch portion provided for every pair of local data lines, for connecting one of a corresponding pair of local data lines between corresponding two global data lines.

6. The thin film magnetic memory device according to claim 5, further comprising:

a data read circuit for supplying said data read current to each of a pair of global data lines in data read operation and producing read data based on voltage comparison between said pair of global data lines; and a reference voltage generating portion provided for every global data line, for generating a reference voltage in response to passage of said data read current, wherein said current switch portion connects one of a corresponding pair of local data lines that corresponds to a memory cell selected for data read operation to a corresponding global data line, and in said data read operation, a global data line that forms a pair with said corresponding global data line is connected to said reference voltage generating portion.

7. The thin film magnetic memory device according to claim 1, wherein said plurality of memory cells are arranged in a matrix, said global data line is provided for every plurality of memory cell columns, and said local data line is provided for every prescribed segment in each memory cell column.

8. The thin film magnetic memory device according to claim 1, further comprising:

a first current switch element for forming a current path between said global data line and one end of said local data line, and a second current switch element for forming a current path between said global data line and the other end of said local data line.

* * * * *